(12) United States Patent
Yamazaki et al.

(10) Patent No.: US 10,483,402 B2
(45) Date of Patent: Nov. 19, 2019

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Daisuke Matsubayashi, Atsugi (JP); Yutaka Okazaki, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 198 days.

(21) Appl. No.: 15/474,082

(22) Filed: Mar. 30, 2017

(65) Prior Publication Data

US 2017/0278975 A1    Sep. 28, 2017

Related U.S. Application Data

(60) Continuation of application No. 14/617,308, filed on Feb. 9, 2015, now Pat. No. 9,614,100, which is a
(Continued)

(30) Foreign Application Priority Data

Jan. 18, 2012  (JP) ................... 2012-008375
Jan. 20, 2012  (JP) ................... 2012-009727

(51) Int. Cl.
*H01L 29/786*    (2006.01)
*H01L 29/78*    (2006.01)

(52) U.S. Cl.
CPC .... *H01L 29/7869* (2013.01); *H01L 29/78609* (2013.01); *H01L 29/78696* (2013.01); *H01L 29/785* (2013.01)

(58) Field of Classification Search
CPC .................................. H01L 29/2869
See application file for complete search history.

(56) References Cited

U.S. PATENT DOCUMENTS 5,528,032 A   6/1996   Uchiyama
5,731,856 A   3/1998   Kim et al.
(Continued)

FOREIGN PATENT DOCUMENTS

EP   1737044 A   12/2006
EP   2120267 A   11/2009
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
(Continued)

*Primary Examiner* — Moazzam Hossain
(74) *Attorney, Agent, or Firm* — Robinson Intellectual Property Law Office; Eric J. Robinson

(57) ABSTRACT

The semiconductor device includes a transistor including an oxide semiconductor film having a channel formation region, a gate insulating film, and a gate electrode layer. In the transistor, the channel length is small (5 nm or more and less than 60 nm, preferably 10 nm or more and 40 nm or less), and the thickness of the gate insulating film is large (equivalent oxide thickness which is obtained by converting into a thickness of silicon oxide containing nitrogen is 5 nm or more and 50 nm or less, preferably 10 nm or more and 40 nm or less). Alternatively, the channel length is small (5 nm or more and less than 60 nm, preferably 10 nm or more and 40 nm or less), and the resistivity of the source region and the drain region is $1.9\times10^{-5}$ Ω·m or more and $4.8\times10^{-3}$ Ω·m or less.

16 Claims, 20 Drawing Sheets

Related U.S. Application Data division of application No. 13/738,443, filed on Jan. 10, 2013, now Pat. No. 8,969,867.

(56) References Cited

U.S. PATENT DOCUMENTS

| | | |
|---|---|---|
| 5,744,864 A | 4/1998 | Cillessen et al. |
| 6,232,642 B1 | 5/2001 | Yamazaki |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,119,402 B2 | 10/2006 | Kinoshita et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,589,381 B2 | 9/2009 | Kinoshita et al. |
| 7,674,650 B2 | 3/2010 | Akimoto et al. |
| 7,732,819 B2 | 6/2010 | Akimoto et al. |
| 7,855,379 B2 | 12/2010 | Hayashi et al. |
| 8,003,981 B2 | 8/2011 | Iwasaki et al. |
| 8,013,327 B2 | 9/2011 | Kawasaki et al. |
| 8,088,652 B2 | 1/2012 | Hayashi et al. |
| 8,158,975 B2 | 4/2012 | Akimoto |
| 8,164,090 B2 | 4/2012 | Iwasaki et al. |
| 8,242,497 B2 | 8/2012 | Tsang |
| 8,284,369 B2 | 10/2012 | Chida et al. |
| 8,343,817 B2 | 1/2013 | Miyairi et al. |
| 8,384,076 B2 | 2/2013 | Park et al. |
| 8,436,349 B2 | 5/2013 | Sano et al. |
| 8,476,719 B2 | 7/2013 | Endo et al. |
| 8,546,811 B2 | 10/2013 | Godo et al. |
| 8,729,547 B2 | 5/2014 | Miyairi et al. |
| 8,729,627 B2 | 5/2014 | Cheng et al. |
| 8,816,469 B2 | 8/2014 | Kamata |
| 8,853,684 B2 | 10/2014 | Endo et al. |
| 8,946,703 B2 | 2/2015 | Miyairi et al. |
| 8,981,518 B2 | 3/2015 | Kamata |
| 9,041,202 B2 | 5/2015 | Kimura |
| 9,166,058 B2 | 10/2015 | Miyairi et al. |
| 9,236,456 B2 | 1/2016 | Miyairi et al. |
| 9,299,723 B2 | 3/2016 | Saito |
| 9,391,209 B2 | 7/2016 | Godo et al. |
| 9,397,255 B2 | 7/2016 | Kimura |
| 9,437,748 B2 | 9/2016 | Miyairi et al. |
| 9,443,988 B2 | 9/2016 | Endo et al. |
| 9,548,395 B2 | 1/2017 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0181559 A1 | 8/2005 | Natori et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0124971 A1 | 6/2006 | Hiramatsu et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0210354 A1 | 9/2007 | Nabatame et al. |
| 2007/0252928 A1 | 11/2007 | Ito et al. |
| 2007/0272922 A1 | 11/2007 | Kim et al. |
| 2007/0284701 A1 | 12/2007 | Mardilovich et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0078444 A1 | 4/2008 | Atanackovic |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0197350 A1* | 8/2008 | Park ................ H01L 29/78609 257/43 |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0072276 A1 | 3/2009 | Inaba |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0159923 A1 | 6/2009 | Kamikawa et al. |
| 2009/0236595 A1 | 9/2009 | Atanackovic |
| 2009/0242990 A1 | 10/2009 | Saitoh et al. |
| 2009/0278122 A1 | 11/2009 | Hosono et al. |
| 2009/0280600 A1 | 11/2009 | Hosono et al. |
| 2010/0051937 A1 | 3/2010 | Kaji et al. |
| 2010/0065844 A1 | 3/2010 | Tokunaga |
| 2010/0090216 A1* | 4/2010 | Ferrao De Paiva Martins ............ H01L 21/8252 257/43 |
| 2010/0090217 A1* | 4/2010 | Akimoto ............ H01L 29/7869 257/43 |
| 2010/0092800 A1 | 4/2010 | Itagaki et al. |
| 2010/0109002 A1 | 5/2010 | Itagaki et al. |
| 2010/0155719 A1 | 6/2010 | Sakata et al. |
| 2010/0155860 A1* | 6/2010 | Colombo ............ H01L 21/28079 257/412 |
| 2010/0270619 A1 | 10/2010 | Lee |
| 2010/0295037 A1 | 11/2010 | Hironaka |
| 2011/0053361 A1 | 3/2011 | Muralidhar et al. |

(56) References Cited

U.S. PATENT DOCUMENTS

| | | |
|---|---|---|
| 2011/0121288 A1 | 5/2011 | Yamazaki et al. |
| 2011/0127522 A1 | 6/2011 | Yamazaki |
| 2011/0180867 A1* | 7/2011 | Tsang .................... H01L 49/00 257/329 |
| 2011/0182110 A1 | 7/2011 | Yamazaki et al. |
| 2011/0186932 A1 | 8/2011 | Mizumura et al. |
| 2011/0240998 A1* | 10/2011 | Morosawa ........ H01L 29/41733 257/57 |
| 2011/0256684 A1 | 10/2011 | Iwasaki et al. |
| 2011/0303953 A1 | 12/2011 | Kamata |
| 2012/0001266 A1 | 1/2012 | Lim et al. |
| 2012/0146109 A1 | 6/2012 | Yamazaki et al. |
| 2012/0181597 A1 | 7/2012 | Takemura |
| 2012/0187407 A1 | 7/2012 | Choi et al. |
| 2012/0217499 A1 | 8/2012 | Endo et al. |
| 2012/0228615 A1 | 9/2012 | Uochi |
| 2012/0241739 A1 | 9/2012 | Yamazaki et al. |
| 2012/0280229 A1 | 11/2012 | Suzuki et al. |
| 2012/0286270 A1 | 11/2012 | Isobe et al. |
| 2013/0087783 A1* | 4/2013 | Wang .................... H01L 21/316 257/43 |
| 2013/0157393 A1 | 6/2013 | Kimura |
| 2013/0187150 A1 | 7/2013 | Yamazaki et al. |
| 2015/0171739 A1 | 6/2015 | Kamata |
| 2016/0300862 A1 | 10/2016 | Kimura |
| 2016/0372608 A1 | 12/2016 | Miyairi et al. |

FOREIGN PATENT DOCUMENTS

| | | |
|---|---|---|
| EP | 2175493 A | 4/2010 |
| EP | 2226847 A | 9/2010 |
| EP | 2408011 A | 1/2012 |
| EP | 2571043 A | 3/2013 |
| EP | 2927965 A | 10/2015 |
| JP | 53-001633 B | 1/1978 |
| JP | 55-048457 B | 12/1980 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-134832 A | 5/1992 |
| JP | 05-251705 A | 9/1993 |
| JP | 06-275697 A | 9/1994 |
| JP | 08-264794 A | 10/1996 |
| JP | 09-022947 A | 1/1997 |
| JP | 11-017169 A | 1/1999 |
| JP | 11-505377 | 5/1999 |
| JP | 2000-044236 A | 2/2000 |
| JP | 2000-150900 A | 5/2000 |
| JP | 2001-274378 A | 10/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-100842 A | 4/2006 |
| JP | 2006-253440 A | 9/2006 |
| JP | 2007-250983 A | 9/2007 |
| JP | 2008-294136 A | 12/2008 |
| JP | 2009-278115 A | 11/2009 |
| JP | 2009-295670 A | 12/2009 |
| JP | 2009-302520 A | 12/2009 |
| JP | 2010-045394 A | 2/2010 |
| JP | 2010-062549 A | 3/2010 |
| JP | 2010-073683 A | 4/2010 |
| JP | 2010-093070 A | 4/2010 |
| JP | 2011-176296 A | 9/2011 |
| JP | 2011-181917 A | 9/2011 |
| JP | 2011-228622 A | 11/2011 |
| JP | 2012-009838 A | 1/2012 |
| JP | 2012-009839 A | 1/2012 |
| JP | 2012-009845 A | 1/2012 |
| WO | WO-2004/114391 | 12/2004 |
| WO | WO-2007/119386 | 10/2007 |
| WO | WO-2008/105347 | 9/2008 |
| WO | WO-2011/145484 | 4/2011 |
| WO | WO-2011/093150 | 8/2011 |
| WO | WO-2011/096275 | 8/2011 |
| WO | WO-2011/142089 | 11/2011 |
| WO | WO-2011/145468 | 11/2011 |
| WO | WO-2011/145632 | 11/2011 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262108-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO

(56) References Cited

OTHER PUBLICATIONS (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 399-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Backplane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

(56) References Cited

OTHER PUBLICATIONS

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Ando.T, "Ultimate Scaling of High-κ Gate Dielectrics: Higher-κ or Interfacial Layer Scavenging?", Materials, 2012, vol. 5, pp. 478-500.

Japanese Office Action (Application No. 2013-005705) dated Oct. 4, 2016.

* cited by examiner

SEMICONDUCTOR DEVICE

BACKGROUND OF THE INVENTION

1. Field of the Invention

The present invention relates to a semiconductor device and a method for manufacturing the semiconductor device.

In this specification, a semiconductor device means all devices which can function by utilizing semiconductor characteristics, and an electrooptic device, a semiconductor circuit, and an electronic device are all semiconductor devices.

2. Description of the Related Art

A metal oxide silicon field-effect transistor (MOSFET), which is formed over a silicon substrate, has been applied to a wide range of electronic devices such as an integrated circuit (IC) and an image display device (display device).

The operation speed and integration degree of a MOSFET are improved by miniaturization in accordance with the scaling law as follows: reduction in the size of a MOSFET to 1/k increases its speed k times and reduces its electric power to $1/k^2$. In this manner, reduction in the channel length and reduction in the thickness of a gate insulating film of a MOSFET have been achieved.

With the reduction in the channel length of a MOSFET, however, deterioration in electric characteristics becomes pronounced, that is, a problem of a short-channel effect occurs.

An example of the short-channel effects is deterioration in electric characteristics due to a punch-through phenomenon. The punch-through phenomenon is a phenomenon in which an electric field on the drain side adversely affects a diffusion potential on the source side and decreases it, and a current flows between the source and the drain even in the state where a channel is not formed. In other words, a depletion layer on the drain side extends to the source and produces, on the source, an effect of the electric field on the drain side.

Another example of the short-channel effects is deterioration in electric characteristics due to hot carriers. Hot carriers generated by application of high electric field to the vicinity of a drain region have energy large enough to pass an oxide film such as a gate insulating film, and part of the hot carriers causes deterioration, such as change (shift) in threshold voltage, increase in sub-threshold value (S value), or increase in leakage current in a transistor, by being captured in the gate insulating film or by forming an interface level.

In addition, injection of a carrier generated due to collisional ionization or avalanche breakdown into an oxide film as a hot carrier (such a carrier is called drain avalanche hot carrier: DAHC) and injection of a hot carrier generated due to the second collisional ionization (such a carrier is called secondarily generated hot electron: SGHE) also cause deterioration in electric characteristics of a transistor.

To suppress such a short-channel effect of a MOS transistor, reduction in thickness of a gate insulating film has been attempted. With a thin gate insulating film, the gate electrode layer can be close to a channel region, and thus influence of the gate electrode layer on the channel region is enhanced, which can suppress the above short-channel effect. Accordingly, reduction in the thickness of the gate insulating film, which improves the operation speed and integration degree of a MOSFET and suppresses a short-channel effect of the MOSFET, has been used as an effective technique for the MOSFET.

However, reduction in the thickness of the gate insulating film (3 nm or less, for example) causes a problem of a tunnel current passing through the gate insulating film. To solve this problem, study in which instead of silicon oxide, a high-k material (e.g., hafnium oxide), which has a higher permittivity than silicon oxide, is used as a material of the gate insulating film has been conducted (e.g., see Patent Documents 1 and 2). With the use of a high-k material, effective thickness for silicon oxide (equivalent oxide thickness (EOT) which is obtained by convertion into a film thickness of silicon oxide) of the gate insulating film can be reduced (to 3 nm or less, for example) while the physical thickness thereof can be large enough to prevent a tunnel current.

Furthermore, some measures for preventing a short-channel effect of a MOSFET including a silicon semiconductor have been needed; for example, a special impurity region (such a region is called a pinning region) is formed in a channel formation region (e.g., see Patent Document 3).

Furthermore, as a means for preventing deterioration of a MOS transistor due to hot carriers, a structure having a region where an impurity element is added at a low concentration (hereinafter also referred to as LDD (lightly doped drain) region) between a channel formation region and a source or drain region has been known (for example, see Patent Document 4). Since an electric field in the vicinity of the drain region is increased as the distribution of an impurity concentration at a junction between the drain region and a channel region is steeper, the formation of such an LDD region between the drain region and the channel region can reduce electric-field concentration and relieve a hot carrier effect. On the other hand, the formation of the LDD region increases the diffusive resistance in a drain part, which leads to decrease in switching speed of a transistor; or the formation of the LDD region increases series resistance in the drain part, which leads to decrease in on-state current of the transistor. Furthermore, a transistor increases in its size by an area of the LDD region, which runs counter to a demand for miniaturization of a transistor.

REFERENCE

[Patent Document 1] Japanese Published Patent Application No. 2001-274378
[Patent Document 2] Japanese Published Patent Application No. 2006-253440
[Patent Document 3] Japanese Published Patent Application No. H11-017169
[Patent Document 4] Japanese Published Patent Application No. H09-022947

SUMMARY OF THE INVENTION

In view of the above, an object of one embodiment of the present invention is to provide a semiconductor device including a transistor with a shortened channel length in which a short-channel effect is not or is hardly generated.

Another object of one embodiment of the present invention is to provide a minute transistor in which a short-channel effect is not or is hardly generated even when the transistor is not provided with an LDD region.

Another object of one embodiment of the present invention is to provide a high-performance semiconductor device including a minute transistor which achieves high-speed operation, high integration, and low power consumption.

Another object of one embodiment of the present invention is to provide a semiconductor device including a minute transistor which achieves high reliability and low cost.

One embodiment of the present invention is a semiconductor device including a transistor including an oxide semiconductor film having a channel formation region, a gate insulating film, and a gate electrode layer. In the transistor, the channel length is short (greater than or equal to 5 nm and less than 60 nm, preferably greater than or equal to 10 nm and less than or equal to 40 nm), and the thickness of the gate insulating film is large (equivalent oxide thickness which is obtained by converting into a thickness of silicon oxide containing nitrogen is greater than or equal to 5 nm and less than or equal to 50 nm, preferably greater than or equal to 10 nm and less than or equal to 40 nm). In the transistor of the semiconductor device, a short-channel effect is not or is hardly generated. Furthermore, the transistor has favorable electric characteristics as a switching element.

As described above, in an FET (MOSFET, Si-FET) including bulk silicon, a short-channel effect is generated because of miniaturization of a MOSFET in accordance with the scaling law. Although reduction in the thickness of the gate insulating film is effective in suppressing a short-channel effect, a tunnel current passing through the gate insulating film is generated. As to a MOSFET, when the thickness of a gate insulating film, such as an insulating film containing silicon oxide (e.g., a silicon oxide film or a silicon oxide film containing nitrogen), is not reduced, a depletion layer is less likely to extend and thus high-speed operation is difficult; on the other hand, when the thickness of the gate insulating film is reduced, a tunnel current is generated. Accordingly, to achieve high-speed operation and ensure the reliability, a high-k material (whose relative permittivity is about 20 to 30, for example) having a higher permittivity than the insulating film containing silicon oxide (whose relative permittivity is 3.8 to 4.1, for example) is used for the gate insulating film without reduction in the film thickness.

An oxide semiconductor used in one embodiment of the present invention is a semiconductor whose physical properties are unique and completely different from those of a silicon semiconductor. The oxide semiconductor has a small number of minority carriers, so that a depletion layer is likely to extend over an extremely large area. Therefore, the use of the high-k material having a high permittivity for the gate insulating film is not needed, and an insulating film having an equivalent oxide thickness which is obtained by converting into a thickness of silicon oxide containing nitrogen of greater than or equal to 5 nm and less than or equal to 50 nm, preferably greater than or equal to 10 nm and less than or equal to 40 nm can be used. Even with the use of an insulating film with the equivalent oxide thickness, a depletion layer of an oxide semiconductor extends over an extremely large area, which makes high-speed operation possible, and a tunnel current is not generated and thus leakage current is also not generated, which leads to high reliability. Furthermore, defects in shape, such as poor coverage, due to reduction in the thickness of the gate insulating film can be also suppressed, thereby suppressing variations in yield and characteristics.

Another embodiment of the present invention is a transistor with a single drain structure in which an oxide semiconductor is used for a channel formation region and an LDD region is not provided.

With the use of an oxide semiconductor for a channel formation region of a transistor, a short-channel effect is not generated or is not generated substantially even in the case where the channel length of the transistor is shortened. That is, the transistor including an oxide semiconductor does not need a structure (typified by an LDD region) which has been applied to a conventional transistor including silicon for suppressing a short-channel effect.

A short-channel effect, which may be generated in a transistor including silicon (hereinafter also referred to as Si-FET), is less likely to be generated in a transistor including an oxide semiconductor (hereinafter also referred to as OS-FET), which will be described below.

As an example of short-channel effects generated in a Si-FET, there is a punch-through phenomenon caused by drain-induced barrier lowering (DIBL). By focusing on the curve widths of the band near junctions between an oxide semiconductor and source and drain electrodes, the reason why DIBL generated in a Si-FET is less likely to be generated in an OS-FET will be explained below.

FIGS. 12A and 12B each schematically illustrate a band structure between a source and a drain in an n-type Si-FET. FIG. 12A illustrates a band structure with a long channel, and FIG. 12B illustrates a band structure with a short channel. The case where the gate voltage $V_g$ is 0 (i.e., the transistor is off) will be described below as an example.

As shown by solid lines in FIGS. 12A and 12B, even when the drain voltage $V_d$ is 0, the bands are curved in the vicinity of the p-n junction interface. This is because carriers transfer such that the Fermi levels of an $n^+$ region and a p region are equal to each other, so that a space-charge region (a depletion layer) of donor ions and acceptor ions is formed and an electric field is generated.

Here, by application of drain voltage $V_d$, the band in the $n^+$ region on the drain side decreases by $eV_d$ and the area of the depletion layer increases, as shown by dotted lines in FIGS. 12A and 12B. At this time, as in FIG. 12A, the band on the source side is not influenced in the case where the channel length is sufficiently long. On the other hand, in the case of a short channel shown in FIG. 12B, the depletion layer on the drain side easily extends toward the source side, which leads to decrease in the potential of the p region (DIBL). As a result, a current is likely to flow and the threshold voltage is shifted in the negative direction.

As described above, a cause of a short-channel effect in the Si-FET illustrated in FIGS. 12A and 12B is increase in the width of the depletion layer on the drain side, i.e., the increase in the width of the curve of the band, due to the drain voltage $V_d$. The curve widths of the band near junctions between source and drain electrodes and a channel formation region in a Si-FET and an OS-FET are analytically derived, and the easiness (difficulty) of occurrence of a short-channel effect in each transistor will be described below.

FIG. 13 shows a band structure on a source side of an n-type Si-FET. With reference to FIG. 13, first, the curve width $L_S^{Si}$ of a band on the source side in a p region of the n-type Si-FET is obtained. Note that $L_S^{Si}$ represents the curve width of a band on the source side in a p region, and is equal to the width of a space-charge region (a depletion layer) having acceptor ions. Note that y represents a distance from the p-n junction interface, and the origin of a potential is the intrinsic level $E_{ipL}^{Si}$ in the p region. Furthermore, $\phi(y)$ represents the potential of a region at a distance of y from a p-n junction interface, and the origin of $\phi(y)$ is the intrinsic level $E_{ipL}^{Si}$ in the p region. Furthermore, $e\phi_F^{Si}$ represents a difference between $E_{ipL}^{Si}$ and a Fermi level $E_F^{Si}$, and is defined as follows: $e\phi_F^{Si} = E_{ipL}^{Si} - E_F^{Si}$. Here, e represents elementary charge. The curve width of the band reflects a spatial variance of potential $\phi(y)$, and Poisson equation in Formula (1) needs to be solved.

$$\frac{d^2\phi}{dy^2} = -\frac{\rho}{\varepsilon^{Si}} \tag{1}$$

Note that $\varepsilon^{Si}$ represents a permittivity, and p represents a charge density. The depletion layer in the p region may be determined in consideration of the accepter ions having negative charge, and Formula (2) is obtained.

$$\rho = -eN_A^{Si} \tag{2}$$

Here, $N_A^{Si}$ represents acceptor density. By substituting Formula (2) into Formula (1) and solving it under a boundary condition shown by Formula (3), Formula (4) is obtained.

$$\phi(L_S^{Si}) = \frac{d\phi}{dy}(L_S^{Si}) = 0 \tag{3}$$

$$\phi(y) = \frac{eN_A^{Si}}{2\varepsilon^{Si}} L_S^{Si^2}\left(1 - \frac{y}{L_S^{Si}}\right)^2 \tag{4}$$

Therefore, under a boundary condition shown by Formula (5), the curve width $L_S^{Si}$ of a band on the source side is obtained as shown in Formula (6).

$$e\phi(0) = \frac{e^2 N_A^{Si}}{2\varepsilon^{Si}} L_S^{Si^2} = E_{ipL}^{Si} - E_F^{Si} \equiv e\phi_F^{Si} \tag{5}$$

$$L_S^{Si} = \sqrt{\frac{2\varepsilon^{Si}\phi_F^{Si}}{eN_A^{Si}}} \tag{6}$$

On the other hand, the curve width $L_D^{Si}$ of the band on a drain side at the time of application of drain voltage $V_d$ is obtained by similar caluculation as shown in Formula (7).

$$L_D^{Si} = \sqrt{\frac{2\varepsilon^{Si}(\phi_F^{Si} + V_d)}{eN_A^{Si}}} \tag{7}$$

Formula (7) shows that in a Si-FET, the $L_D^{Si}$ increases as $V_d$ increases; that is, the $L_D^{Si}$ of the depletion layer on the drain side increases due to the drain voltage $V_d$.

Next, FIG. 14 shows a band structure between a source and a drain in an OS-FET. With reference to FIG. 14, the curve width $L_S^{OS}$ of a band on a source side and the curve width $L_D^{OS}$ of the band on a drain side in an oxide semiconductor region in the OS-FET are obtained. Here, on the assumption that the work function $\phi_m$ of a metal used for the source electrode and the drain electrode is equal to the electron affinity $\chi^{OS}$ of the oxide semiconductor ($\phi_m = \chi^{OS}$), the case where the source and drain electrodes and the oxide semiconductor form an ohmic contact is considered. Furthermore, $\phi(y)$ represents the potential of a region at a distance of y from a junction interface between the oxide semiconductor and the source electrode or the drain electrode. The origin of $\phi(y)$ is the intrinsic level $E_{iL}^{OS}$ in the oxide semiconductor region. Furthermore, $e\phi_F^{OS}$ represents a difference between $E_{iL}^{OS}$ and a Fermi level $E_F^{OS}$ on the source side, and is defined as follows: $e\phi_F^{OS} = E_{iL}^{OS} - E_F^{OS}$. In this case, the curve of the band in the oxide semiconductor region is thought to be derived from the electron density $n^{OS}(y)$ (electrons correspond to majority carriers), so that the charge density $\rho$ is represented by Formula (8).

$$\rho(y) = -en^{OS}(y) = -en_0^{OS}\text{Exp}\left[\frac{e\phi(y)}{kT}\right] \tag{8}$$

Here, k represents a Boltzmann constant, and T represents an absolute temperature, and the origin of $\phi(y)$ is the intrinsic level $E_{iL}^{OS}$ in the oxide semiconductor region. Note that $n_0^{OS}$ represents the electron density in a bulk region of the oxide semiconductor, and is represented by Formula (9) using an intrinsic carrier density $n_i^{OS}$.

$$n_0^{OS} = n_i^{OS}\text{Exp}\left[-\frac{e\phi_F^{OS}}{kT}\right] \tag{9}$$

The potential $\phi(y)$ is obtained using the Poisson equation in Formula (10).

$$\frac{d^2\phi}{dy^2} = \frac{en_0^{OS}}{\varepsilon^{OS}}\text{Exp}\left[\frac{e\phi}{kT}\right] \tag{10}$$

By solving this under a boundary condition shown by Formula (11), Formula (12) is obtained.

$$\phi(L_S) = \frac{d\phi}{dy}(L_S) = 0 \tag{11}$$

$$\phi(y) = -\frac{2kT}{e}\ln\text{Cos}\left[\sqrt{\frac{e^2 n_0^{OS}}{2\varepsilon^{OS}kT}}(y - L_S^{OS})\right] \tag{12}$$

Accordingly, under a boundary condition shown by Formula (13), Formula (14) is obtained.

$$e\phi(0) = -2kT\ln\text{Cos}\left[\sqrt{\frac{e^2 n_0^{OS}}{2\varepsilon^{OS}kT}} L_S^{OS}\right] = \frac{E_g^{OS}}{2} + e\phi_F^{OS} \tag{13}$$

$$L_S^{OS} = \sqrt{\frac{2\varepsilon^{OS}kT}{e^2 n_0^{OS}}} \text{ArcCos}\left\{\text{Exp}\left[-\frac{E_g^{OS}/2 + e\phi_F^{OS}}{2kT}\right]\right\} \tag{14}$$

Since $E_g^{OS}/2 + e\phi_F^{OS} \gg 2kT$ is satisfied, Formula (14) can approximate to Formula (15).

$$L_S^{OS} \sim \sqrt{\frac{2\varepsilon^{OS}kT}{e^2 n_0^{OS}}} \text{ArcCos}(0) = \sqrt{\frac{2\varepsilon^{OS}kT}{e^2 n_0^{OS}}} \frac{\pi}{2} = \pi\sqrt{\frac{\varepsilon^{OS}kT}{2e^2 n_0^{OS}}} \tag{15}$$

On the other hand, the curve width $L_D^{OS}$ of the band on the drain side at the time of application of drain voltage $V_d$ is obtained by substituting $e\phi_F^{OF} + eV_{SD}$ for $e\phi_F^{OS}$ in Formula (13). As described above, $E_g^{OS}/2 + e\phi_F^{OS} + eV_d \gg 2kT$ is satisfied, so that $L_D^{OS}$ can approximate to Formula (16).

$$L_D^{OS} \sim \pi \sqrt{\frac{\varepsilon^{OS} kT}{2e^2 n_0^{OS}}} \sim L_S^{OS} \qquad (16)$$

Surprisingly, in the transistor including an oxide semiconductor, $L_D^{OS}$ does not depend on $V_d$ as described above. Therefore, DIBL does not occur or hardly occurs in the transistor including an oxide semiconductor, and it can be said that a short-channel effect caused by DIBL does not occur.

The depletion layer extends toward a lower concentration region. In the transistor including silicon, a low concentration n-type region (LDD region) is provided to suppress the extension of the depletion layer in a channel; thus, decrease in the potential of the p region (DIBL) can be suppressed. However, since DIBL does not occur in the transistor including an oxide semiconductor as described above, a short-channel effect can be suppressed without an LDD region.

The energy gap (Eg) of the oxide semiconductor is 2.8 eV to 3.2 eV, which is wider than the energy gap (Eg) of silicon of 1.1 eV. This also contributes to non-occurrence or extremely low occurrence of a short-channel effect in the transistor including an oxide semiconductor. The collisional ionization occurs when the kinetic energy of a carrier (electron or hole) is greater than or equal to the band gap of a semiconductor; accordingly, the wider the band gap is, the lower the possibility of occurrence of collisional ionization becomes. Similarly, an avalanche breakdown phenomenon, in which a pair of an electron and a hole generated by collisional ionization is accelerated by an electric field and collisional ionization repeatedly occurs, so that current is exponentially increased, is less likely to occur in the transistor including an oxide semiconductor than in a transistor including silicon. Therefore, the transistor including an oxide semiconductor has higher resistance to hot carrier degradation than the transistor including silicon.

Furthermore, the transistor including an oxide semiconductor of one embodiment of the present invention has an extremely low density of minority carriers which is about $1 \times 10^{-9}$ cm$^{-3}$ while the transistor including silicon has a high density of minority carriers which is about $1 \times 10^{11}$ cm$^{-3}$. Therefore, in the transistor including an oxide semiconductor, majority carriers (electrons) come from only a source of the transistor, so that a punch-through phenomenon and an avalanche breakdown phenomenon do not occur.

By the manufacturing method of one embodiment of the present invention, a hydrogen atom and an impurity containing a hydrogen atom, such as water, are thoroughly eliminated from an oxide semiconductor, and the oxide semiconductor and/or an insulator in contact with the oxide semiconductor are/is made to contain oxygen in excess of the stoichiometric composition to compensate oxygen vacancy in the oxide semiconductor, whereby the sources of generating carriers in the oxide semiconductor can be extremely reduced. In the transistor including the oxide semiconductor film having an extremely low density of minority carriers, less oxygen vacancy, and less sources of generating carriers such as hydrogen, leakage current can be extremely small in an off state. For example, in the transistor of one embodiment of the present invention, the leakage current in an off state is about 1 zA/μm at 85° C. to 95° C. (substrate temperature), and is about 1 yA/μm at room temperature (substrate temperature), which are extremely low; thus, the transistor has high reliability. Furthermore, the subthreshold value (S value) of the transistor of one embodiment of the present invention is small and is close to an ideal value. Moreover, the transistors can be stacked to have a higher density.

The scale of a depletion layer of the transistor including an oxide semiconductor is meter (m) level, which is extremely large, while the scale of a depletion layer of the transistor including silicon is nanometer (nm) level, which is small.

As described above, the transistor including an oxide semiconductor of one embodiment of the present invention has characteristics completely different from those of a transistor including bulk silicon.

One embodiment of the present invention is a semiconductor device including a transistor including an oxide semiconductor film (typifird by an oxide semiconductor film containing indium, e.g., an oxide semiconductor film containing indium, gallium, and zinc) having a channel formation region; a gate insulating film; and a gate electrode layer. In the semiconductor device, the channel length of the transistor is greater than or equal to 5 nm and less than 60 nm (preferably greater than or equal to 10 nm and less than or equal to 40 nm), and the equivalent oxide thickness which is obtained by converting into a thickness of silicon oxide containing nitrogen of the gate insulating film is greater than or equal to 5 nm and less than or equal to 50 nm (preferably greater than or equal to 10 nm and less than or equal to 40 nm).

Another embodiment of the present invention is a semiconductor device with the above-described structure, in which a barrier layer (typified by an aluminum oxide film) with a thickness greater than or equal to 3 nm and less than or equal to 30 nm is provided over the gate insulating film.

In the transistor including an oxide semiconductor film according to one embodiment of the present invention, leakage current is less than 1 zA/μm (preferably less than 1 yA/μm).

In the transistor including an oxide semiconductor film according to one embodiment of the present invention, a short-channel effect does not occur or substantially does not occur.

Another embodiment of the present invention is a semiconductor device with the above-described structure, in which an oxygen-excess insulator is provided under the oxide semiconductor film. The semiconductor device can have a structure in which a silicon nitride film or an aluminum oxide film is provided under the oxygen-excess insulator, and a metal oxide silicon field-effect transistor including a silicon semiconductor as a main component of a semiconductor is provided under the silicon nitride film or the aluminum oxide film.

Another embodiment of the present invention is a semiconductor device including an oxide semiconductor film including a source region, a drain region, and a channel formation region between the source region and the drain region; a source electrode layer and a drain electrode layer electrically connected to the oxide semiconductor film; a gate electrode layer overlapping with the channel formation region; and a gate insulating film provided between the oxide semiconductor film and the gate electrode layer. In the semiconductor device, the resistivity of the source region and the drain region is greater than or equal to $1.9 \times 10^{-5}$ Ω·m and less than or equal to $4.8 \times 10^{-3}$ Ω·m, and the channel length is greater than or equal to 5 nm and less than 60 nm.

Another embodiment of the present invention is a semiconductor device including an oxide semiconductor film including a source region, a drain region, a channel formation region between the source region and the drain region; a source electrode layer and a drain electrode layer electrically connected to the oxide semiconductor film; a gate electrode layer overlapping with the channel formation region; and a gate insulating film provided between the oxide semiconductor film and the gate electrode layer. In the semiconductor device, the source region and the drain region include a dopant at a concentration greater than or equal to $1.3\times10^{19}$ cm$^{-3}$ and less than or equal to $1.6\times10^{20}$ cm$^{-3}$, and the channel length is greater than or equal to 5 nm and less than 60 nm.

In the above-described semiconductor device, the source electrode layer is in contact with the source region of the oxide semiconductor film; the drain electrode layer is in contact with the drain region of the oxide semiconductor film; the resistivity of part of the source region in contact with the source electrode layer is the same as resistivity of part of the source region in contact with the channel formation region; and the resistivity of part of the the drain region in contact with the drain electrode layer is the same as resistivity of part of the drain region in contact with the channel formation region.

In the above-described semiconductor device, a sidewall insulating layer overlapping with the source region or the drain region is preferably provided on a sidewall of the gate electrode layer.

In the above-described semiconductor device, the gate insulating film preferably includes a first insulating layer in contact with the oxide semiconductor film and a second insulating layer provided between the first insulating layer and the gate electrode layer; and the second insulating layer preferably has a lower permeability to oxygen and hydrogen than the first insulating layer. Furthermore, an aluminum oxide film is suitably used as the second insulating layer.

The above-described semiconductor device preferably includes an oxide insulating layer including oxygen in excess of the stoichiometric composition, in which the oxide insulating layer is in contact with a plane of the oxide semiconductor film which is opposite to a plane of the oxide semiconductor film in contact with the gate insulating film. Furthermore, an aluminum oxide film, a silicon nitride film, or a silicon nitride oxide film is preferably provided in contact with the oxide insulating layer.

In the above-described semiconductor device, it is preferable that the channel formation region be non-single crystal, the channel formation region have atoms arranged in a triangular, hexagonal, equilateral triangular, or regular hexagonal shape when seen from a direction perpendicular to an a-b plane, and the channel formation region have a phase in which metal atoms are arranged in a layered manner in a c-axis direction or a phase in which metal atoms and oxygen atoms are arranged in a layered manner in the c-axis direction.

In the above-described semiconductor device, the oxide semiconductor film preferably includes at least indium.

In the above-described semiconductor device, the oxide semiconductor film preferably includes at least indium, gallium, and zinc.

One embodiment of the present invention relates to a semiconductor device including a transistor or a semiconductor device including a circuit which is formed with such a transistor. For example, one embodiment of the present invention relates to a semiconductor device including a transistor in which a channel formation region is formed using an oxide semiconductor or a semiconductor device including a circuit which is formed with such a transistor. For example, one embodiment of the present invention relates to an LSI, a CPU, a power device mounted in a power circuit, a semiconductor integrated circuit including a memory, a thyristor, a converter, an image sensor, or the like, an electro-optical device typified by a liquid crystal display panel, a light-emitting display device including a light-emitting element, or an electronic device including the aforementioned device as a component.

Note that in this specification or the like, when one of a source and a drain of a transistor is called a drain, the other is called a source. That is, they are not distinguished depending on the potential level. Therefore, in this specification, a portion called a source can be alternatively referred to as a drain.

Note that a channel length refers to a distance between a source and a drain of a transistor. The shorter the channel length is, the lower the on-state resistance becomes; thus, a transistor having a short channel length is capable of high-speed operation.

According to one embodiment of the present invention, a transistor with a short channel length in which a short-channel effect does not occur or hardly occurs can be provided.

According to one embodiment of the present invention, a minute transistor in which a short-channel effect does not occur or substantially does not occur can be provided without providing an LDD region. Furthermore, a semiconductor device to which the transistor is applied can be provided.

A high-performance semiconductor device including a minute transistor which enables high-speed operation, high integration, and low power consumption can be provided.

A semiconductor device including a minute transistor which enables high reliability and low cost can be provided.

DETAILED DESCRIPTION OF THE INVENTION

Figure 1A:
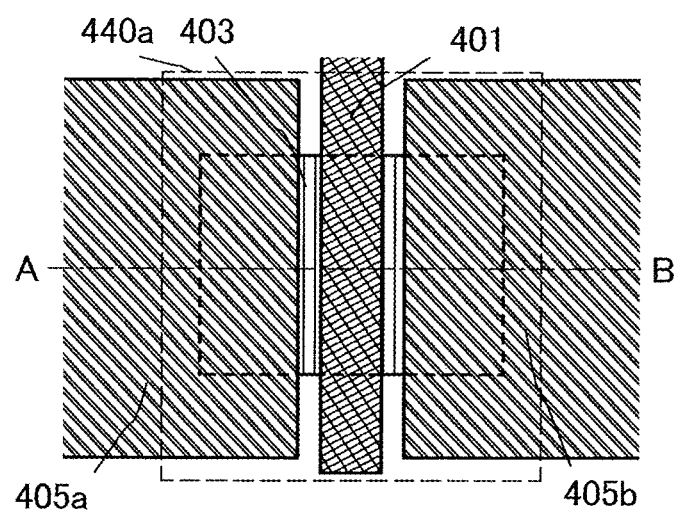
FIGS. 1A and 1B are a plan view and a cross-sectional view illustrating one embodiment of a semiconductor device.

Hereinafter, embodiments of the invention disclosed in this specification will be described with reference to the accompanying drawings. Note that the invention disclosed in this specification is not limited to the following description, and it is easily understood by those skilled in the art that modes and details of the invention can be modified in various ways. Therefore, the invention disclosed in this specification is not construed as being limited to the description of the following embodiments. Note that the ordinal numbers such as "first" and "second" in this specification are used for convenience and do not denote the order of steps and the stacking order of layers. In addition, the ordinal numbers in this specification do not denote particular names that specify the present invention.

Note that in structures of the present invention described below, like portions or portions having similar functions are denoted by the same reference numerals in different drawings, and description thereof is not repeated. Furthermore, the same hatching pattern is applied to portions having similar functions, and the portions are not especially denoted by reference numerals in some cases.

Embodiment 1

In this embodiment, embodiments of a semiconductor device and one embodiment of a method for manufacturing the semiconductor device will be described using FIGS. 1A and 1B, FIGS. 2A to 2C, and FIGS. 3A to 3C. In this embodiment, a transistor including an oxide semiconductor film will be described as an example of the semiconductor device.

The transistor may have a top-gate structure or a bottom-gate structure, and may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned above and below a channel formation region with gate insulating films provided therebetween.

Figure 1B:
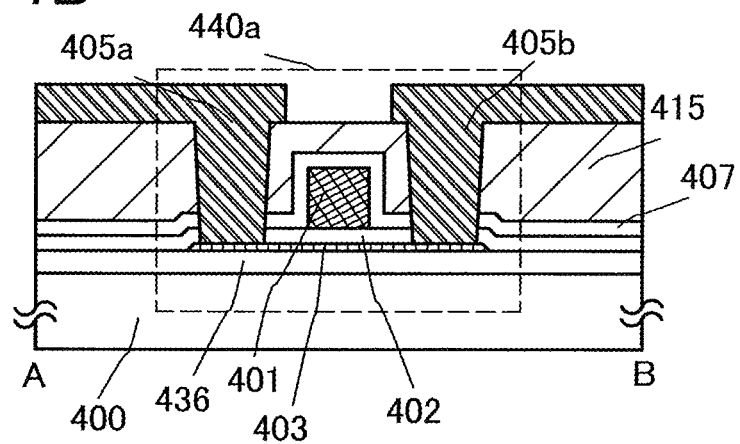

A transistor 440a illustrated in FIGS. 1A and 1B is an example of a top-gate transistor. FIG. 1A is a plan view of the transistor 440a, and FIG. 1B is a cross-sectional view taken along line A-B in FIG. 1A. Note that in FIG. 1A, some components of the transistor 440a are not illustrated for clarity.

As shown in FIG. 1B which is a cross-sectional view in the channel length direction, a semiconductor device including the transistor 440a includes, over a substrate 400 having an insulating surface provided with an insulating film 436, an oxide semiconductor film 403, a source electrode layer 405a, a drain electrode layer 405b, a gate insulating film 402, a gate electrode layer 401, an insulating film 407 provided over the gate electrode layer 401, and an interlayer insulating film 415.

In the transistor 440a, the channel length is short (greater than or equal to 5 nm and less than 60 nm, preferably greater than or equal to 10 nm and less than or equal to 40 nm), and the gate insulating film 402 is thick (the equivalent oxide thickness which is obtained by converting into a thickness of silicon oxide containing nitrogen is greater than or equal to 5 nm and less than or equal to 50 nm, preferably greater than or equal to 10 nm and less than or equal to 40 nm). The transistor 440a exhibits excellent electric characteristics as a switching element, in which a short-channel effect does not occur or hardly occurs.

The concentration of nitrogen in the silicon oxide film containing nitrogen may be higher than or equal to 0.01 atoms %, preferably higher than or equal to 0.1 atoms % and lower than or equal to 50 atoms %, more preferably higher than or equal to 0.5 atoms % and lower than or equal to 15 atoms %. A silicon oxide film that contains nitrogen at the above concentration is referred to as a silicon oxynitride film in some cases. The relative permittivity of the silicon oxide film containing nitrogen is typically 3.8 to 4.1.

An oxide semiconductor used for the oxide semiconductor film 403 contains at least indium (In). In particular, In and zinc (Zn) are preferably contained. In addition, as a stabilizer for reducing the variations in electric characteristics of a transistor including the oxide semiconductor, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or more selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) which belong to lanthanoid may be contained.

As the oxide semiconductor, for example, any of the following can be used: indium oxide; tin oxide; zinc oxide; a two-component metal oxide such as an In—Zn-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than In, Ga, and Zn.

Alternatively, a material represented by $InMO_3(ZnO)_m$ (m>0, and m is not an integer) may be used as the oxide semiconductor. Note that M represents one or more metal elements selected from Ga, Fe, Mn, and Co. Alternatively, a material represented by $In_2SnO_5(ZnO)_n$ (n>0, n is an integer) may be used as the oxide semiconductor.

For example, an In—Ga—Zn-based oxide with an atomic ratio of In:Ga:Zn=1:1:1 (=1/3:1/3:1/3), In:Ga:Zn=2:2:1 (=2/5:2/5:1/5), In:Ga:Zn=3:1:2 (=1/2:1/6:1/3), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used as the oxide semiconductor containing indium depending on needed semiconductor characteristics (e.g., mobility, threshold voltage, and variation). In order to obtain needed semiconductor characteristics, it is preferable that the carrier concentration, the impurity concentration, the defect density, the atomic ratio between a metal element and oxygen, the interatomic distance, the density, and the like be set to appropriate values.

For example, high mobility can be obtained relatively easily in the case of using an In—Sn—Zn-based oxide. However, in the case of using an In—Ga—Zn-based oxide, mobility can be increased by reducing the defect density in a bulk.

Note that for example, the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$. For example, r may be 0.05. The same applies to other oxides.

The oxide semiconductor film 403 is in a single crystal state, a polycrystalline (also referred to as polycrystal) state, an amorphous state, or the like.

The oxide semiconductor film 403 is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Furthermore, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

Note that in the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Furthermore, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the direction of c-axis of the crystal part is the direction parallel to a normal vector of the surface where the CAAC-OS film is formed just after the formation of the CAAC-OS film or a normal vector of the surface of the CAAC-OS film just after the formation of the CAAC-OS film. The crystal part is formed by film formation or by performing treatment for crystallization such as heat treatment after film formation.

With the use of the CAAC-OS film in a transistor, a change in electric characteristics of the transistor due to irradiation with visible light or ultraviolet light is small. Thus, the transistor has high reliability.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol. % or higher, preferably 100 vol. %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_X$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

In an oxide semiconductor having a crystal part such as the CAAC-OS, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness ($R_a$) of less than or equal to 1 nm, preferably less than or equal to 0.3 nm, more preferably less than or equal to 0.1 nm.

Note that $R_a$ is obtained by expanding arithmetic mean surface roughness, which is defined by JIS B 0601: 2001 (ISO4287: 1997), into three dimensions so as to be applied to a curved surface. In addition, $R_a$ can be expressed as "an average value of the absolute values of deviations from a reference surface to a specific surface" and is defined by the following formula.

$$Ra = \frac{1}{S_0} \int_{y_1}^{y_2} \int_{x_1}^{x_2} |f(x, y) - Z_0| dx dy \qquad (17)$$

Here, the specific surface is a surface which is a target of roughness measurement, and is a quadrilateral region which is specified by four points represented by the coordinates $(x_1, y_1, y_1))$, $(x_1, y_2, f(x_1, y_2))$, $(x_2, y_1, y_1))$, and $(x_2, y_2, f(x_2, y_2))$. Moreover, $S_0$ represents the area of a rectangle which is obtained by projecting the specific surface on the xy plane, and $Z_0$ represents the height of the reference surface (the average height of the specific surface). Furthermore, $R_a$ can be measured using an atomic force microscope (AFM).

The oxide semiconductor film 403 has a thickness greater than or equal to 1 nm and less than or equal to 30 nm (preferably greater than or equal to 5 nm and less than or equal to 10 nm) and can be formed by a sputtering method, a molecular beam epitaxy (MBE) method, a CVD method, a pulse laser deposition method, an atomic layer deposition (ALD) method, or the like as appropriate. The oxide semiconductor film 403 may be formed with a sputtering apparatus which performs deposition in the state where surfaces of a plurality of substrates set substantially perpendicular to a surface of a sputtering target.

An example of a method for manufacturing the transistor 440a is described as a method for manufacturing a transistor of one embodiment of the present invention.

The insulating film 436 is formed over the substrate 400 having an insulating surface.

There is no particular limitation on a substrate that can be used as the substrate 400 having an insulating surface as long as it has heat resistance high enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate provided with a semiconductor element can be used as the substrate 400.

The semiconductor device may be manufactured using a flexible substrate as the substrate 400. To manufacture a flexible semiconductor device, the transistor 440a including the oxide semiconductor film 403 may be directly formed over a flexible substrate; or alternatively, the transistor 440a including the oxide semiconductor film 403 may be formed over a substrate, and then may be separated and transferred to a flexible substrate. To separate the transistor 440a from the substrate and transfer to the flexible substrate, a separation layer may be provided between the substrate and the transistor 440a including the oxide semiconductor film.

The insulating film 436 can be formed by a plasma CVD method, a sputtering method, or the like using any of silicon oxide, silicon oxynitride, aluminum oxide, aluminum oxynitride, hafnium oxide, or gallium oxide, or a mixed material of any of these elements.

The insulating film 436 may be a single layer or a stacked layer. For example, a silicon oxide film, an In—Hf—Zn-based oxide film, and the oxide semiconductor film 403 may be stacked in that order over the substrate 400; a silicon oxide film, an In—Zr—Zn-based oxide film with an atomic ratio of In:Zr:Zn=1:1:1, and the oxide semiconductor film 403 may be stacked in that order over the substrate 400; or a silicon oxide film, an In—Gd—Zn-based oxide film with an atomic ratio of In:Gd:Zn=1:1:1, and the oxide semiconductor film 403 may be stacked in that order over the substrate 400.

Note that the insulating film 436 preferably has a single-layer structure or a stacked-layer structure including an oxide insulating layer so that the oxide insulating layer is in contact with the oxide semiconductor film 403 to be formed later. Note that the insulating film 436 is not necessarily provided.

A silicon oxide film formed by a sputtering method is used as the insulating film 436 in this embodiment.

Furthermore, a nitride insulating film may be provided between the insulating film 436 and the substrate 400. The nitride insulating film can be formed by a plasma CVD method, a sputtering method, or the like with the use of silicon nitride, silicon nitride oxide, aluminum nitride, or aluminum nitride oxide, or a mixed material of any of these elements. With the nitride insulating film between the insulating film 436 and the substrate 400, difusion of an impurity to the oxide semiconductor film 403 can be prevented.

The insulating film 436, which is in contact with the oxide semiconductor film 403, preferably contains an amount of oxygen which exceeds at least the amount of oxygen in the stoichiometric composition in the film (bulk). For example, in the case where a silicon oxide film is used as the insulating film 436, the composition formula is $SiO_{2+\alpha}$ ($\alpha>0$). With such a film as the insulating film 436, oxygen can be supplied to the oxide semiconductor film 403, leading to favorable characteristics. By supply of oxygen to the oxide semiconductor film 403, oxygen vacancy in the film can be repaired. Note that in the case of having a stacked-layer structure, the insulating film 436 preferably includes an oxygen-excess region at least in a layer (preferably an oxide insulating layer) in contact with the oxide semiconductor film 403.

For example, an insulating film containing much (excessive) oxygen, which serves as a supply source of oxygen, may be provided as the insulating film 436 to be in contact with the oxide semiconductor film 403, whereby oxygen can be supplied from the insulating film 436 to the oxide semiconductor film 403. Heat treatment may be performed in the state where the oxide semiconductor film 403 and the insulating film 436 are at least partly in contact with each other so that oxygen is supplied to the oxide semiconductor film 403.

In order to provide the oxygen-excess region in the insulating film 436, for example, the insulating film 436 may be formed in an oxygen atmosphere. Alternatively, the oxygen-excess region may be formed by introducing oxygen (including at least one of an oxygen radical, an oxygen atom, and an oxygen ion) to the insulating film 436 after the formation of the insulating film 436. Oxygen can be introduced by an ion implantation method, an ion doping method, a plasma immersion ion implantation method, plasma treatment, or the like.

Planarization treatment may be performed on a region of the insulating film 436 which is in contact with the oxide semiconductor film 403. As the planarization treatment, polishing treatment (e.g., a chemical mechanical polishing method), dry-etching treatment, or plasma treatment can be used, though there is no particular limitation on the planarization treatment.

As plasma treatment, reverse sputtering in which an argon gas is introduced and plasma is generated can be performed. The reverse sputtering is a method in which voltage is applied to a substrate side with the use of an RF power supply in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. By the reverse sputtering, powder substances (also referred to as particles or dust) which are attached to the surface of the insulating film 436 can be removed.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on the roughness of the surface of the insulating film 436.

The planarization treatment may be performed on a surface of the silicon oxide film used as the insulating film 436 by a chemical mechanical polishing method (polishing conditions: a polyurethane-based polishing cloth, silica-based slurry, a slurry temperature of room temperature, a polishing pressure of 0.001 MPa, a rotation number in polishing (table/spindle) of 60 rpm/56 rpm, and a polishing time of 0.5 minutes) so that the average surface roughness ($R_a$) of the surface of the silicon oxide film is approximately 0.15 nm.

Next, the oxide semiconductor film 403 is formed over the insulating film 436.

In order that hydrogen or water is not contained in the oxide semiconductor film 403 as much as possible in the formation step of the oxide semiconductor film 403, it is preferable to heat the substrate provided with the insulating film 436 in a preheating chamber in a sputtering apparatus as a pretreatment for formation of the oxide semiconductor film 403 so that impurities such as hydrogen and moisture adsorbed to the substrate and/or the insulating film 436 are eliminated and evacuated. As an evacuation unit provided in the preheating chamber, a cryopump is preferable.

To reduce impurities such as hydrogen (including water and a hydroxyl group) and make the insulating film 436 an oxygen-excess film, heat treatment (dehydration or dehydrogenation) to remove hydrogen (including water and a hydroxyl group) and/or oxygen doping treatment may be performed on the insulating film 436. The dehydration or dehydrogenation and the oxygen doping treatment each may be performed plural times, and may be combined and repeated.

It is preferable that the oxide semiconductor film 403 contains oxygen in a proportion higher than that in the stoichiometric composition to be supersaturated shortly after the oxide semiconductor film 403 is formed. For example, in the case where the oxide semiconductor film 403 is formed by a sputtering method, deposition is preferably performed under such a condition that the ratio of oxygen to a deposition gas is high. In particular, deposition is preferably performed in an oxygen atmosphere (a 100% oxygen gas). When the deposition is performed in the state where the ratio of oxygen to a deposition gas is high, particularly in a 100% oxygen gas atmosphere, release of zinc from the film can be reduced even at a deposition temperature higher than or equal to 300° C., for example.

To make the oxide semiconductor film 403 supersaturated with oxygen by being supplied with enough oxygen, the insulating films in contact with the oxide semiconductor film 403 (the plurality of insulating films provided so as to surround the oxide semiconductor film 403) preferably contain excess oxygen.

Note that in this embodiment, a target used for forming the oxide semiconductor film 403 by a sputtering method is an oxide target having a composition of In:Ga:Zn=3:1:2 [atomic percentage] so that an In—Ga—Zn-based oxide film (IGZO film) is formed.

The relative density (the fill rate) of the metal oxide target is greater than or equal to 90% and less than or equal to 100%, preferably greater than or equal to 95% and less than or equal to 99.9%. By using the metal oxide target with high relative density, a dense oxide semiconductor film can be formed.

It is preferable that a high-purity gas from which impurities such as hydrogen, water, a hydroxyl group, and hydride are removed be used as a sputtering gas for the formation of the oxide semiconductor film 403.

The substrate is held in a deposition chamber kept under reduced pressure. Then, a sputtering gas from which impurities such as hydrogen and moisture are removed is introduced into the deposition chamber from which remaining moisture is being removed, and the oxide semiconductor film 403 is formed over the substrate 400 with the use of the target. In order to remove moisture remaining in the deposition chamber, an entrapment vacuum pump such as a cryopump, an ion pump, or a titanium sublimation pump is preferably used. As an evacuation unit, a turbo molecular pump to which a cold trap is added may be used. In the deposition chamber which is evacuated with the cryopump, for example, a hydrogen atom, a compound containing a hydrogen atom, such as water ($H_2O$), (more preferably, also a compound containing a carbon atom), and the like are removed, whereby the concentration of impurities in the oxide semiconductor film 403 formed in the deposition chamber can be reduced.

The insulating film 436 and the oxide semiconductor film 403 are preferably formed in succession without exposure to the air. By the successive formation of the insulating film 436 and the oxide semiconductor film 403 without exposure to the air, impurities such as hydrogen and moisture can be prevented from being adsorbed onto a surface of the insulating film 436.

The oxide semiconductor film 403 can be formed by processing a film-shaped oxide semiconductor film into an island-shaped oxide semiconductor film by a photolithography process.

A resist mask for forming the island-shaped oxide semiconductor film 403 may be formed by an inkjet method. The formation of the resist mask by an inkjet method needs no photomask; thus, manufacturing cost can be reduced.

Note that etching of the oxide semiconductor film may be dry etching, wet etching, or both dry etching and wet etching. As an etchant used for wet etching of the oxide semiconductor film, for example, a mixed solution of phosphoric acid, acetic acid, and nitric acid, or the like can be used. As the etchant, ITO-07N (produced by KANTO CHEMICAL CO., INC.) may be used. Alternatively, the oxide semiconductor film may be etched by a dry etching method using an inductively coupled plasma (ICP) etching method. For example, an IGZO film is etched by the ICP etching method (etching conditions: an etching gas of $BCL_3$ and $Cl_2$ ($BCL_3:Cl_2$=60 sccm:20 sccm), a power of 450 W, a bias power of 100 W, and a pressure of 1.9 Pa), whereby the IGZO film can be processed into an island shape.

It is preferable that the oxide semiconductor film 403 be highly purified to contain few impurities such as copper, aluminum, and chlorine. In the process for manufacturing the transistor 440a, it is preferable to select steps in which these impurities are not contained or attached to the surface of the oxide semiconductor film 403 as appropriate. In the case where the impurities are attached to the surface of the oxide semiconductor film 403, the impurities on the surface of the oxide semiconductor film 403 are preferably removed by exposure to oxalic acid or dilute hydrofluoric acid or plasma treatment (such as $N_2O$ plasma treatment). Specifically, the concentration of copper in the oxide semiconductor film 403 is lower than or equal to $1\times10^{18}$ atoms/cm$^3$, preferably lower than or equal to $1\times10^{17}$ atoms/cm$^3$. Furthermore, the concentration of aluminum in the oxide semiconductor film 403 is lower than or equal to $1\times10^{18}$ atoms/cm$^3$. The concentration of chlorine in the oxide semiconductor film 403 is lower than or equal to $2\times10^{18}$ atoms/cm$^3$.

Furthermore, heat treatment may be performed on the oxide semiconductor film 403 in order to remove excess hydrogen (including water and a hydroxyl group) (to perform dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like. For example, the substrate is put in an electric furnace which is one of heat treatment apparatuses, and the oxide semiconductor film 403 is subjected to heat treatment at 450° C. for one hour in a nitrogen atmosphere.

Note that the heat treatment apparatus is not limited to an electric furnace, and a device for heating an object by heat conduction or heat radiation from a heating element such as a resistance heating element may be alternatively used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed as follows: the substrate is put in an inert gas heated at a high temperature of 650° C. to 700° C., is heated for several minutes, and is taken out of the inert gas.

Note that in the heat treatment, it is preferable that water, hydrogen, and the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, more preferably 7N (99.99999%) or higher (i.e., the impurity concentration is preferably 1 ppm or lower, more preferably 0.1 ppm or lower).

In addition, after the oxide semiconductor film 403 is heated by the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, more preferably less than or equal to 10 ppb, in the case where measurement is performed with use of a dew point meter of a cavity ring down laser spectroscopy (CRDS) system) may be introduced into the same furnace. It is preferable that water, hydrogen, or the like be not contained in the oxygen gas or the dinitrogen monoxide gas. Alternatively, the purity of the oxygen gas or the dinitrogen monoxide gas which is introduced into the heat treatment apparatus is preferably 6N or higher, more preferably 7N or higher (i.e., the impurity concentration in the oxygen gas or the dinitrogen monoxide gas is preferably 1 ppm or lower, more preferably 0.1 ppm or lower). The oxygen gas or the dinitrogen monoxide gas acts to supply oxygen that is a main constituent material of the oxide semiconductor and that is reduced by the step for removing impurities for dehydration or dehydrogenation, so that the oxide semiconductor film 403 can be a highly-purified, i-type (intrinsic) oxide semiconductor film.

Note that the heat treatment for dehydration or dehydrogenation may be performed after the formation of a film-shaped oxide semiconductor film or after the formation of the island-shaped oxide semiconductor film 403.

The heat treatment for dehydration or dehydrogenation may be performed plural times and may also serve as another heat treatment.

The heat treatment for dehydration or dehydrogenation is preferably performed in the state where the insulating film 436 is covered with the film-shaped oxide semiconductor film 403 which has not been processed into the island-shaped oxide semiconductor film 403, in which case oxygen contained in the insulating film 436 can be prevented from being released by the heat treatment.

Oxygen vacancy exists in a portion where oxygen is eliminated in an oxide semiconductor film, and a donor level which leads to a change in the electric characteristics of a transistor is formed owing to the oxygen vacancy. By the dehydration or dehydrogenation treatment, oxygen which is a main constituent material of an oxide semiconductor may also be released and reduced.

When the dehydration or dehydrogenation treatment is performed, oxygen is preferably supplied to the oxide semiconductor film 403. By supply of oxygen to the oxide semiconductor film 403, oxygen vacancy in the film can be repaired.

Accordingly, dehydration or dehydrogenation treatment is preferably performed before the introduction of oxygen to the oxide semiconductor film 403.

An oxide insulating film containing much (excessive) oxygen, which serves as a supply source of oxygen, may be provided to be in contact with the oxide semiconductor film 403, whereby oxygen can be supplied from the oxide insulating film to the oxide semiconductor film 403. In the above structure, heat treatment may be performed in the state where the oxide semiconductor film 403 which has been subjected to the heat treatment as dehydration or dehydrogenation treatment and the oxide insulating film are at least partly in contact with each other so that oxygen is supplied to the oxide semiconductor film.

Oxygen doping treatment may be performed, in which case oxygen (including at least one of an oxygen radical, an oxygen atom, an oxygen molecule, ozone, an oxygen ion (an oxygen molecule ion), and an oxygen cluster ion) is introduced into the oxide semiconductor film 403 that has been subjected to the dehydration or dehydrogenation treatment, so that oxygen is supplied to the film. Oxygen doping includes "oxygen plasma doping" in which oxygen plasma is added to a bulk.

For the oxygen doping treatment, a gas containing oxygen can be used. As the gas containing oxygen, oxygen, dinitrogen monoxide, nitrogen dioxide, carbon dioxide, carbon monoxide, or the like can be used. Alternatively, a rare gas may be used for the oxygen doping treatment.

For the doped oxygen (an oxygen radical, an oxygen atom, an oxygen molecule, ozone, an oxygen ion (an oxygen molecule ion) and/or an oxygen cluster ion), an ion implantation method, an ion doping method, a plasma immersion ion implantation method, plasma treatment, or the like can be used. For the ion implantation method, a gas cluster ion beam may be used. The oxygen doping treatment may be performed over the entire area at a time or may be performed using a moving (scanning) linear ion beam or the like.

For example, in the case where an oxygen ion is introduced by an ion implantation method as the oxygen doping treatment, the dosage can be greater than or equal to $1\times10^{13}$ ions/cm$^2$ and less than or equal to $5\times10^{16}$ ions/cm$^2$.

The oxide semiconductor film 403 is preferably highly purified by sufficient removal of impurities such as hydrogen or by supersaturation with oxygen by sufficient supply of oxygen. Specifically, the hydrogen concentration in the oxide semiconductor film 403 is $5\times10^{19}$ atoms/cm$^3$ or lower, preferably $5\times10^{18}$ atoms/cm$^3$ or lower, more preferably $5\times10^{17}$ atoms/cm$^3$ or lower. Note that the hydrogen concentration in the oxide semiconductor film 403 is measured by secondary ion mass spectrometry (SIMS).

Furthermore, it is preferable that impurities such as hydrogen be sufficiently removed from the insulating films (the insulating film 436 and the gate insulating film 402) in contact with the oxide semiconductor film 403. Specifically, hydrogen concentration in the insulating films in contact with the oxide semiconductor film 403 is preferably lower than $7.2\times10^{20}$ atoms/cm$^3$.

To reduce impurities such as hydrogen (including water and a hydroxyl group) and make the gate insulating film 402 an oxygen-excess film, heat treatment (dehydration or dehydrogenation) to remove hydrogen (including water and a hydroxyl group) and/or oxygen doping treatment may be performed on the gate insulating film 402. The dehydration or dehydrogenation and the oxygen doping treatment each may be performed plural times, and may be combined and repeated.

By removing hydrogen or moisture from the oxide semiconductor to highly purify the oxide semiconductor so as not to contain impurities as much as possible, and supplying oxygen to repair oxygen vacancy therein, the oxide semiconductor can be turned into an i-type (intrinsic) oxide semiconductor or a substantially i-type (intrinsic) oxide semiconductor. This enables the Fermi level ($E_f$) of the oxide semiconductor to be at the same level as the intrinsic Fermi level ($E_f$) thereof. Accordingly, by using the oxide semiconductor film for a transistor, variations in the threshold voltage Vth of the transistor and a shift of the threshold voltage ΔVth due to oxygen vacancy can be reduced.

Next, the gate insulating film 402 covering the oxide semiconductor film 403 is formed. The gate insulating film 402 is formed to an equivalent oxide thickness which is obtained by converting into a thickness of silicon oxide containing nitrogen of greater than or equal to 5 nm and less than or equal to 50 nm, preferably greater than or equal to 10 nm and less than or equal to 40 nm.

Note that a surface of the oxide semiconductor film 403 may also be subjected to the planarization treatment in order to improve the coverage with the gate insulating film 402. The surface of the oxide semiconductor film 403 is preferably flat particularly in the case where a thin insulating film is used as the gate insulating film 402.

The gate insulating film 402 can be formed by a sputtering method, an MBE method, a CVD method, a pulsed laser deposition method, an ALD method, or the like as appropriate. The gate insulating film 402 may be formed with a sputtering apparatus which performs deposition in the state where surfaces of a plurality of substrates set substantially perpendicular to a surface of a sputtering target.

The gate insulating film 402 can be formed using a silicon oxide film, a gallium oxide film, an aluminum oxide film, a silicon nitride film, a silicon oxynitride film, an aluminum oxynitride film, or a silicon nitride oxide film. It is preferable that a portion of the gate insulating film 402 which is in contact with the oxide semiconductor film 403 contains oxygen. In particular, the gate insulating film 402 preferably contains an amount of oxygen which exceeds at least the amount of oxygen in the stoichiometric composition in the film (bulk). For example, in the case where a silicon oxide film is used as the gate insulating film 402, the composition formula is $SiO_{2+\alpha}$ ($\alpha>0$). In this embodiment, a silicon oxide film of $SiO_{2+\alpha}$ ($\alpha>0$) is used as the gate insulating film 402. The use of the silicon oxide film as the gate insulating film 402 makes it possible to supply oxygen to the oxide semiconductor film 403, which leads to good characteristics. Furthermore, the gate insulating film 402 is preferably formed in consideration of the size of a transistor to be formed and the step coverage with the gate insulating film 402.

Alternatively, as the material for the gate insulating film 402, hafnium oxide, yttrium oxide, hafnium silicate (Hf-Si$_x$O$_y$ (x>0, y>0)), hafnium silicate to which nitrogen is added (HfSiO$_x$N$_y$ (x>0, y>0)), hafnium aluminate (HfAl$_x$O$_y$, (x>0, y>0)), or lanthanum oxide may be used, for example. Furthermore, the gate insulating film 402 may have either a single-layer structure or a stacked-layer structure.

Then, a conductive film is formed over the gate insulating film 402 and then etched, so that the gate electrode layer 401 is formed.

The gate electrode layer 401 can be formed using a metal material such as molybdenum, titanium, tantalum, tungsten, aluminum, copper, chromium, neodymium, or scandium or an alloy material which contains any of these materials as its main component. A semiconductor film which is typified by a polycrystalline silicon film and doped with an impurity element such as phosphorus, a silicide film such as a nickel silicide film or the like can also be used as the gate electrode layer 401. The gate electrode layer 401 has either a single-layer structure or a stacked-layer structure.

The gate electrode layer 401 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the gate electrode layer 401 has a stacked-layer structure of the above conductive material and the above metal material.

As one layer of the gate electrode layer 401 which is in contact with the gate insulating film 402, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function of 5 eV or higher, preferably 5.5 eV or higher, which enables the threshold voltage of the transistor to take a positive value when used as the gate electrode layer, so that a normally-off switching element can be realized.

A dense inorganic insulating film (typified by an aluminum oxide film) to be a protective insulating film can be provided over the oxide semiconductor film 403, the gate insulating film 402, and the gate electrode layer 401.

In this embodiment, the insulating film 407 is formed over the oxide semiconductor film 403, the gate insulating film 402, and the gate electrode layer 401.

The insulating film 407 may be a single-layer film or a stacked-layer film and preferably includes at least an aluminum oxide film.

With an aluminum oxide film having a high density (film density higher than or equal to 3.2 g/cm$^3$, preferably higher than or equal to 3.6 g/cm$^3$), the transistor 440a can have stable electric characteristics. The film density can be measured by Rutherford backscattering spectrometry (RBS) or X-ray reflection (XRR). The aluminum oxide film preferably contains an amount of oxygen which exceeds at least the amount of oxygen in the stoichiometric composition in the film (bulk). For example, the composition of the aluminum oxide film may be AlO$_x$ (x>1.5).

An aluminum oxide film which can be used for the insulating film 407 has a superior shielding effect (blocking effect), which is not permeable to oxygen and impurities such as hydrogen and moisture.

Therefore, during the manufacturing process and after the manufacture, the insulating film 407 functions as a protective film for preventing entry of impurities such as hydrogen and moisture which might cause variations in characteristics into the oxide semiconductor film 403 and release of oxygen which is a main component of the oxide semiconductor from the oxide semiconductor film 403. Furthermore, an aluminum oxide film can supply oxygen to the oxide semiconductor film 403 which is in contact with the aluminum oxide film.

The insulating film 407 can be formed by a plasma CVD method, a sputtering method, an evaporation method, or the like. Alternatively, as the insulating film 407, a metal oxide film obtained by performing oxidation treatment on a metal film may be used. For example, an aluminum oxide film obtained by performing oxygen doping treatment on an aluminum film may be used.

As the insulating film 407, an inorganic insulating film such as a silicon oxide film, a silicon oxynitride film, an aluminum oxynitride film, or a gallium oxide film can be typically used as well as an aluminum oxide film. Furthermore, a hafnium oxide film, a magnesium oxide film, a zirconium oxide film, a lanthanum oxide film, a barium oxide film, or a metal nitride film (e.g., an aluminum nitride film) can be used, for example.

In this embodiment, an aluminum oxide film is formed by a sputtering method as the insulating film 407.

The interlayer insulating film 415 is formed over the insulating film 407. The interlayer insulating film 415 can be formed using the same material and method as the insulating film 407. In this embodiment, the interlayer insulating film 415 is formed to have a thickness large enough to planarize unevenness caused by the transistor 440a. As the interlayer insulating film 415, a silicon oxynitride film formed by a CVD method or a silicon oxide film formed by a sputtering method can be used.

Furthermore, a planarization insulating film may be formed in order to reduce surface roughness due to the transistor. As the planarization insulating film, an organic material such as polyimide, acrylic, or a benzocyclobutene-based resin can be used. Other than such organic materials, it is also possible to use a low-dielectric constant material (a low-k material) or the like. Note that the planarization insulating film may be formed by stacking a plurality of insulating films formed from these materials.

Openings reaching the oxide semiconductor film 403 are formed in the interlayer insulating film 415, the insulating film 407, and the gate insulating film 402, and the source electrode layer 405a and the drain electrode layer 405b are formed in the openings. A variety of circuits can be formed by connection with another transistor or element with the use of the source electrode layer 405a and the drain electrode layer 405b.

As the conductive film used for the source electrode layer 405a and the drain electrode layer 405b, for example, a metal film containing an element selected from Al, Cr, Cu, Ta, Ti, Mo, and W, or a metal nitride film containing any of the above elements as a component (e.g., a titanium nitride film, a molybdenum nitride film, or a tungsten nitride film) can be used. A metal film having a high melting point such as Ti, Mo, W, or the like or a metal nitride film of any of these elements (e.g., a titanium nitride film, a molybdenum nitride film, or a tungsten nitride film) may be stacked on one of or both of a lower side and an upper side of a metal film of Al, Cu, or the like. Alternatively, the conductive film used for the source electrode layer and the drain electrode layer may be formed using a conductive metal oxide. As the conductive metal oxide, indium oxide (In$_2$O$_3$), tin oxide (SnO$_2$), zinc oxide (ZnO), indium oxide-tin oxide (In$_2$O$_3$—SnO$_2$), indium oxide-zinc oxide (In$_2$O$_3$—ZnO), or any of these metal oxide materials in which silicon oxide is contained can be used.

For example, as the source electrode layer 405a and the drain electrode layer 405b, a single layer of a molybdenum film, a stack of a tantalum nitride film and a copper film, a stack of a tantalum nitride film and a tungsten film, or the like can be used.

Through the above steps, a semiconductor device including the transistor 440a of this embodiment can be manufactured.

Figure 2A:
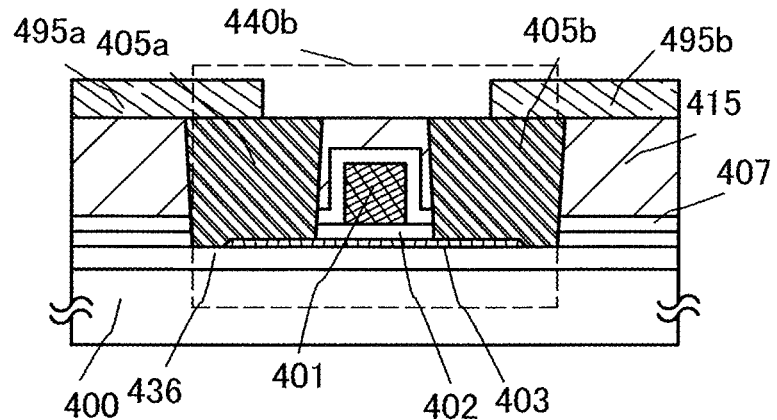
FIGS. 2A to 2C are cross-sectional views each illustrating one embodiment of a semiconductor device.
Figure 2B:
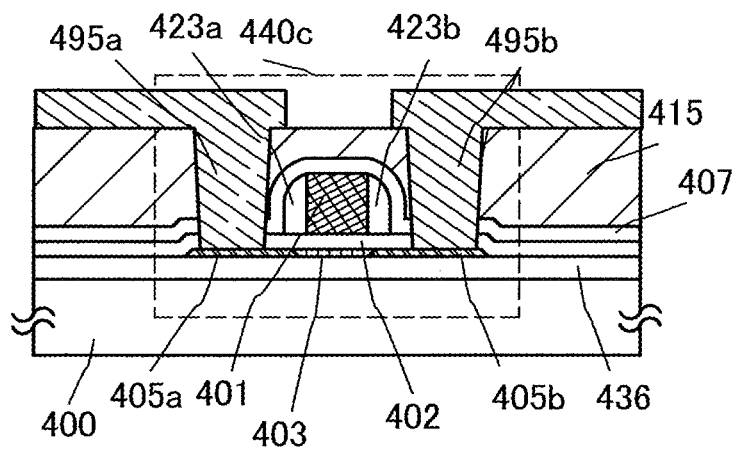
Figure 2C:
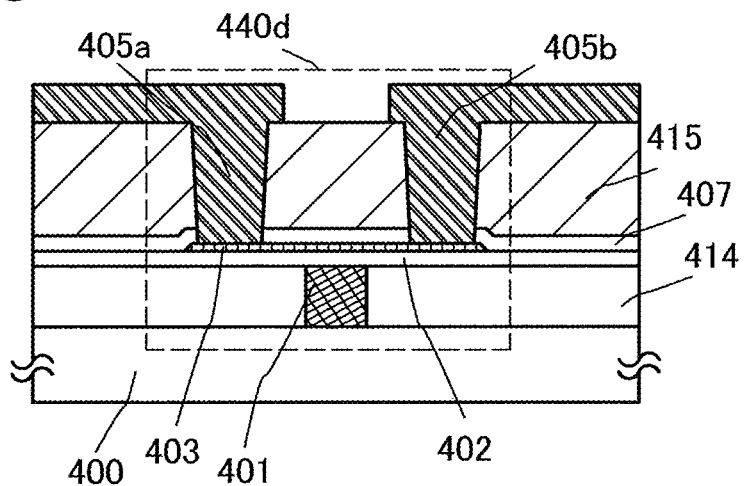
Figure 3A:
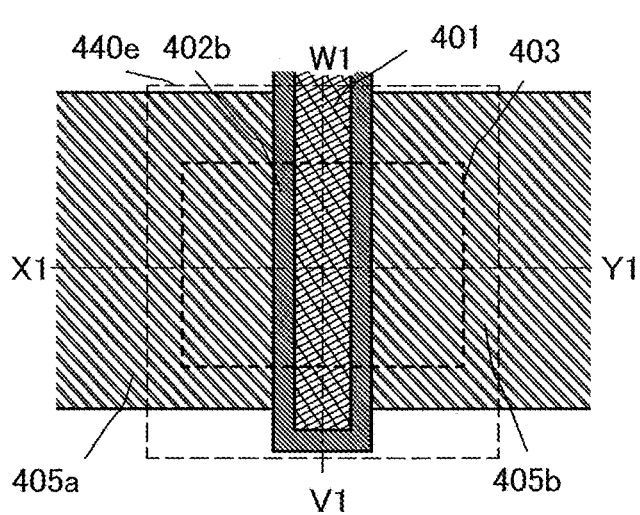
FIGS. 3A to 3C are a plan view and cross-sectional views illustrating one embodiment of a semiconductor device.
Figure 3C:
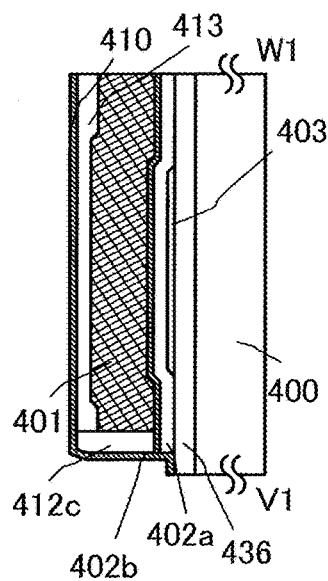
Figure 3B:
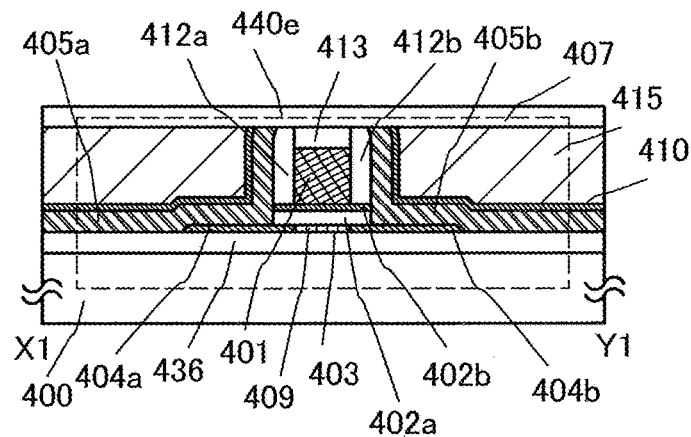
Figure 4A:
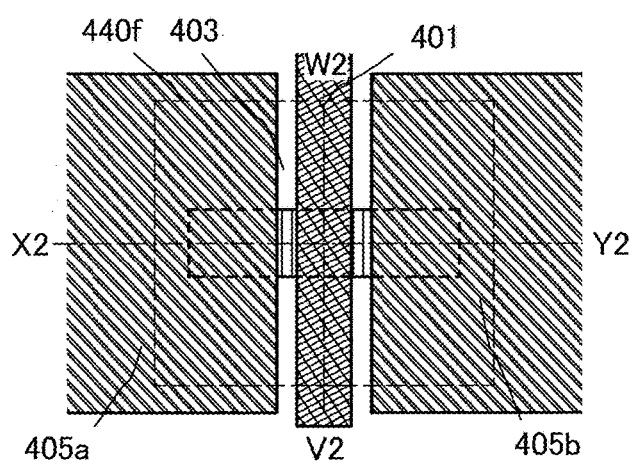
FIGS. 4A to 4C are a plan view and cross-sectional views illustrating one embodiment of a semiconductor device.
Figure 4C:
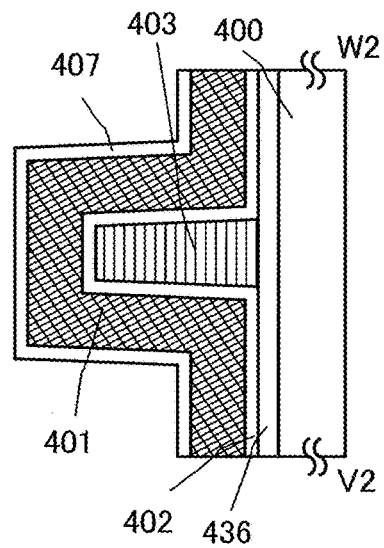
Figure 4B:
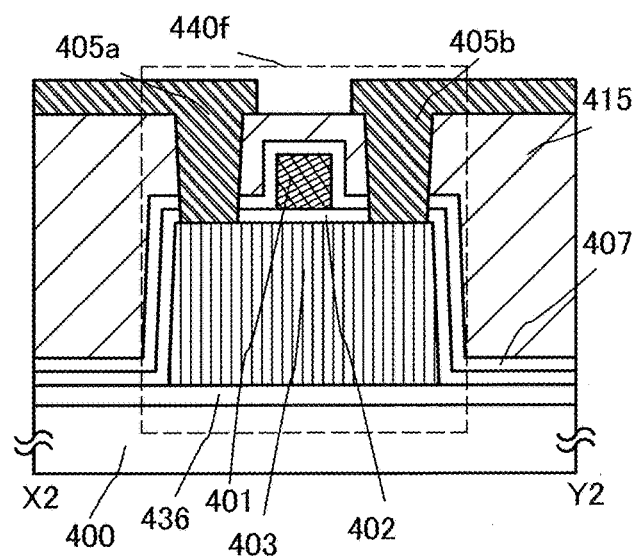

FIGS. 2A, 2B, and 2C illustrate transistors 440b, 440c, and 440d, respectively, FIGS. 3A to 3C illustrate a transistor 440e, and FIGS. 4A to 4C illustrate a transistor 440f. Each of these transistors has a structure different from the above-described structure.

The transistor 440b illustrated in FIG. 2A is an example where wiring layers 495a and 495b are provided in contact with the source electrode layer 405a and the drain electrode layer 405b, respectively. The source electrode layer 405a and the drain electrode layer 405b are formed to be embedded in the interlayer insulating film 415, and surfaces thereof are exposed by polishing treatment. The wiring layers 495a and 495b are formed to be in contact with the exposed surfaces of the source electrode layer 405a and the drain electrode layer 405b so that electrical connection is established. An opening in which the source electrode layer 405a is to be formed and an opening in which the drain electrode layer 405b is to be formed are formed in different steps. By forming the openings with different resist masks in different steps, the distance between the source electrode layer 405a and the drain electrode layer 405b can be shorter than a limit value of light exposure in a photolithography process. In the transistor 440b, the wiring layers 495a and 495b are formed in the same photolithography process, so that the distance between the wiring layers 495a and 495b is longer than the distance between the source electrode layer 405a and the drain electrode layer 405b.

The transistor 440c illustrated in FIG. 2B is an example where sidewall layers 423a and 423b are provided on sidewalls of the gate electrode layer 401, and the source electrode layer 405a and the drain electrode layer 405b are in contact with side surfaces of the oxide semiconductor film 403 so that electrical connection is established. The electrical contact region between the source electrode layer 405a and the drain electrode layer 405b and the oxide semiconductor film 403 can be close to the gate electrode layer 401, which is effective in improving on-state characteristics of the transistor.

Methods for forming the source electrode layer 405a, the drain electrode layer 405b, and the oxide semiconductor film 403 in the transistor 440c illustrated in FIG. 2B are, for example, as follows: the source electrode layer 405a and the drain electrode layer 405b are formed, an oxide semiconductor film is formed thereover, and polishing is performed until the source electrode layer 405a and the drain electrode layer 405b are exposed so that the oxide semiconductor film 403 is formed; or the island-shaped oxide semiconductor film 403 is formed, a conductive film is formed thereover, and polishing is performed until the oxide semiconductor film 403 is exposed so that the source electrode layer 405a and the drain electrode layer 405b are formed.

The transistor 440c illustrated in FIG. 2B includes the sidewall layers 423a and 423b on the sidewall of the gate electrode layer 401. An insulating material or a conductive material can be used for the sidewall layers 423a and 423b. In the case where a conductive material is used, the sidewall layers 423a and 423b can serve as part of the gate electrode layer 401; accordingly, in the channel length direction, a region where the sidewall layers 423a overlaps with the source electrode layer 405a with the gate insulating film 402 interposed therebetween and a region where the sidewall layer 423b overlaps with the drain electrode layer 405b with the gate insulating film 402 interposed therebetween can be regions (Lov regions) where the gate electrode layer overlaps with the source electrode layer and the drain electrode layer with the gate insulating film interposed therebetween. The width of the Lov region can be controlled by adjusting widths of the conductive sidewall layers 423a and 423b provided on the side surfaces of the gate electrode layer 401 in a self-aligned manner, whereby a minute Lov region can be formed with high accuracy. Thus, an Lov region can be provided while a shortened channel length is maintained, so that the transistor 440c with a miniaturized structure in which decrease in on-state current is suppressed can be provided.

The transistor 440d illustrated in FIG. 2C has a bottom-gate structure, in which the gate electrode layer 401 formed to be embedded in an insulating film 414, the gate insulating film 402 formed over the insulating film 414 and the gate electrode layer 401, the oxide semiconductor film 403 over the gate insulating film 402, the insulating film 407 and the interlayer insulating film 415 over the oxide semiconductor film 403 are stacked in this order over the substrate 400 having an insulating surface, and the source electrode layer 405a and the drain electrode layer 405b are provided in openings formed in the insulating film 407 and the interlayer insulating film 415 so as to reach the oxide semiconductor film 403.

A base insulating film may be provided between the substrate 400 and the gate electrode layer 401. With the gate electrode layer 401 formed to be embedded in the insulating film 414 as in the transistor 440d, the gate insulating film 402, the oxide semiconductor film 403, and the like formed over the gate electrode layer 401 can be formed on a flat surface without a defect in shape. Therefore, a highly reliable transistor can be manufactured with high yield.

The transistor 440e illustrated in FIGS. 3A to 3C is an example of a top-gate transistor. FIG. 3A is a plan view of the transistor 440e, FIG. 3B is a cross-sectional view taken along X1-Y1 in FIG. 3A, and FIG. 3C is a cross-sectional view taken along V1-W1 in FIG. 3A. Note that in FIG. 3A, some components of the transistor 440e are not illustrated in order to avoid complexity.

As illustrated in FIG. 3B which is a cross-sectional view in the channel length direction, a semiconductor device including the transistor 440e includes, over the substrate 400 having an insulation surface over which the insulating film 436 is provided, the oxide semiconductor film 403 having a channel formation region 409 and low-resistance regions 404a and 404b, the source electrode layer 405a, the drain electrode layer 405b, a gate insulating film 402a, a gate insulating film 402b, the gate electrode layer 401, sidewall insulating layers 412a and 412b provided in contact with side surfaces of the gate electrode layer 401, an insulating film 413 provided over the gate electrode layer 401, an insulating film 410 and an interlayer insulating film 415 provided over the source electrode layer 405a and the drain electrode layer 405b, and the insulating film 407 covering the transistor 440e.

In an example described in this embodiment, the top surface of the interlayer insulating film 415 is substantially aligned with the top surfaces of the sidewall insulating layers 412a and 412b; the top surfaces of the source electrode layer 405a and the drain electrode layer 405b are substantially aligned with the top surfaces of the interlayer insulating film 415, the sidewall insulating layers 412a and 412b, and the insulating film 413; and the top surfaces of the source electrode layer 405a and the drain electrode layer 405b are higher than the top surface of the gate electrode layer 401.

However, the shapes of the source electrode layer 405a and the drain electrode layer 405b vary depending on conditions of the polishing treatment for removing the conductive film; top surfaces of the source electrode layer 405a and the drain electrode layer 405b are lower than a top surface of the insulating film 413 and top surfaces of the sidewall insulating layers 412a and 412b in some cases depending on the conditions of the polishing treatment.

In FIGS. 3A to 3C, the insulating film 407 is provided in contact with the interlayer insulating film 415, the source electrode layer 405a, the drain electrode layer 405b, the sidewall insulating layers 412a and 412b, and the insulating film 413.

The insulating film 413 and the sidewall insulating layers 412a and 412b each may be a single layer or a stacked layer, and typically, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be used. The insulating film 413 can be formed by a plasma CVD method, a sputtering method, or a CVD method using a deposition gas. As a CVD method, an LPCVD method, a plasma CVD method, or the like can be used, and as another method, a coating film or the like can be used.

Note that the transistor 440e is an example of a transistor in which a dopant is introduced to the oxide semiconductor film 403 in a self-aligned manner using the gate electrode layer 401 as a mask, whereby the low-resistance regions 404a and 404b with the channel formation region 409 provided therebetween are formed in the oxide semiconductor film 403. The low-resistance regions 404a and 404b have lower resistance than the channel formation region 409 and include a dopant.

The low-resistance regions 404a and 404b can be formed in a self-aligned manner by introducing a dopant to the oxide semiconductor film 403 using the gate electrode layer as a mask.

The dopant is an impurity which changes the conductivity of the oxide semiconductor film 403. One or more selected from the following can be used as the dopant: Group 15 elements (typical examples thereof are nitrogen (N), phosphorus (P), arsenic (As), and antimony (Sb)), boron (B), aluminum (Al), argon (Ar), helium (He), neon (Ne), indium (In), fluorine (F), chlorine (Cl), titanium (Ti), and zinc (Zn).

The dopant can be introduced to the oxide semiconductor film 403 through another film (e.g., the gate insulating films 402a and 402b) by an implantation method. As the method for introducing the dopant, an ion implantation method, an ion doping method, a plasma immersion ion implantation method, or the like can be used. In that case, it is preferable to use a single ion of the dopant, or a fluoride ion or chloride ion thereof.

The introduction of the dopant may be controlled by setting the implantation conditions such as the accelerated voltage and the dosage, or the thickness of a film through which the dopant passes as appropriate. In the transistor 440e, phosphorus is used as the dopant, and phosphorus ions are implanted by an ion implantation method. Note that the dosage of the dopant can be set to greater than or equal to $1 \times 10^{13}$ ions/cm$^2$ and less than or equal to $5 \times 10^{16}$ ions/cm$^2$. The concentration of the dopant in the low-resistance regions 404a and 404b is preferably higher than or equal to $5 \times 10^{18}$/cm$^3$ and lower than or equal to $1 \times 10^{22}$/cm$^3$.

The substrate 400 may be heated in introducing the dopant. The introduction of the dopant to the oxide semiconductor film 403 may be performed plural times, and plural kinds of dopants may be used. After the introduction of the dopant, heat treatment may be performed. The heat treatment is preferably performed at a temperature(s) higher than or equal to 300° C. and lower than or equal to 700° C., more preferably higher than or equal to 300° C. and lower than or equal to 450° C., for one hour under an oxygen atmosphere. The heat treatment may be performed under a nitrogen atmosphere, reduced pressure, or the air (ultra-dry air).

In the case where the oxide semiconductor film 403 is a CAAC-OS film, part of the oxide semiconductor film 403 becomes amorphous by introduction of the dopant in some cases.

With the oxide semiconductor film 403 including the low-resistance regions 404a and 404b between which the channel formation region 409 is provided in the channel length direction, on-state characteristics (e.g., on-state current and field-effect mobility) of the transistor 440e are improved, which enables high-speed operation and high-speed response of the transistor.

In the transistor 440e, to reduce impurities such as hydrogen (including water and a hydroxyl group) and make the insulating film 436, the gate insulating films 402a and 402b, the insulating film 413, and the sidewall insulating layers 412a and 412b oxygen-excess films, heat treatment (dehydration or dehydrogenation) to remove hydrogen (including water and a hydroxyl group) and/or oxygen doping treatment may be performed on the insulating film 436, the gate insulating films 402a and 402b, the insulating film 413, and the sidewall insulating layers 412a and 412b. The dehydration or dehydrogenation and the oxygen doping treatment each may be performed plural times, and may be combined and repeated.

In the transistor 440e, an aluminum oxide film is preferably used as the gate insulating film 402b and the insulating film 410. With the use of an aluminum oxide film having a high shielding effect (blocking effect) of preventing penetration of oxygen and impurities such as hydrogen and moisture, the gate insulating film 402b and the insulating film 410 can function as barrier layers of preventing oxygen from being released from the gate insulating film 402a and the insulating film 436 which are in contact with the oxide semiconductor film 403 and which are each an oxide insulating film (e.g., a silicon oxide film or a silicon oxynitride film) in an oxygen excess state.

Accordingly, the gate insulating film 402b and the insulating film 410 can prevent impurities such as hydrogen and moisture, which cause variations in electronic characteristics of the transistor, from entering the oxide semiconductor film 403 during and after the manufacturing process, can keep the oxygen excess state of the gate insulating film 402a and the insulating film 436, and can promote supply of oxygen to the oxide semiconductor film. Thus, the gate insulating film 402b functioning as a barrier layer can suppress or prevent generation of a parasitic channel in the transistor 440e.

It is preferable that the insulating film 436 have a stacked-layer structure where an inorganic insulating film (e.g., a silicon nitride film, a silicon nitride oxide film, or an aluminum oxide film) having a high shielding effect of preventing an impurity from the substrate 400 is used as a film in contact with the substrate 400, and an oxygen-excess oxide insulating film (e.g., a silicon oxide film or a silicon oxynitride film) is used as a film in contact with the oxide semiconductor film 403.

In the manufacturing process of the transistor 440e, the conductive film provided over the gate electrode layer 401, the insulating film 413, and the sidewall insulating layers 412a and 412b is removed by chemical mechanical polishing treatment, so that the conductive film is divided to form the source electrode layer 405a and the drain electrode layer 405b.

The source electrode layer 405a and the drain electrode layer 405b are provided in contact with the exposed portion of a top surface of the oxide semiconductor film 403 and the sidewall insulating layers 412a and 412b. The distance between the gate electrode layer 401 and a region (contact region) in which the oxide semiconductor film 403 is in contact with the source electrode layer 405a or the drain electrode layer 405b corresponds to a width of the sidewall insulating layer 412a or 412b in the channel length direction, whereby the further miniaturization can be achieved and variations in the manufacturing process can be prevented.

Accordingly, the distance between the gate electrode layer 401 and the region (contact region) in which the oxide semiconductor film 403 is in contact with the source electrode layer 405a or the drain electrode layer 405b can be made short, so that the resistance between the gate electrode layer 401 and the region (contact region) in which the oxide semiconductor film 403 is in contact with the source electrode layer 405a or the drain electrode layer 405b is reduced; thus, the on-state characteristics of the transistor 440e can be improved.

Furthermore, precise processing can be performed accurately because an etching step using a resist mask is not performed in a step for removing the conductive film over the gate electrode layer 401, which is one step of the formation process of the source electrode layer 405a and the drain electrode layer 405b. Consequently, in the process for manufacturing the semiconductor device, the transistor 440e having a miniaturized structure with less variation in shape or characteristics can be manufactured with high yield.

Note that in the step of removing the conductive film over the gate electrode layer 401 in the formation process of the source electrode layer 405a and the drain electrode layer 405b, part or all of the insulating film 413 may be removed. In the transistor 440e, a top surface of the insulating film 410 is also planarized by the cutting (grinding or polishing) step in the formation process of the source electrode layer 405a and the drain electrode layer 405b.

The transistor 440f illustrated in FIGS. 4A to 4C is an example of a top-gate transistor. FIG. 4A is a plan view of the transistor 440f, FIG. 4B is a cross-sectional view taken along X2-Y2 in FIG. 4A, and FIG. 4C is a cross-sectional view taken along V2-W2 in FIG. 4A. Note that in FIG. 4A, some components of the transistor 440f are not illustrated in order to avoid complexity.

The transistor 440f is a fin-type transistor, in which the thickness of the oxide semiconductor film 403 is larger than the length of the oxide semiconductor film 403 in the channel width direction (preferably, the thickness of the oxide semiconductor film 403 is twice or more the length of the oxide semiconductor film 403 in the channel width direction). By empoying a fin-type structure, the channel width can be increased without increase in an area of the transistor. The increase in the channel width leads to improvement in the current drive capability.

As described above, in the semiconductor device of this embodiment, each of the transistors 440a, 440b, 440c, 440d, 440e, and 440f exhibits excellent electric characteristics as a switching element, in which a short-channel effect does not occur or hardly occurs.

Therefore, a semiconductor device which is miniaturized and has stable and excellent electric characteristics and a method for manufacturing the semiconductor device can be provided.

Embodiment 2

In this embodiment, an embodiment of a semiconductor device and a manufacturing method thereof will be described with reference to FIGS. 17A and 17B, FIGS. 18A to 18C, FIGS. 19A to 19C, and FIGS. 20A to 20C. In this embodiment, a transistor including an oxide semiconductor film will be described as an example of the semiconductor device.

The transistor may have a top-gate structure or a bottom-gate structure, and may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned above and below a channel formation region with gate insulating films provided therebetween.

Figure 17A:
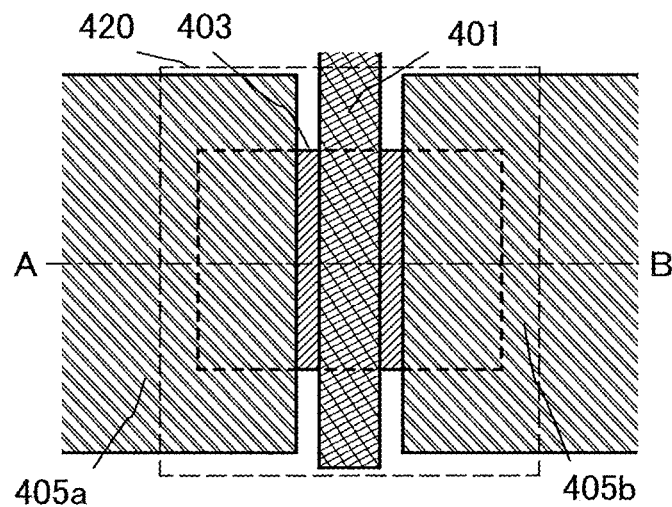
FIGS. 17A and 17B are a plan view and a cross-sectional view illustrating one embodiment of a semiconductor device.
Figure 17B:
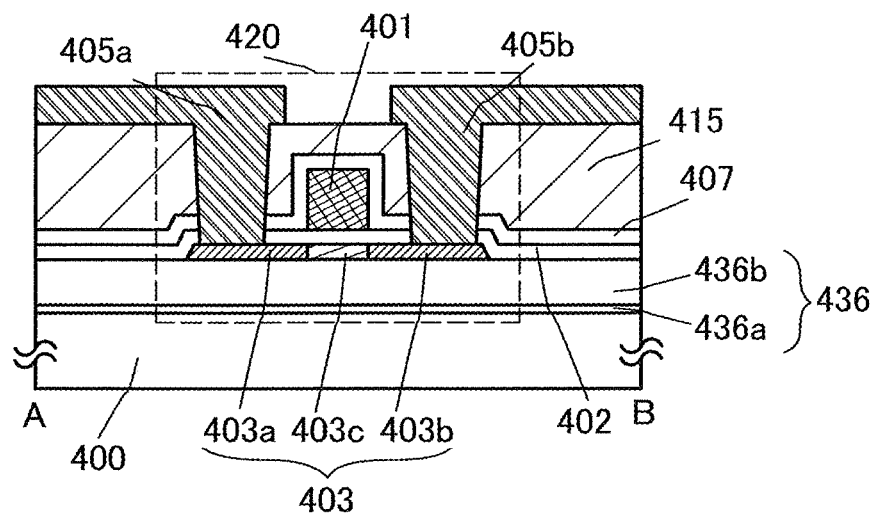

FIGS. 17A and 17B illustrate a structure example of a transistor 420. The transistor 420 illustrated in FIGS. 17A and 17B is an example of a top-gate transistor. FIG. 17A is a plan view of the transistor 420, and FIG. 17B is a cross-sectional view taken along line A-B in the transistor in FIG. 17A. Note that in FIG. 17A, some components of the transistor 420 are not illustrated for clarity.

As shown in FIG. 17B which is a cross-sectional view in the channel length direction, a semiconductor device including the transistor 420 includes, over the substrate 400 having an insulating surface provided with the insulating film 436 having a stacked-layer structure of an insulating film 436a and an insulating film 436b, the oxide semiconductor film 403 including a source region 403a, a drain region 403b, and a channel formation region 403c; the source electrode layer 405a; the drain electrode layer 405b; the gate insulating film 402; the gate electrode layer 401; the insulating film 407 provided over the gate electrode layer 401; and the interlayer insulating film 415.

The transistor 420 has an extremely short channel length. For example, the channel length of the transistor 420 is greater than or equal to 5 nm and less than 60 nm, preferably greater than or equal to 10 nm and less than or equal to 40 nm. The transistor 420 includes the source region 403a and the drain region 403b resistance of which is reduced by introduction of a dopant and the channel formation region 403c sandwiched between the source region 403a and the drain region 403b. The resistivity of the source region 403a and the drain region 403b is greater than or equal to $1.9 \times 10^{-5}$ Ω·m and less than or equal to $4.8 \times 10^{-3}$ Ω·m. Furthermore, the transistor 420 has a single drain structure. A region of the source region 403a in contact with the source electrode layer 405a has the same resistivity as a region of the source region 403a in contact with the channel formation region 403c; a region of the drain region 403b in contact with the drain electrode layer 405b has the same resistivity as a region of the drain region 403b in contact with the channel formation region 403c.

The concentration of the impurity (dopant) contained in the source region 403a and the drain region 403b is greater than or equal to $1.3 \times 10^{19}$ cm$^{-3}$ and less than or equal to $1.6 \times 10^{20}$ cm$^{-3}$. Thus, the source region 403a and the drain region 403b are each a high concentration impurity region which contains a dopant at a high concentration.

The dopant contained in the source region 403a and the drain region 403b is an impurity which changes the conductivity of the oxide semiconductor film 403. One or more selected from the following can be used as the dopant: Group 15 elements (typical examples thereof are nitrogen (N), phosphorus (P), arsenic (As), and antimony (Sb)), boron (B), aluminum (Al), argon (Ar), helium (He), neon (Ne), indium (In), titanium (Ti), and zinc (Zn). As the method for introducing the dopant, an ion implantation method, an ion doping method, a plasma immersion ion implantation method, or the like can be used.

As the oxide semiconductor used for the oxide semiconductor film 403, the oxide semiconductor described in Embodiment 1 can be used.

An example of a method for manufacturing the transistor 420 is described as a method for manufacturing a transistor of one embodiment of the present invention. Note that as to the method for manufacturing the transistor 420, a structure similar to that of Embodiment 1 can be formed by a manner similar to that of Embodiment 1, and thus, Embodiment 1 can be referred to therefor. Hence, description is partly omitted in some cases.

The insulating film 436 is formed over the substrate 400 having an insulating surface.

The insulating film 436 preferably includes a silicon nitride film, a silicon nitride oxide film, or an aluminum oxide film being in contact with the bottom surface of a layer having an oxygen-excess region.

In this embodiment, a silicon nitride film is provided as the insulating film 436a, and a silicon oxide film having an oxygen-excess region is provided as the insulating film 436b.

Next, the oxide semiconductor film 403 is formed over the insulating film 436. The thickness of the oxide semiconductor film 403 is, for example, 1 nm to 30 nm, preferably 5 nm to 10 nm.

The oxide semiconductor film 403 may have either a single-layer structure or a stacked-layer structure. Moreover, the oxide semiconductor film may have either an amorphous structure or a crystalline structure. In the case where the oxide semiconductor film has an amorphous structure, the oxide semiconductor film may be subjected to heat treatment in a later manufacturing step to have crystallinity. The heat treatment for crystallizing the amorphous oxide semiconductor film is performed at a temperature higher than or equal to 250° C. and lower than or equal to 700° C., preferably higher than or equal to 400° C., more preferably higher than or equal to 500° C., still more preferably higher than or equal to 550° C. Note that the heat treatment can also serve as another heat treatment in the manufacturing process.

The oxide semiconductor film can be formed by a sputtering method, a molecular beam epitaxy (MBE) method, a CVD method, a pulse laser deposition method, an atomic layer deposition (ALD) method, or the like as appropriate. The oxide semiconductor film may be formed with a sputtering apparatus which performs deposition in the state where surfaces of a plurality of substrates set substantially perpendicular to a surface of a sputtering target.

Note that formation of the oxide semiconductor film while the substrate 400 is kept at high temperature is also effective in reducing the impurity concentration in the oxide semiconductor film. The temperature at which the substrate 400 is heated may be higher than or equal to 150° C. and lower than or equal to 450° C., preferably higher than or equal to 200° C. and lower than or equal to 350° C. By heating the substrate at high temperature during the film formation, a crystalline oxide semiconductor film can be formed.

In the case where a CAAC-OS film is employed as the oxide semiconductor film 403, the following methods can be used for forming the CAAC-OS film, for example. One of the methods is to form an oxide semiconductor film at a film formation temperature higher than or equal to 200° C. and lower than or equal to 450° C., thereby obtaining c-axis alignment substantially perpendicular to a surface. Another method is to form a thin oxide semiconductor film and then heat treatment is performed on the film at a temperature higher than or equal to 200° C. and lower than or equal to 700° C., thereby obtaining c-axis alignment substantially perpendicular to a surface. The other method is to form a first thin oxide semiconductor film, heat treatment is performed on the film at a temperature higher than or equal to 200° C. and lower than or equal to 700° C., and then form a second oxide semiconductor film, thereby obtaining c-axis alignment substantially perpendicular to a surface.

Furthermore, heat treatment is preferably performed on the oxide semiconductor film 403 in order to remove excess hydrogen (including water and a hydroxyl group) included in the oxide semiconductor film 403 (to perform dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like.

Hydrogen, which is an impurity imparting n-type conductivity, can be removed from the oxide semiconductor by the heat treatment. For example, the hydrogen concentration in the oxide semiconductor film 403 after the dehydration or dehydrogenation can be lower than or equal to $5 \times 10^{19}$ cm$^{-3}$, preferably lower than or equal to $5 \times 10^{18}$ cm$^{-3}$.

Note that the heat treatment for dehydration or dehydrogenation may be performed at any timing in the manufacturing process of the transistor 420 as long as the heat treatment is performed after the formation of the oxide semiconductor film. The heat treatment for dehydration or dehydrogenation may be performed plural times and may also serve as another heat treatment. Note that in the case where an insulating film containing oxygen is provided as the insulating film 436, the heat treatment for dehydration or dehydrogenation is preferably performed before the oxide semiconductor film is processed into an island shape because oxygen contained in the insulating film 436 can be prevented from being released by the heat treatment.

In addition, after the oxide semiconductor film 403 is heated by the heat treatment, a high-purity oxygen gas, a high-purity dinitrogen monoxide gas, or ultra dry air may be introduced into the same furnace while the temperature of the heat treatment is kept or slowly cooled. It is preferable that water, hydrogen, or the like be not contained in the oxygen gas or the dinitrogen monoxide gas. Alternatively, the purity of the oxygen gas or the dinitrogen monoxide gas which is introduced into the heat treatment apparatus is preferably 6N or higher, more preferably 7N or higher (i.e., the impurity concentration in the oxygen gas or the dinitrogen monoxide gas is preferably 1 ppm or lower, more preferably 0.1 ppm or lower). The oxygen gas or the dinitrogen monoxide gas acts to supply oxygen that is a main constituent material of the oxide semiconductor and that is reduced by the step for removing impurities by dehydration or dehydrogenation, so that the oxide semiconductor film 403 can be a highly-purified, i-type (intrinsic) oxide semiconductor film.

Since there is a possibility that oxygen, which is a main component of an oxide semiconductor, is also released and reduced by dehydration or dehydrogenation treatment, oxygen (including at least one of an oxygen radical, an oxygen atom, and an oxygen ion) may be introduced to the oxide semiconductor film which has been subjected to the dehydration or dehydrogenation treatment to supply oxygen to the film.

In the case where oxygen is introduced into the oxide semiconductor film, oxygen may be directly introduced into the oxide semiconductor film or introduced into the oxide semiconductor film 403 through another film such as the gate insulating film 402 or the insulating film 407 formed later. In the case where oxygen is introduced into the oxide semiconductor film through another film, an ion implantation method, an ion doping method, a plasma immersion ion implantation method, or the like may be used. In the case where oxygen is directly introduced into the oxide semiconductor film 403, plasma treatment or the like can be used in addition to the above-described methods.

As a gas for supplying oxygen, a gas containing oxygen may be used. For example, an $O_2$ gas, an $N_2O$ gas, a $CO_2$ gas, a CO gas, or a $NO_2$ gas can be used. Note that a rare gas (e.g., argon) may be contained in a gas for supplying oxygen.

For example, in the case where an oxygen ion is introduced into the oxide semiconductor film 403 by an ion implantation method, the dosage can be greater than or equal to $1\times10^{13}$ ions/cm$^2$ and less than or equal to $5\times10^{16}$ ions/cm$^2$.

Alternatively, excessive oxygen contained in the insulating film may be diffused into the oxide semiconductor film 403 so that oxygen is supplied to the oxide semiconductor film 403 in the following manner: a film having oxygen-excess region is used as the insulating film in contact with the oxide semiconductor film 403; and heat treatment is performed in the state where the insulating film is in contact with the oxide semiconductor film 403. This heat treatment can serve as other heat treatment in the process for manufacturing the transistor 420.

The timing of supply of oxygen to the oxide semiconductor film is not particularly limited to the above as long as it is after the formation of the oxide semiconductor film. Oxygen may be introduced into the oxide semiconductor film plural times.

It is preferable that the oxide semiconductor film 403 be highly purified to contain few impurities such as copper, aluminum, and chlorine. In the process for manufacturing the transistor 420, it is preferable to select steps in which these impurities are not contained or attached to the surface of the oxide semiconductor film 403 as appropriate. In the case where the impurities are attached to the surface of the oxide semiconductor film 403, the impurities on the surface of the oxide semiconductor film 403 are preferably removed by exposure to oxalic acid or dilute hydrofluoric acid or plasma treatment (such as $N_2O$ plasma treatment). Specifically, the concentration of copper in the oxide semiconductor film 403 is lower than or equal to $1\times10^{18}$ cm$^{-3}$, preferably lower than or equal to $1\times10^{17}$ cm$^{-3}$. Furthermore, the concentration of aluminum in the oxide semiconductor film 403 is lower than or equal to $1\times10^{18}$ cm$^{-3}$. The concentration of chlorine in the oxide semiconductor film 403 is lower than or equal to $2\times10^{18}$ cm$^{-3}$.

The oxide semiconductor film 403 is preferably highly purified by sufficient removal of impurities such as hydrogen or by supersaturation with oxygen by sufficient supply of oxygen. Specifically, the hydrogen concentration in the oxide semiconductor film 403 is $5\times10^{19}$ cm$^{-3}$ or lower, preferably $5\times10^{18}$ cm$^{-3}$ or lower, more preferably $5\times10^{17}$ cm$^{-3}$ or lower.

Furthermore, it is preferable that impurities such as hydrogen be sufficiently removed from the insulating films (the insulating film 436 and the gate insulating film 402) in contact with the oxide semiconductor film 403. Specifically, hydrogen concentration in the insulating films in contact with the oxide semiconductor film 403 is preferably lower than $7.2\times10^{20}$ cm$^{-3}$.

Next, the gate insulating film 402 covering the oxide semiconductor film 403 is formed. In this embodiment, the gate insulating film 402 can be formed with a thickness greater than or equal to 1 nm and less than or equal to 20 nm by a sputtering method, an MBE method, a CVD method, a pulsed laser deposition method, an ALD method, or the like as appropriate.

To reduce impurities such as hydrogen (including water and a hydroxyl group) and make the gate insulating film 402 an oxygen-excess film, heat treatment (dehydration or dehydrogenation) to remove hydrogen (including water and a hydroxyl group) and/or oxygen doping treatment may be performed on the gate insulating film 402. The dehydration or dehydrogenation and the oxygen doping treatment each may be performed plural times, and may be combined and repeated.

Note that the gate insulating film 402 preferably has a stacked-layer structure including a first gate insulating film in contact with the oxide semiconductor film 403 and a second gate insulating film which is provided between the first gate insulating film and the gate electrode layer 401 to be formed later and which has a lower permeability to oxygen and hydrogen than the first gate insulating film. The first gate insulating film preferably functions as a supply source of oxygen to the oxide semiconductor film 403, and the first gate insulating film more preferably includes an oxygen-excess region. In the case where a film having a low permeability to oxygen and hydrogen is used as the second gate insulating film, oxygen can be prevented from desorbing from the oxide semiconductor film 403 and the first gate insulating film and hydrogen can be prevented from entering the oxide semiconductor film 403 and the first gate insulating film. An example of the insulating film having a low permeability to oxygen and hydrogen is an aluminum oxide film.

Then, a conductive film is formed over the gate insulating film 402 and then etched, so that the gate electrode layer 401 is formed.

Next, a dopant is introduced to the oxide semiconductor film 403 using the gate electrode layer 401 as a mask to form the source region 403a and the drain region 403b. Thus, the oxide semiconductor film 403 in which the pair of low-resistance regions is formed with the channel formation region 403c provided therebetween is formed by the introduction of the dopant.

As the method for introducing the dopant, an ion implantation method, an ion doping method, a plasma immersion ion implantation method, or the like can be used. In that case, it is preferable to use a single ion of the dopant, or a fluoride ion or chloride ion thereof.

The introduction of the dopant may be controlled by setting the implantation conditions such as the accelerated voltage and the dosage, or the thickness of a film through which the dopant passes as appropriate. Note that in this embodiment, a dopant is introduced so that the resistivity of the source region 403a and the drain region 403b after the introduction of the dopant is greater than or equal to $1.9 \times 10^{-5}$ Ω·m and less than or equal to $4.8 \times 10^{-3}$ am. The concentration of the dopant contained in the source region 403a and the drain region 403b is preferably greater than or equal to $1.3 \times 10^{19}$ cm$^{-3}$ and less than or equal to $1.6 \times 10^{20}$ cm$^{-3}$.

For example, in the case where the oxide semiconductor film 403 with a thickness of 30 nm is formed using an In—Ga—Zn-based oxide having an atomic ratio where In:Ga:Zn=3:1:2 (=1/2:1/6:1/3), when the source region 403a and the drain region 403b contain phosphorus (P) as a dopant at a concentration greater than or equal to $1.5 \times 10^{19}$ cm$^{-3}$ and less than or equal to $1.6 \times 10^{20}$ cm$^{-3}$, the resistivity of the regions can be greater than or equal to $1.9 \times 10^{-5}$ Ω·m and less than or equal to $7.8 \times 10^{-4}$ am. Alternatively, when the source region 403a and the drain region 403b contain boron (B) as a dopant at a concentration greater than or equal to $1.3 \times 10^{19}$ cm$^{-3}$ and less than or equal to $1.4 \times 10^{20}$ cm$^{-3}$, the resistivity of the regions can be greater than or equal to $2.0 \times 10^{-5}$ Ω·m and less than or equal to $4.8 \times 10^{-4}$ Ω·m. Alternatively, in the case where the oxide semiconductor film 403 with a thickness of 30 nm is formed using an In—Ga—Zn-based oxide having an atomic ratio where In:Ga:Zn=1:1:1 (=1/3:1/3:1/3), when the source region 403a and the drain region 403b contain phosphorus (P) as a dopant at a concentration greater than or equal to $1.5 \times 10^{19}$ cm$^{-3}$ and less than or equal to $1.6 \times 10^{20}$ cm$^{-3}$, the resistivity of the regions can be greater than or equal to $2.0 \times 10^{-4}$ Ω·m and less than or equal to $3.1 \times 10^{-3}$ Ω·m.

The substrate 400 may be heated in introducing the dopant.

The introduction of the dopant to the oxide semiconductor film 403 may be performed plural times, and plural kinds of dopants may be used.

After the introduction of the dopant, heat treatment may be performed. The heat treatment is preferably performed at a temperature higher than or equal to 300° C. and lower than or equal to 700° C., more preferably higher than or equal to 300° C. and lower than or equal to 450° C., for one hour under an oxygen atmosphere. The heat treatment may be performed under a nitrogen atmosphere, reduced pressure, or the air (ultra-dry air).

In the case where the oxide semiconductor film 403 is a CAAC-OS film, part of the oxide semiconductor film 403 becomes amorphous by introduction of the dopant in some cases. In that case, the crystallinity of the oxide semiconductor film 403 may be recovered by heat treatment after the introduction of the dopant.

A dense inorganic insulating film (typified by an aluminum oxide film) to be a protective insulating film is preferably provided over the oxide semiconductor film 403, the gate insulating film 402, and the gate electrode layer 401.

In this embodiment, the insulating film 407 is formed over the oxide semiconductor film 403, the gate insulating film 402, and the gate electrode layer 401.

The insulating film 407 may be a single-layer film or a stacked-layer film and preferably includes at least an aluminum oxide film.

The insulating film 407 can be formed by a plasma CVD method, a sputtering method, an evaporation method, or the like. Alternatively, as the insulating film 407, a metal oxide film obtained by performing oxidation treatment on a metal film may be used. For example, an aluminum oxide film obtained by performing oxygen doping treatment on an aluminum film may be used. The oxygen doping treatment on the metal film can serve as oxygen doping treatment on the oxide semiconductor film 403 or an insulating layer in contact with the oxide semiconductor film 403.

In this embodiment, an aluminum oxide film is formed by a sputtering method as the insulating film 407.

The interlayer insulating film 415 is formed over the insulating film 407. The interlayer insulating film 415 can be formed using the same material and method as the insulating film 407. In this embodiment, the interlayer insulating film 415 is formed to have a thickness large enough to planarize unevenness caused by the transistor 420. As the interlayer insulating film 415, a silicon oxynitride film formed by a CVD method or a silicon oxide film formed by a sputtering method can be used.

Furthermore, a planarization insulating film may be formed in order to reduce surface roughness due to the transistor.

Openings reaching the oxide semiconductor film 403 are formed in the interlayer insulating film 415, the insulating film 407, and the gate insulating film 402, and the source electrode layer 405a and the drain electrode layer 405b are formed in the openings. A variety of circuits can be formed by connection with another transistor or element with the use of the source electrode layer 405a and the drain electrode layer 405b.

Through the above steps, a semiconductor device including the transistor 420 of this embodiment can be manufactured.

In the transistor 420, the source electrode layer 405a and the drain electrode layer 405b are respectively in contact with the source region 403a and the drain region 403b which are high concentration impurity regions, so that contact resistance between the oxide semiconductor film 403 and the source electrode layer 405a and contact resistance between the oxide semiconductor film 403 and the drain electrode layer 405b can be reduced. Furthermore, the contact can be ohmic contact, which also enables the operation to be more thermostable than the operation in the case of a Schottky junction. Thus, the on-state current of the transistor can be increased and the transistor having excellent electric characteristics can be obtained.

Figure 18A:
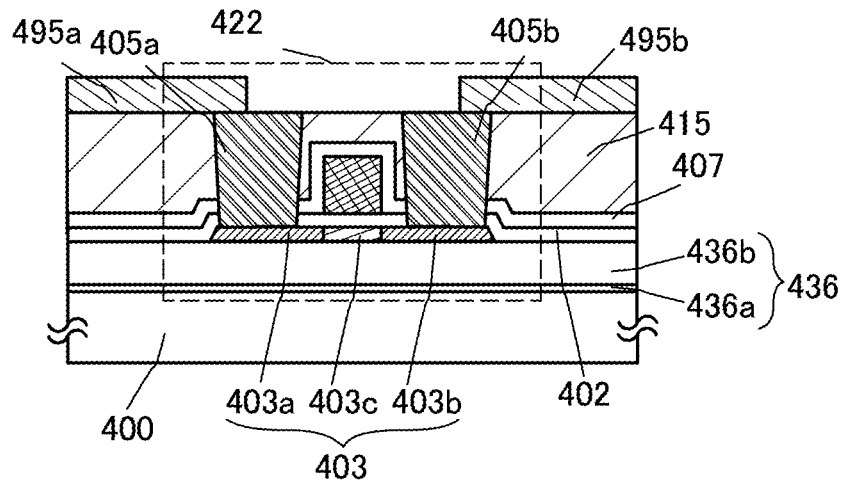
FIGS. 18A to 18C are cross-sectional views each illustrating one embodiment of a semiconductor device.
Figure 18B:
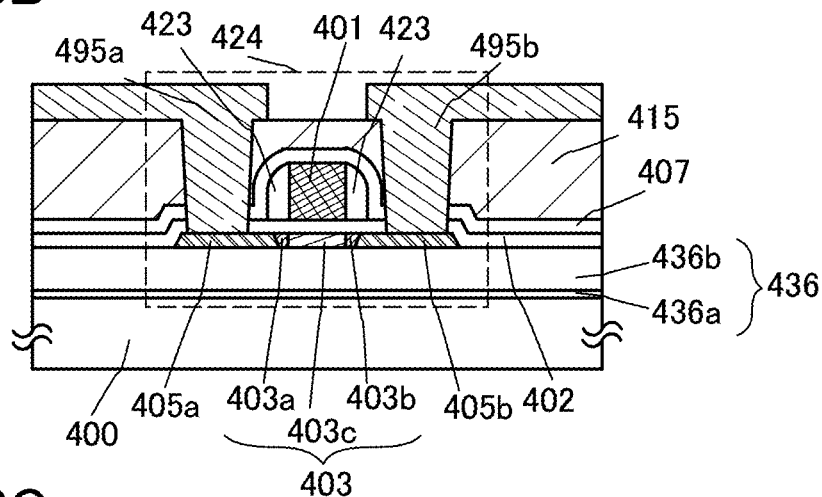
Figure 18C:
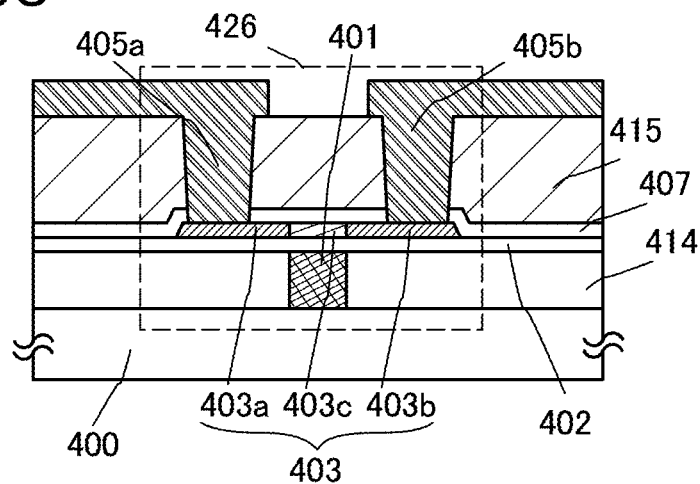
Figure 19A:
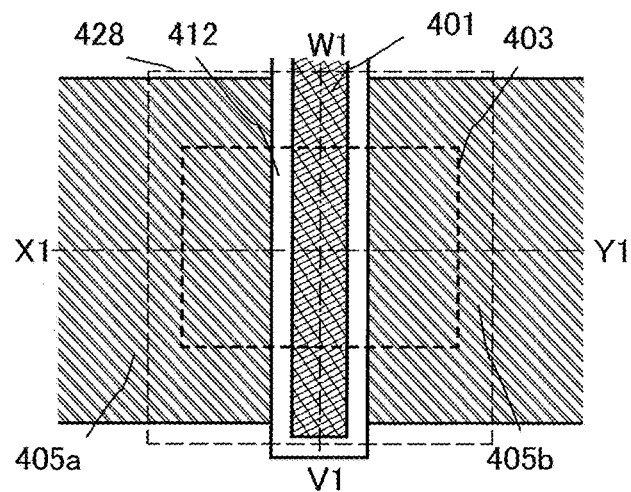
FIGS. 19A to 19C are a plan view and cross-sectional views illustrating one embodiment of a semiconductor device.
Figure 19C:
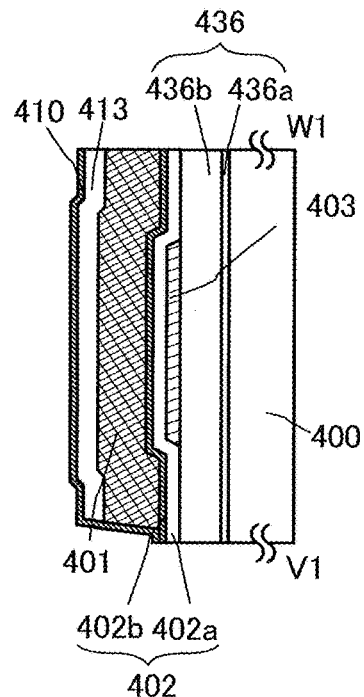
Figure 19B:
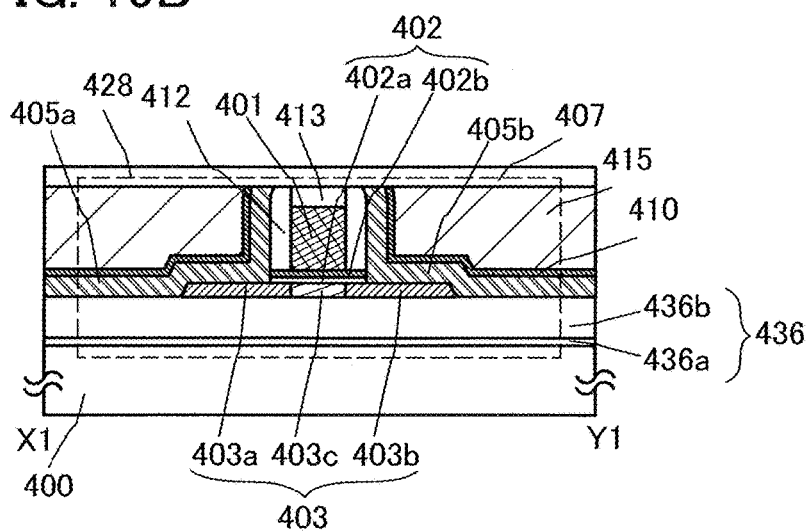
Figure 20A:
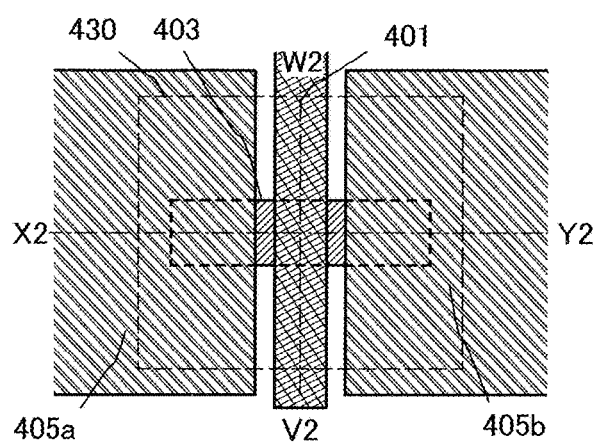
FIGS. 20A to 20C are a plan view and cross-sectional views illustrating one embodiment of a semiconductor device.
Figure 20C:
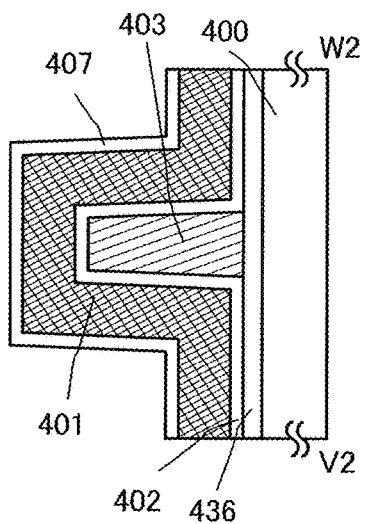
Figure 20B:
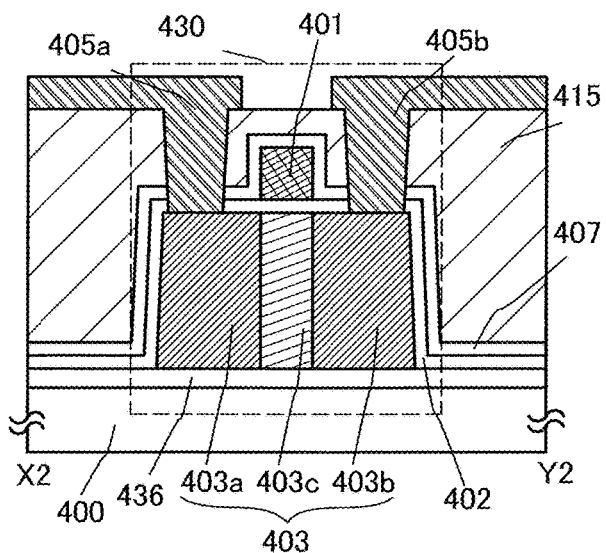

FIGS. 18A, 18B, and 18C illustrate transistors 422, 424, and 426, respectively, FIGS. 19A to 19C illustrate a transistor 428, and FIGS. 20A to 20C illustrate a transistor 430. Each of these transistors has a structure different from the above-described structures.

The transistor 422 illustrated in FIG. 18A is an example where wiring layers 495a and 495b are provided in contact with the source electrode layer 405a and the drain electrode layer 405b, respectively. The source electrode layer 405a and the drain electrode layer 405b are formed to be embedded in the interlayer insulating film 415, and surfaces thereof are exposed by polishing treatment. The wiring layers 495a and 495b are formed to be in contact with the exposed surfaces of the source electrode layer 405a and the drain electrode layer 405b so that electrical connection is established. An opening in which the source electrode layer 405a is to be formed and an opening in which the drain electrode layer 405b is to be formed may be formed in different steps. By forming the openings with different resist masks in different steps, the distance between the source electrode layer 405a and the drain electrode layer 405b can be shorter than a limit value of light exposure in a photolithography process. Thus, the electrical contact region between the source electrode layer 405a (or the drain electrode layer 405b) and the oxide semiconductor film 403 can be close to the gate electrode layer 401, whereby the resistance between the source and the drain can be reduced. Therefore, the electric characteristics of the transistor 422 (e.g., on-state characteristics) can be improved.

In the transistor 422, the wiring layers 495a and 495b are formed in the same photolithography process, so that the distance between the wiring layers 495a and 495b is longer than the distance between the source electrode layer 405a and the drain electrode layer 405b.

The transistor 424 illustrated in FIG. 18B is an example where sidewall layers 423 is provided on sidewalls of the gate electrode layer 401, and the source electrode layer 405a and the drain electrode layer 405b are in contact with side surfaces of the oxide semiconductor film 403 so that electrical connection is established. In the transistor 424, the electrical contact region between the source electrode layer 405a (or the drain electrode layer 405b) and the oxide semiconductor film 403 can be close to the gate electrode layer 401, which is effective in improving on-state characteristics.

In the process for manufacturing the transistor 424 illustrated in FIG. 18B, it is preferable that the source electrode layer 405a and the drain electrode layer 405b be formed, and then an oxide semiconductor film be formed thereover to fill a space between the source electrode layer 405a and the drain electrode layer 405b, and after that, the oxide semiconductor film be polished to expose the source electrode layer 405a and the drain electrode layer 405b. In this case, in the step of removing the region of the oxide semiconductor film overlapping with the source electrode layer 405a and the drain electrode layer 405b, etching treatment using a resist mask is not performed, so that precise processing can be accurately performed even in the case where the distance between the source electrode layer 405a and the drain electrode layer 405b is shortened.

Alternatively, the following may be performed: the island-shaped oxide semiconductor film 403 is formed; an conductive film is formed over the oxide semiconductor film 403; the conductive film is polished to expose the oxide semiconductor film 403 so that a region of the conductive film overlapping with the oxide semiconductor film 403 is removed; and the source electrode layer 405a and the drain electrode layer 405b are formed by a photolithography method or the like. In that case, an etching step using a resist mask is not performed in the step of removing the region of the conductive film overlapping with the oxide semiconductor film 403, so that precise processing can be performed accurately even when the channel length is shortened. Consequently, in the process for manufacturing the semiconductor device, the transistor having a miniaturized structure with less variation in shape or characteristics can be manufactured with high yield.

In the transistor 424 illustrated in FIG. 18B, an insulating material or a conductive material can be used for the sidewall layer 423. In the case where a conductive material is used, the sidewall layer 423 can serve as part of the gate electrode layer 401; accordingly, in the channel length direction, a region where the sidewall layers 423 overlaps with the source electrode layer 405a with the gate insulating film 402 interposed therebetween and a region where the sidewall layer 423 overlaps with the drain electrode layer 405b with the gate insulating film 402 interposed therebetween can be regions (Lov regions) where the gate electrode layer overlaps with the source electrode layer and the drain electrode layer with the gate insulating film interposed therebetween. The width of the Lov region can be controlled by adjusting widths of the conductive sidewall layers 423 provided on the side surfaces of the gate electrode layer 401 in a self-aligned manner, whereby a minute Lov region can be formed with high accuracy. Thus, an Lov region can be provided while a shortened channel length is maintained, so that the transistor 424 with a miniaturized structure in which decrease in on-state current is suppressed can be provided.

The transistor 426 illustrated in FIG. 18C has a bottom-gate structure, in which the gate electrode layer 401 formed to be embedded in an insulating film 414, the gate insulating film 402 formed over the insulating film 414 and the gate electrode layer 401, the oxide semiconductor film 403 over the gate insulating film 402, the insulating film 407 and the interlayer insulating film 415 over the oxide semiconductor film 403 are stacked in this order over the substrate 400 having an insulating surface, and the source electrode layer 405a and the drain electrode layer 405b are provided in openings formed in the insulating film 407 and the interlayer insulating film 415 so as to reach the oxide semiconductor film 403.

A base insulating film film may be provided between the substrate 400 and the gate electrode layer 401. With the gate electrode layer 401 formed to be embedded in the insulating film 414 as in the transistor 426, the gate insulating film 402, the oxide semiconductor film 403, and the like formed over the gate electrode layer 401 can be formed on a flat surface without a defect in shape. Therefore, a highly reliable transistor can be manufactured with high yield.

Note that in the case where an impurity is introduced to the oxide semiconductor film 403 to form the source region 403a and the drain region 403b in the transistor 426, a mask may be formed over the oxide semiconductor film 403 for the introduction of an impurity, or an impurity may be introduced from the bottom surface of the substrate 400 using the gate electrode layer 401 as a mask to form the source region 403a and the drain region 403b in a self-aligned manner. In the case where a mask is formed over the oxide semiconductor film 403 and an impurity is introduced using the mask, a side surface of the gate electrode layer 401 and a side surface of the channel formation region 403c (or the width of the gate electrode layer 401 and the width of the channel formation region 403c in the channel length direction) are not always aligned.

The transistor 428 illustrated in FIGS. 19A to 19C is an example of a top-gate transistor. FIG. 19A is a plan view of the transistor 428, FIG. 19B is a cross-sectional view taken along X1-Y1 in FIG. 19A, and FIG. 19C is a cross-sectional view taken along V1-W1 in FIG. 19A. Note that in FIG. 19A, some components of the transistor 428 are not illustrated in order to avoid complexity.

As illustrated in FIG. 19B which is a cross-sectional view in the channel length direction, a semiconductor device including the transistor 428 includes, over the substrate 400 having an insulation surface over which the insulating film 436 having a stacked-layer structure including the insulating film 436a and the insulating film 436b is provided, the oxide semiconductor film 403 having the channel formation region 403c and the source region 403a and the drain region 403b, the source electrode layer 405a, the drain electrode layer 405b, the gate insulating film 402 having a stacked-layer structure including the gate insulating film 402a and the gate insulating film 402b, the gate electrode layer 401, sidewall insulating layers 412 provided in contact with side surfaces of the gate electrode layer 401, an insulating film 413 provided over the gate electrode layer 401, an insulating film 410 and an interlayer insulating film 415 provided over the source electrode layer 405a and the drain electrode layer 405b, and the insulating film 407 covering the transistor 428.

This embodiment shows an example where a top surface of the interlayer insulating film 415 is substantially aligned with a top surface of the sidewall insulating layers 412, and top surfaces of the source electrode layer 405a and the drain electrode layer 405b are substantially aligned with top surfaces of the insulating film 413 and the sidewall insulating layers 412. Note that the shapes of the source electrode layer 405a and the drain electrode layer 405b are determined by conditions for polishing treatment of a conductive film to be the source electrode layer 405a and the drain electrode layer 405b in the manufacturing process. Therefore, the top surfaces of the source electrode layer 405a and the drain electrode layer 405b are lower than the top surfaces of the interlayer insulating film 415, the sidewall insulating layers 412, and the insulating film 413, and higher than the top surface of the gate electrode layer 401 in some cases depending on the conditions.

In FIGS. 19A to 19C, the insulating film 407 is provided in contact with the interlayer insulating film 415, the insulating film 410, the source electrode layer 405a, the drain electrode layer 405b, the sidewall insulating layers 412, and the insulating film 413.

The insulating film 413, the insulating film 410 and the sidewall insulating layers 412 each may be a single layer or a stacked layer, and typically, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be used. The insulating film 413 can be formed by a CVD method, a sputtering method, or the like. As a CVD method, an LPCVD method, a plasma CVD method, or the like can be used, and as another method, a coating film or the like can be used.

In the transistor 428, to reduce impurities such as hydrogen (including water and a hydroxyl group) and make the insulating film 436, the gate insulating films 402a and 402b, the insulating film 413, and the sidewall insulating layers 412 oxygen-excess films, heat treatment (dehydration or dehydrogenation) to remove hydrogen (including water and a hydroxyl group) and/or oxygen doping treatment may be performed on the insulating film 436, the gate insulating films 402a and 402b, the insulating film 413, and the sidewall insulating layers 412. The dehydration or dehydrogenation and the oxygen doping treatment each may be performed plural times, and may be combined and repeated.

In the transistor 428, an aluminum oxide film is preferably used as each of the gate insulating film 402b and the insulating film 410. With the use of an aluminum oxide film having a high shielding effect (blocking effect) of preventing penetration of oxygen and impurities such as hydrogen and moisture, the gate insulating film 402b and the insulating film 410 can function as barrier layers of preventing oxygen from being released from the gate insulating film 402a and the insulating film 436 which are in contact with the oxide semiconductor film 403 and which are each an oxide insulating film (e.g., a silicon oxide film or a silicon oxynitride film) in an oxygen excess state.

Accordingly, the gate insulating film 402b and the insulating film 410 can prevent impurities such as hydrogen and moisture, which cause variations in electronic characteristics of the transistor, from entering the oxide semiconductor film 403 during and after the manufacturing process, can keep the oxygen excess state of the gate insulating film 402a and the insulating film 436, and can promote supply of oxygen to the oxide semiconductor film. Thus, the gate insulating film 402b functioning as a barrier layer can suppress or prevent generation of a parasitic channel in the transistor 428.

It is preferable that the insulating film 436 have a stacked-layer structure where an inorganic insulating film (e.g., a silicon nitride film, a silicon nitride oxide film, or an aluminum oxide film) having a high shielding effect of an impurity from the substrate 400 is used as a film in contact with the substrate 400, and an oxygen-excess oxide insulating film (e.g., a silicon oxide film or a silicon oxynitride film) is used as a film in contact with the oxide semiconductor film 403.

In this embodiment, a silicon nitride film is provided as the insulating film 436a, and a silicon oxide film having an oxygen-excess region is provided as the insulating film 436b.

In the manufacturing process of the transistor 428, the conductive film provided over the gate electrode layer 401, the insulating film 413, and the sidewall insulating layer 412 is removed by chemical mechanical polishing treatment, so that the conductive film is divided to form the source electrode layer 405a and the drain electrode layer 405b.

The source electrode layer 405a and the drain electrode layer 405b are provided in contact with the exposed portion of a top surface of the oxide semiconductor film 403 and the sidewall insulating layer 412. The distance between the gate electrode layer 401 and a region (contact region) in which the oxide semiconductor film 403 is in contact with the source electrode layer 405a or the drain electrode layer 405b corresponds to a width of the sidewall insulating layer 412 in the channel length direction, whereby the further miniaturization can be achieved and variations in the manufacturing process can be prevented.

Accordingly, the distance between the gate electrode layer 401 and the region (contact region) in which the oxide semiconductor film 403 is in contact with the source electrode layer 405a or the drain electrode layer 405b can be made short, so that the resistance between the gate electrode layer 401 and the region (contact region) in which the oxide semiconductor film 403 is in contact with the source electrode layer 405a or the drain electrode layer 405b is reduced; thus, the on-state characteristics of the transistor 428 can be improved.

Furthermore, precise processing can be performed accurately because an etching step using a resist mask is not performed in a step for removing the conductive film over the gate electrode layer 401, which is one step of the formation process of the source electrode layer 405a and the drain electrode layer 405b. Consequently, in the process for manufacturing the semiconductor device, the transistor 428 having a miniaturized structure with less variation in shape or characteristics can be manufactured with high yield.

Note that in the step of removing the conductive film over the gate electrode layer 401 in the formation process of the source electrode layer 405a and the drain electrode layer 405b, part or all of the insulating film 413 may be removed. In the transistor 428, a top surface of the insulating film 410 is also planarized by the cutting (grinding or polishing) step in the formation process of the source electrode layer 405a and the drain electrode layer 405b.

Note that this embodiment is not limited to this. After the formation of the conductive film to be the source electrode layer 405a and the drain electrode layer 405b, the conductive film may be patterned into the source electrode layer 405a and the drain electrode layer 405b using a resist mask. In this case, the insulating film 410 and the interlayer insulating film 415 can be formed after the formation of the source electrode layer 405a and the drain electrode layer 405b, so that a region overlapping with the gate electrode layer 401 can also be covered with the insulating film 410.

The transistor 430 illustrated in FIGS. 20A to 20C is an example of a top-gate transistor. FIG. 20A is a plan view of the transistor 430, FIG. 20B is a cross-sectional view taken along X2-Y2 in FIG. 20A, and FIG. 20C is a cross-sectional view taken along V2-W2 in FIG. 20A. Note that in FIG. 20A, some components of the transistor 430 are not illustrated in order to avoid complexity.

The transistor 430 is a fin-type transistor, in which the thickness of the oxide semiconductor film 403 is larger than the length of the oxide semiconductor film 403 in the channel width direction (preferably, the thickness of the oxide semiconductor film 403 is twice or more the length of the oxide semiconductor film 403 in the channel width direction). By empoying a fin-type structure, the channel width can be increased without increase in an area of the transistor. The increase in the channel width leads to improvement in the current drive capability.

As described above, in the semiconductor device of this embodiment, each of the transistors 420, 422, 424, 426, 428, and 430 exhibits excellent electric characteristics as a switching element, in which a short-channel effect does not occur or hardly occurs even when the channel length is shortened.

Therefore, a semiconductor device which is miniaturized and has stable and excellent electric characteristics and a method for manufacturing the semiconductor device can be provided.

Embodiment 3

In this embodiment, an example of a semiconductor device which includes the transistor described in this specification, which can hold stored data even when not powered, and which does not have a limitation on the number of write cycles, will be described with reference to drawings.

Figure 5A:
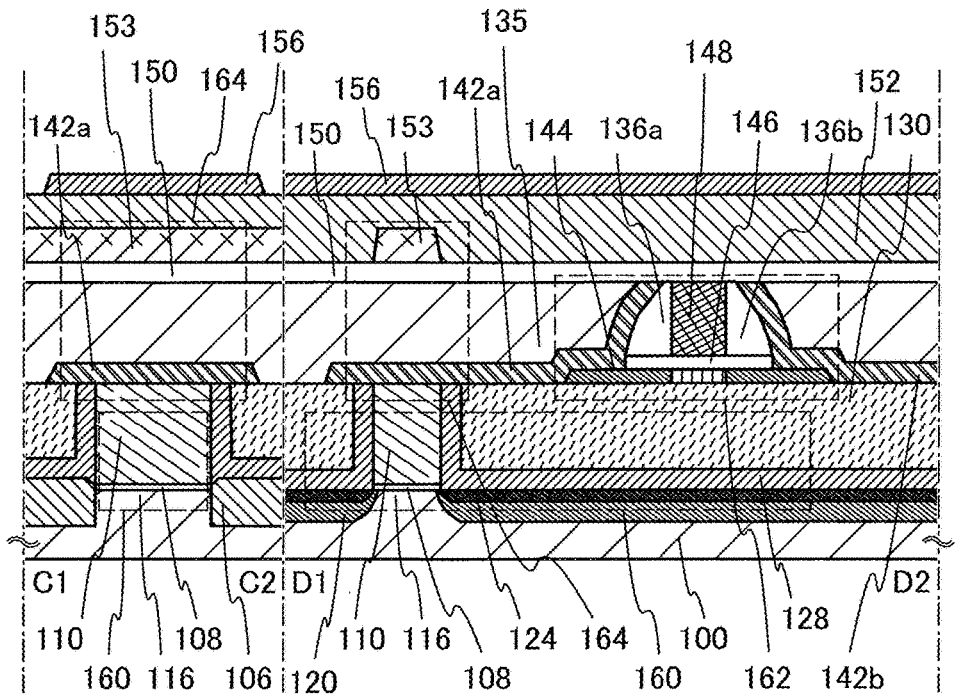
FIGS. 5A to 5C are a cross-sectional view, a plan view, and a circuit diagram illustrating one embodiment of a semiconductor device.
Figure 5B:
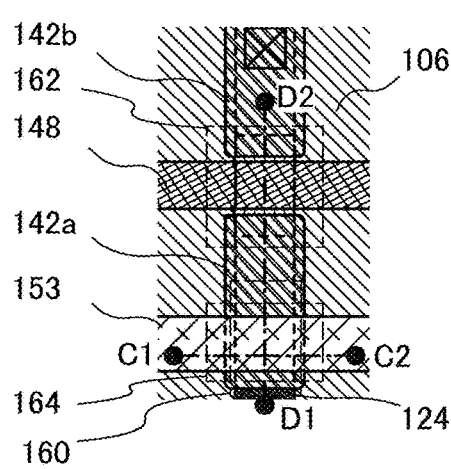
Figure 5C:
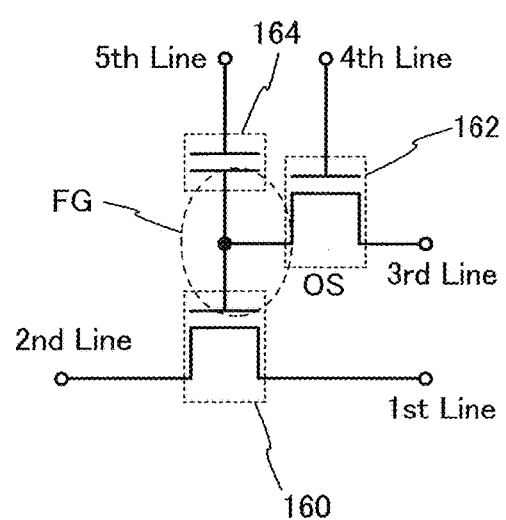

FIGS. 5A to 5C illustrate an example of the structure of a semiconductor device. FIGS. 5A to 5C illustrate a cross-sectional view, a plan view, and a circuit diagram, respectively, of the semiconductor device. Here, FIG. 5A corresponds to cross sections taken along line C1-C2 and line D1-D2 in FIG. 5B.

The semiconductor device illustrated in FIGS. 5A and 5B includes a transistor 160 including a first semiconductor material in a lower portion, and a transistor 162 including a second semiconductor material in an upper portion. The transistor according to one embodiment of the present invention, which is described in Embodiment 1 or 2, can be applied to the transistor 162. This embodiment shows an example where the transistor 162 has a structure similar to the transistor 440e in Embodiment 1.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor enables charge to be held for a long time owing to its characteristics.

Although the above-described transistors are n-channel transistors here, it is needless to say that p-channel transistors can be used. The specific constituent of the semiconductor device is not necessarily limited to those described here such as the material used for the semiconductor device and the structure of the semiconductor device (e.g., the use of the transistor described in Embodiment 1 or 2, which is formed using an oxide semiconductor, as the transistor 162 for holding information).

The transistor 160 in FIG. 5A includes a channel formation region 116 provided in a substrate 100 including a semiconductor material (e.g., silicon), impurity regions 120 provided such that the channel formation region 116 is sandwiched therebetween, intermetallic compound regions 124 in contact with the impurity regions 120, a gate insulating film 108 provided over the channel formation region 116, and a gate electrode 110 provided over the gate insulating film 108. Note that a transistor whose source electrode and drain electrode are not illustrated in a drawing may be referred to as a transistor for the sake of convenience. Furthermore, in such a case, in description of a connection of a transistor, a source region and a source electrode are collectively referred to as a "source electrode," and a drain region and a drain electrode are collectively referred to as a "drain electrode". That is, in this specification, the term "source electrode" may include a source region.

An element isolation insulating layer 106 is provided over the substrate 100 to surround the transistor 160. An insulating layer 128 and an insulating layer 130 are provided to cover the transistor 160. Note that in the transistor 160, the sidewall insulating layer may be formed on a side surface of the gate electrode 110 and the impurity regions 120 may include a region having different impurity concentrations.

The transistor 160 formed using a single crystal semiconductor substrate can operate at high speed. Thus, when the transistor is used as a reading transistor, data can be read at a high speed. Two insulating films are formed so as to cover the transistor 160. As treatment prior to formation of the transistor 162 and a capacitor 164, CMP treatment is performed on the two insulating films so that the insulating layer 128 and the insulating layer 130 are formed to be planarized and an upper surface of the gate electrode 110 is exposed.

As each of the insulating layer 128 and the insulating layer 130, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be used typically. The insulating layer 128 and the insulating layer 130 can be formed by a plasma CVD method, a sputtering method, or the like.

Alternatively, an organic material such as polyimide, an acrylic resin, or a benzocyclobutene resin can be used. Other than such organic materials, it is also possible to use a low-dielectric constant material (a low-k material) or the like. In the case of using an organic material, a wet process such as a spin coating method or a printing method may be used to form the insulating layer 128 and the insulating layer 130.

Note that in this embodiment, a silicon nitride film is used as the insulating layer 128, and a silicon oxide layer is used as the insulating layer 130.

A region on the surface of the insulating layer 130 where the oxide semiconductor film 144 is to be formed is preferably subjected to planarization treatment. In this embodiment, the oxide semiconductor film 144 is formed over the insulating layer 130 which is sufficiently planarized by polishing treatment (e.g., CMP treatment). The average surface roughness of the insulating layer 130 is preferably less than or equal to 0.15 nm.

The transistor 162 illustrated in FIG. 5A includes an oxide semiconductor in the channel formation region. Here, the oxide semiconductor film 144 included in the transistor 162 is preferably highly purified. By using a highly purified oxide semiconductor, the transistor 162 which has extremely favorable off-state current characteristics can be obtained.

In the transistor 162, the channel length is short (greater than or equal to 5 nm and less than 60 nm, preferably greater than or equal to 10 nm and less than or equal to 40 nm), and the thickness of the gate insulating film 146 is greater than or equal to 5 nm and less than or equal to 50 nm, preferably greater than or equal to 10 nm and less than or equal to 40 nm at an equivalent oxide thickness which is obtained by converting into a thickness of silicon oxide containing nitrogen. Alternatively, the transistor 162 has a single drain structure, in which the channel length is short (greater than or equal to 5 nm and less than 60 nm, preferably greater than or equal to 10 nm and less than or equal to 40 nm), and the resistivity of the source region and the drain region is greater than or equal to $1.9 \times 10^{-5}$ $\Omega \cdot m$ and less than or equal to $4.8 \times 10^{-3}$ $\Omega \cdot m$. The transistor 162 exhibits excellent electric characteristics as a switching element, in which a short-channel effect does not occur or hardly occurs.

Since the off-state current of the transistor 162 is small, stored data can be held for a long time by using such a transistor. In other words, power consumption can be sufficiently reduced because a semiconductor device in which refresh operation is unnecessary or the frequency of refresh operation is extremely low can be provided.

In the manufacturing process of the transistor 162, a conductive film provided over a gate electrode 148 and sidewall insulating layers 136a and 136b is removed by chemical mechanical polishing treatment, whereby electrode layers 142a and 142b which function as a source electrode layer and a drain electrode layer are formed. The electrode layers 142a and 142b are in contact with side surfaces of the sidewall insulating layers 136a and 136b and the oxide semiconductor film 144.

By using a film containing an aluminum oxide as the sidewall insulating layers 136a and 136b, release of oxygen and entry of an impurity such as hydrogen can be suppressed.

Accordingly, in the transistor 162, the distance between the gate electrode 148 and a region (contact region) in which the oxide semiconductor film 144 is in contact with the electrode layer 142a or the electrode layer 142b which functions as a source electrode layer or a drain electrode layer can be made short, so that the resistance between the gate electrode 148 and the region (contact region) in which the oxide semiconductor film 144 is in contact with the electrode layer 142a or the electrode layer 142b is reduced; thus, the on-state characteristics of the transistor 162 can be improved.

Furthermore, precise processing can be performed accurately because an etching step using a resist mask is not performed in a step for removing the conductive film over the gate electrode 148, which is one step of the formation process of the electrode layers 142a and 142b. Consequently, in the process for manufacturing the semiconductor device, the transistor having a miniaturized structure with less variation in shape or characteristics can be manufactured with high yield.

An interlayer insulating film 135 and an insulating film 150 each having a single-layer structure or a stacked-layer structure are provided over the transistor 162. In this embodiment, an aluminum oxide film is used as the insulating film 150. The density of the aluminum oxide film is made to be high (the film density is higher than or equal to 3.2 g/cm$^{-3}$, preferably higher than or equal to 3.6 g/cm$^{-3}$), whereby stable electrical characteristics can be given to the transistor 162.

In addition, a conductive layer 153 is provided in a region overlapping with the electrode layer 142a of the transistor 162 with the interlayer insulating film 135 and the insulating film 150 provided therebetween, and the electrode layer 142a, the interlayer insulating film 135, the insulating film 150, and the conductive layer 153 form a capacitor 164. That is, the electrode layer 142a of the transistor 162 functions as one electrode of the capacitor 164, and the conductive layer 153 functions as the other electrode of the capacitor 164. Note that the capacitor 164 may be omitted if a capacitor is not needed. Alternatively, the capacitor 164 may be separately provided above the transistor 162.

The insulating film 152 is provided over the transistor 162 and the capacitor 164. Furthermore, a wiring 156 for connecting the transistor 162 to another transistor is provided over the insulating film 152. Although not illustrated in FIG. 5A, the wiring 156 is electrically connected to the electrode layer 142b through an electrode formed in an opening provided in the insulating film 150, the insulating film 152, a gate insulating film 146, and the like. Here, the electrode is preferably provided so as to partly overlap with at least the oxide semiconductor film 144 of the transistor 162.

In FIGS. 5A and 5B, the transistor 160 and the transistor 162 are provided so as to at least partly overlap with each other. The source region or the drain region of the transistor 160 is preferably provided so as to overlap with part of the oxide semiconductor film 144. Furthermore, the transistor 162 and the capacitor 164 are provided so as to overlap with at least part of the transistor 160. For example, the conductive layer 153 of the capacitor 164 is provided so as to overlap with at least part of the gate electrode 110 of the transistor 160. With such a planar layout, the area occupied by the semiconductor device can be reduced; thus, higher integration can be achieved.

Note that the electrical connection between the electrode layer 142b and the wiring 156 may be established by direct contact of the electrode layer 142b and the wiring 156 with each other or through an electrode provided in an insulating film lying between the electrode layer 142b and the wiring 156. Alternatively, the electrical connection may be established through a plurality of electrodes.

Next, an example of a circuit configuration corresponding to FIGS. 5A and 5B is illustrated in FIG. 5C.

In FIG. 5C, a first wiring (1st line) is electrically connected to a source electrode of the transistor 160. A second wiring (2nd line) is electrically connected to a drain electrode of the transistor 160. A third wiring (3rd line) is electrically connected to one of a source electrode and a drain electrode of the transistor 162, and a fourth wiring (4th line) is electrically connected to a gate electrode of the transistor 162. A gate electrode of the transistor 160 and the one of the source electrode and the drain electrode of the transistor 162 are electrically connected to one electrode of the capacitor 164. A fifth line (5th line) is electrically connected to the other electrode of the capacitor 164.

The semiconductor device in FIG. 5C utilizes a characteristic in which the potential of the gate electrode of the transistor 160 can be held, and can thus write, hold, and read data as follows.

Writing and holding of data is described. First, the potential of the fourth line is set to a potential at which the transistor 162 is turned on, so that the transistor 162 is turned on. Accordingly, the potential of the third line is supplied to the gate electrode of the transistor 160 and the capacitor 164.

That is, predetermined charge is given to the gate electrode of the transistor 160 (writing). Here, charge for supply of a potential level or charge for supply of a different potential level (hereinafter referred to as Low level charge and High level charge) is given. After that, the potential of the fourth line is set to a potential at which the transistor 162 is turned off, so that the transistor 162 is turned off. Thus, the charge given to the gate electrode of the transistor 160 is held (holding).

Since the off-state current of the transistor 162 is extremely low, the charge of the gate electrode of the transistor 160 is held for a long time.

Next, reading of data is described. By supplying an appropriate potential (reading potential) to the fifth line while a predetermined potential (constant potential) is supplied to the first line, the potential of the second line varies depending on the amount of charge held in the gate electrode of the transistor 160. This is because in general, when the transistor 160 is an n-channel transistor, an apparent threshold voltage $V_{th\_H}$ in the case where a high-level charge is given to the gate electrode of the transistor 160 is lower than an apparent threshold voltage $V_{th\_L}$, in the case where a low-level charge is given to the gate electrode of the transistor 160. Here, an apparent threshold voltage refers to the potential of the fifth line, which is needed to turn on the transistor 160. Thus, the potential of the fifth line is set to a potential $V_0$ that is between $V_{th\_H}$ and $V_{th\_H}$, whereby charge given to the gate electrode of the transistor 160 can be determined. For example, in the case where a high-level charge is given in writing, when the potential of the fifth wiring is set to $V_0$ ($>V_{th\_H}$), the transistor 160 is turned on. In the case where a low level charge is given in writing, even when the potential of the fifth wiring is set to $V_0$ ($<V_{th\_L}$), the transistor 160 remains in an off state. Therefore, the data held can be read by the potential of the second line.

Note that in the case where memory cells are arrayed to be used, only data of desired memory cells needs to be read. In the case where such reading is not performed, a potential at which the transistor 160 is turned off regardless of the state of the gate electrode of the transistor 160, that is, a potential smaller than $V_{th\_H}$ may be given to the fifth wiring. Alternatively, a potential which allows the transistor 160 to be turned on regardless of a state of the gate electrode, that is, a potential higher than $V_{th\_L}$ may be applied to the fifth line.

When a transistor having a channel formation region formed using an oxide semiconductor and having extremely small off-state current is applied to the semiconductor device in this embodiment, the semiconductor device can hold stored data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Furthermore, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem such as deterioration of a gate insulating film does not occur at all. In other words, the semiconductor device according to one embodiment of the present invention does not have a limit on the number of times of writing which is a problem in a conventional non-volatile memory, and reliability thereof is drastically improved. Furthermore, data is written depending on the on state and the off state of the transistor, whereby high-speed operation can be easily realized.

As described above, a miniaturized and highly-integrated semiconductor device having stable and excellent electric characteristics and a method for manufacturing the semiconductor device can be provided.

The methods and structures described in this embodiment can be combined as appropriate with any of the methods and structures described in the other embodiments.

Embodiment 4

In this embodiment, a semiconductor device which includes the transistor described in Embodiment 1 or 2, can hold stored data even when not powered, does not have a limitation on the number of write cycles, and has a structure different from the structure described in Embodiment 3 is described with reference to FIGS. 6A and 6B and FIGS. 7A and 7B.

Figure 6A:
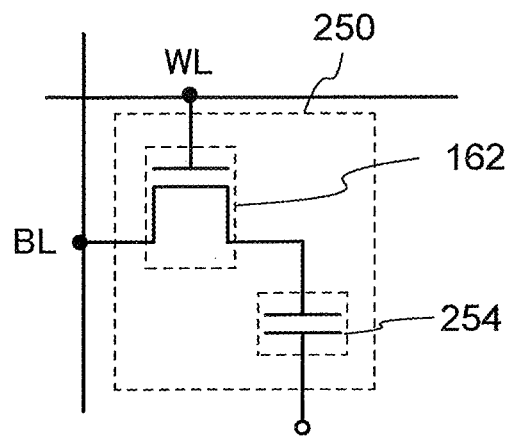
FIGS. 6A and 6B are a circuit diagram and a perspective view illustrating one embodiment of a semiconductor device.
Figure 6B:
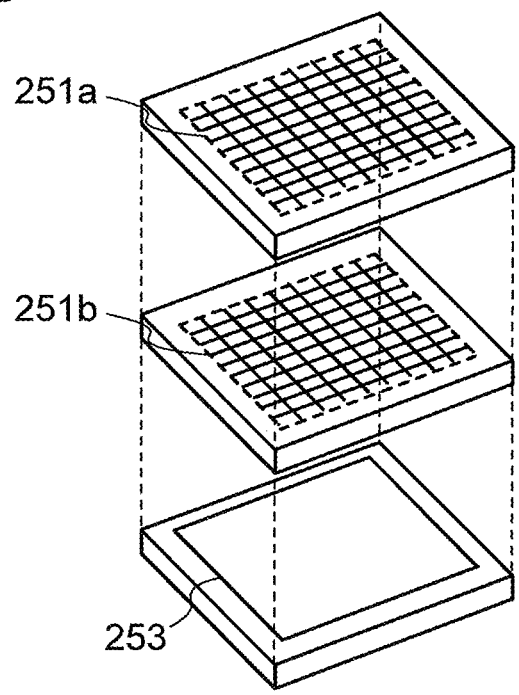

FIG. 6A illustrates an example of a circuit configuration of a semiconductor device, and FIG. 6B is a conceptual diagram illustrating an example of a semiconductor device. First, the semiconductor device illustrated in FIG. 6A is described, and then, the semiconductor device illustrated in FIG. 6B is described.

In the semiconductor device illustrated in FIG. 6A, a bit line BL is electrically connected to a source electrode or a drain electrode of a transistor 162, a word line WL is electrically connected to a gate electrode of the transistor 162, and the source electrode or the drain electrode of the transistor 162 is electrically connected to a first terminal of a capacitor 254.

Next, writing and holding of data in the semiconductor device (a memory cell 250) illustrated in FIG. 6A will be described.

First, the potential of the word line WL is set to a potential at which the transistor 162 is turned on, so that the transistor 162 is turned on. Accordingly, the potential of the bit line BL is supplied to the first terminal of the capacitor 254 (writing). After that, the potential of the word line WL is set to a potential at which the transistor 162 is turned off, so that the transistor 162 is turned off. Thus, the potential of the first terminal of the capacitor 254 is held (holding).

Off current is extremely small in the transistor 162 formed using an oxide semiconductor. For that reason, the potential of the first terminal of the capacitor 254 (or a charge accumulated in the capacitor 254) can be held for an extremely long period by turning off the transistor 162.

Next, reading of data is described. When the transistor 162 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL obtained after charge redistribution is (CB*VB0+C*V)/(CB+C), where V is the potential of the first terminal of the capacitor 254, C is the capacitance of the capacitor 254, CB is the capacitance of the bit line BL (hereinafter also referred to as bit line capacitance), and VB0 is the potential of the bit line BL obtained before the charge redistribution. Therefore, it can be found that the potential of the bit line BL, in the case of holding the potential V1, (=(CB*VB0+C*V1)/(CB+C)) is higher than the potential of the bit line BL, in the case of holding the potential V0, (=(CB*VB0+C*V0)/(CB+C)) assuming that the memory cell 250 is in either of two states in which the potentials of the first terminal of the capacitor 254 are V1 and V0 (V1>V0).

Then, by comparing the potential of the bit line BL with a predetermined potential, data can be read.

As described above, the semiconductor device illustrated in FIG. 6A can hold charge that is accumulated in the capacitor 254 for a long time because the off-state current of the transistor 162 is extremely small. In other words, power consumption can be adequately reduced because refresh operation becomes unnecessary or the frequency of refresh operation can be extremely low. Moreover, stored data can be held for a long time even when power is not supplied.

Next, the semiconductor device illustrated in FIG. 6B is described.

The semiconductor device illustrated in FIG. 6B includes memory cell arrays 251a and 251b including a plurality of memory cells 250 illustrated in FIG. 6A as memory circuits in an upper portion, and a peripheral circuit 253 in a lower portion which is necessary for operating the memory cell arrays 251a and 251b. Note that the peripheral circuit 253 is electrically connected to the memory cell arrays 251a and 251b.

In the structure illustrated in FIG. 6B, the peripheral circuit 253 can be provided directly under the memory cell arrays 251a and 251b. Thus, the size of the semiconductor device can be decreased.

It is preferable that a semiconductor material of the transistor provided in the peripheral circuit 253 is different from that of the transistor 162. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which needs to operate at high speed can be favorably achieved by using the transistor.

Note that FIG. 6B illustrates, as an example, the semiconductor device in which two memory cell arrays 251a and 251b are stacked; however, the number of memory cell arrays to be stacked is not limited thereto. Three or more memory cell arrays may be stacked.

Next, a specific structure of the memory cell 250 illustrated in FIG. 6A is described with reference to FIGS. 7A and 7B.

Figure 7A:
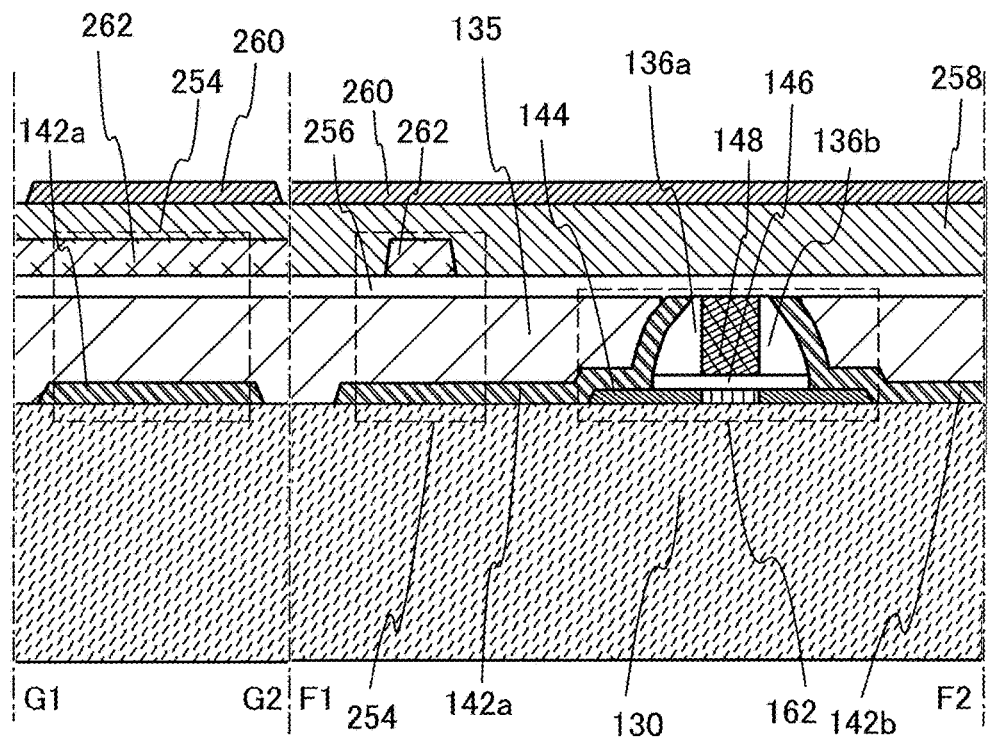
FIGS. 7A and 7B are a cross-sectional view and a plan view illustrating one embodiment of a semiconductor device.
Figure 7B:
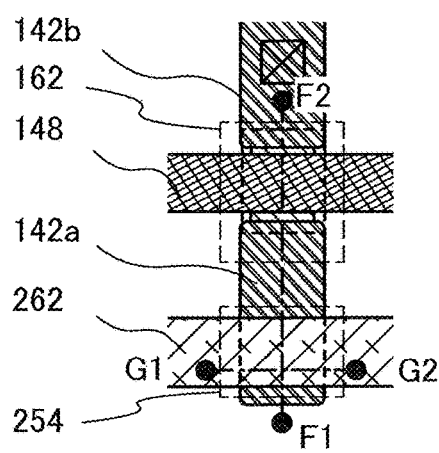

FIGS. 7A and 7B illustrate an example of the structure of the memory cell 250. FIG. 7A is a cross-sectional view of the memory cell 250. FIG. 7B is a plan view of the memory cell 250. Here, FIG. 7A corresponds to a cross-section taken along F1-F2 and G1-G2 in FIG. 7B.

The transistor 162 illustrated in FIGS. 7A and 7B can have a structure similar to the structure described in Embodiment 1 or 2.

An insulating film 256 having a single-layer structure or a stacked-layer structure is provided over the transistor 162 over the insulating layer 130. In addition, a conductive layer 262 is provided in a region overlapping with the electrode layer 142a of the transistor 162 with the insulating film 256 interposed therebetween, and the electrode layer 142a, the interlayer insulating film 135, the insulating film 256, and the conductive layer 262 form a capacitor 254. That is, the electrode layer 142a of the transistor 162 functions as one electrode of the capacitor 254, and the conductive layer 262 functions as the other electrode of the capacitor 254.

An insulating film 258 is provided over the transistor 162 and the capacitor 254. Furthermore, a wiring 260 for connecting the memory cell 250 to an adjacent memory cell 250 is provided over the insulating film 258. Although not illustrated, the wiring 260 is electrically connected to the electrode layer 142b of the transistor 162 through an opening provided in the insulating film 256, the insulating film 258, and the like. The wiring 260 may be electrically connected to the electrode layer 142b through another conductive layer provided in the opening. Note that the wiring 260 corresponds to the bit line BL in the circuit diagram of FIG. 6A.

In FIGS. 7A and 7B, the electrode layer 142b of the transistor 162 can also function as a source electrode of a transistor included in an adjacent memory cell. With such a planar layout, the area occupied by the semiconductor device can be reduced; thus, higher integration can be achieved.

When the planar layout in FIG. 7B is employed, the area occupied by the semiconductor device can be reduced; thus, the degree of integration can be increased.

As described above, the plurality of memory cells formed in multiple layers in the upper portion is each formed with a transistor including an oxide semiconductor. Since the transistor including an oxide semiconductor has low off-state current, stored data can be held for a long time by using the transistor. In other words, the frequency of refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, the use of a structure where the peripheral circuit and the memory circuit are stacked leads to an increase in the degree of integration of the semiconductor device.

As described above, a miniaturized and highly-integrated semiconductor device having stable and excellent electric characteristics and a method for manufacturing the semiconductor device can be provided.

This embodiment can be implemented in appropriate combination with any of the structures described in the other embodiments.

Embodiment 5

In this embodiment, examples of application of the semiconductor device described in any of the above embodiments to portable devices such as mobile phones, smartphones, and e-book readers will be described with reference to FIGS. 8A and 8B, FIG. 9, FIG. 10, and FIG. 11.

In portable electronic devices such as mobile phones, smartphones, and e-book readers, an SRAM or a DRAM is used to store image data temporarily. This is because response speed of a flash memory is low and thus a flash memory is not suitable for image processing. On the other hand, an SRAM or a DRAM has the following characteristics when used for temporary storage of image data.

Figure 8A:
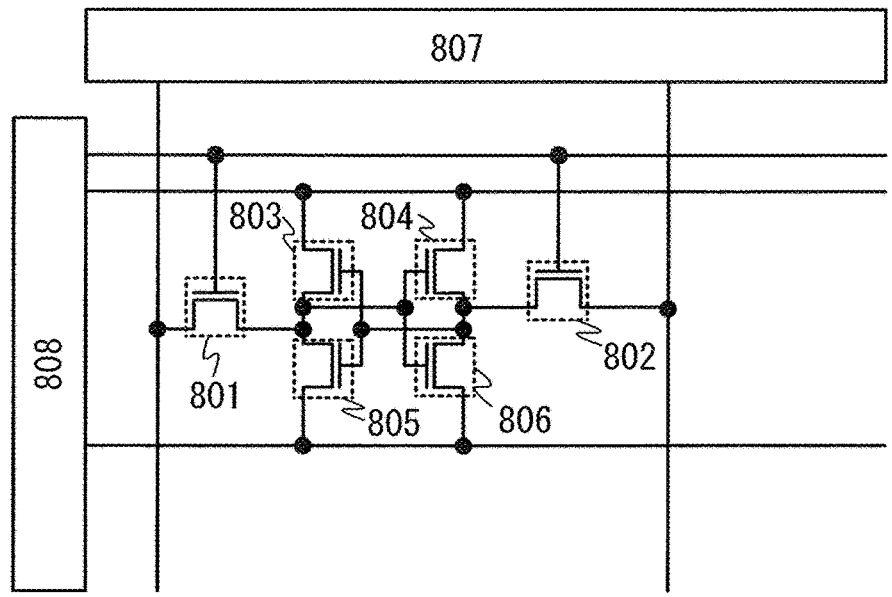
FIGS. 8A and 8B are circuit diagrams each illustrating one embodiment of a semiconductor device.

In a normal SRAM, as illustrated in FIG. 8A, one memory cell includes six transistors, which are a transistor 801, a transistor 802, a transistor 803, a transistor 804, a transistor 805, and a transistor 806, and they are driven by an X decoder 807 and a Y decoder 808. The transistors 803 and 805 and the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally $100F^2$ to $150F^2$. Therefore, a price per bit of an SRAM is the most expensive among a variety of memory devices.

Figure 8B:
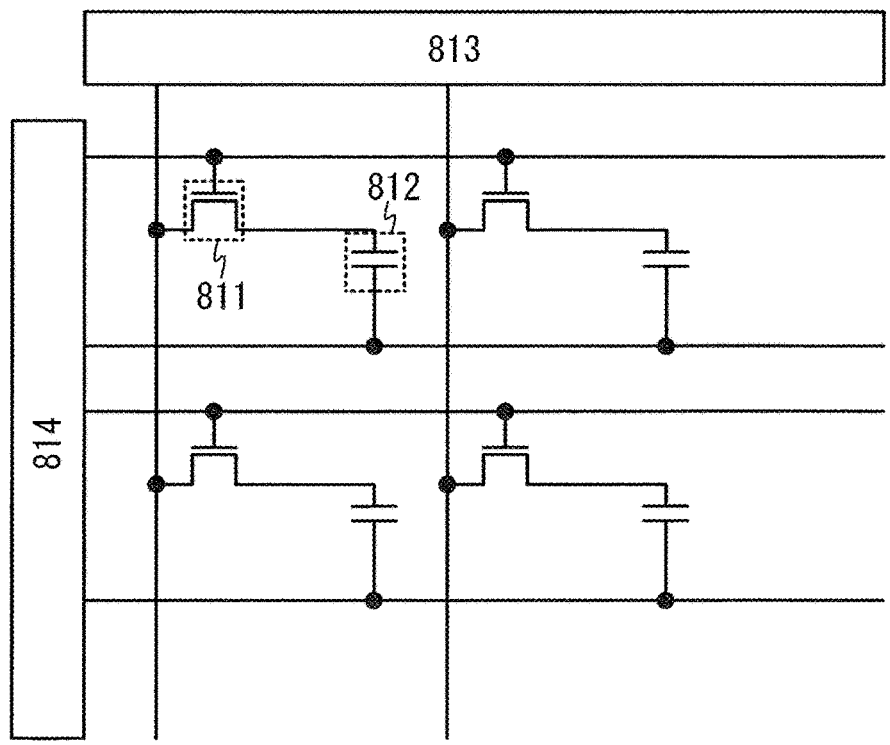

On the other hand, as illustrated in FIG. 8B, a memory cell in a DRAM includes a transistor 811 and a storage capacitor 812, and is driven by an X decoder 813 and a Y decoder 814. One cell includes one transistor and one capacitor and thus the area of a memory cell is small. The area of a memory cell of a DRAM is generally less than or equal to $10F^2$. Note that in the case of a DRAM, a refresh operation is always necessary and power is consumed even when a rewriting operation is not performed.

However, the area of the memory cell of the semiconductor device described the above embodiments is about $10F^2$ and frequent refreshing is not needed. Therefore, the area of the memory cell is reduced, and the power consumption can be reduced.

Figure 9:
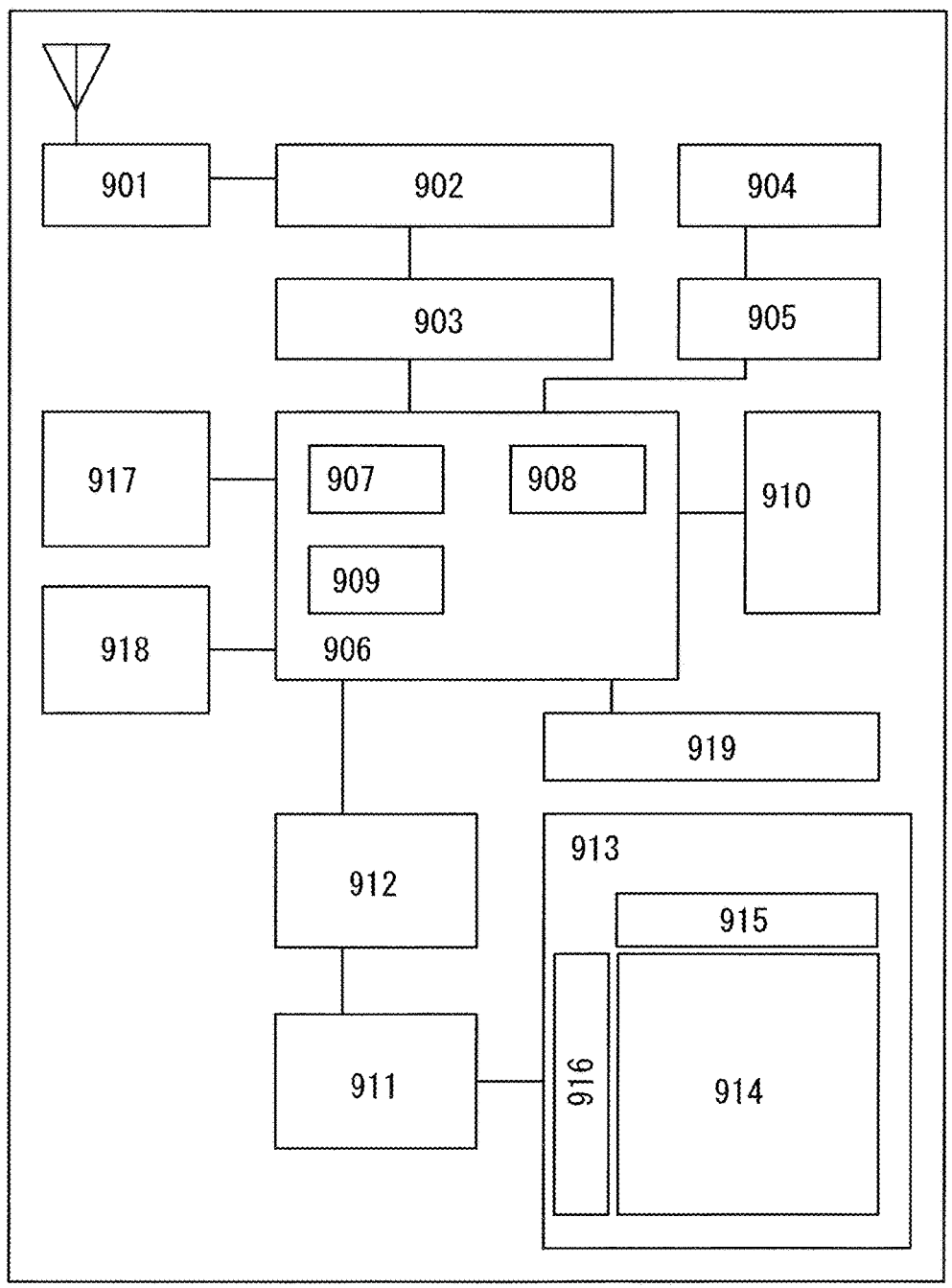
FIG. 9 is a block diagram illustrating one embodiment of a semiconductor device.

Next, a block diagram of a portable device is illustrated in FIG. 9. A portable device illustrated in FIG. 9 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface (IF) 909. In general, the memory circuit 912 includes an SRAM or a DRAM; by employing the semiconductor device described in any of the above embodiments for the memory circuit 912, writing and reading of data can be performed at high speed, data can be held for a long time, and power consumption can be sufficiently reduced.

Figure 10:
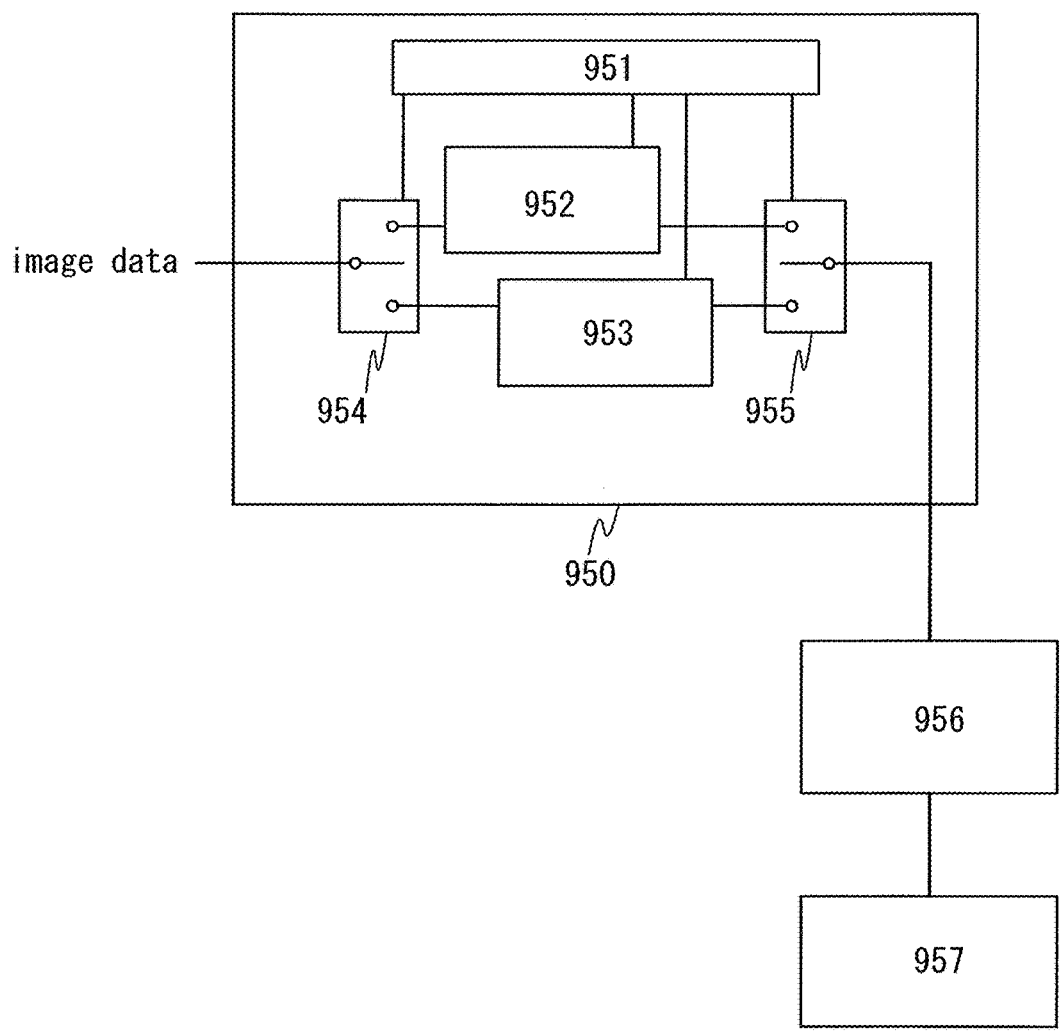
FIG. 10 is a block diagram illustrating one embodiment of a semiconductor device.

Next, FIG. 10 shows an example in which the semiconductor device described in any of the above embodiments is used for a memory circuit 950 in a display. The memory circuit 950 illustrated in FIG. 10 includes a memory 952, a memory 953, a switch 954, a switch 955, and a memory controller 951. Furthermore, the memory circuit is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not shown). The input image data A is stored in the memory 952 though the switch 954. The image data (stored image data A) held in the memory 952 is transmitted and displayed to the display 957 through the switch 955 and the display controller 956.

In the case where the input image data A is not changed, the stored image data A is read from the memory 952 through the switch 955 by the display controller 956 at a frequency of 30 Hz to 60 Hz in general.

Next, for example, when data displayed on the screen is rewritten by a user (that is, in the case where the input image data A is changed), new image data (input image data B) is formed by the application processor. The input image data B is held in the memory 953 through the switch 954. The stored image data A is read periodically from the memory 952 through the switch 955 even during that time. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation is continued until another new image data is held in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and held for a long time, and power consumption can be sufficiently reduced.

Figure 11:
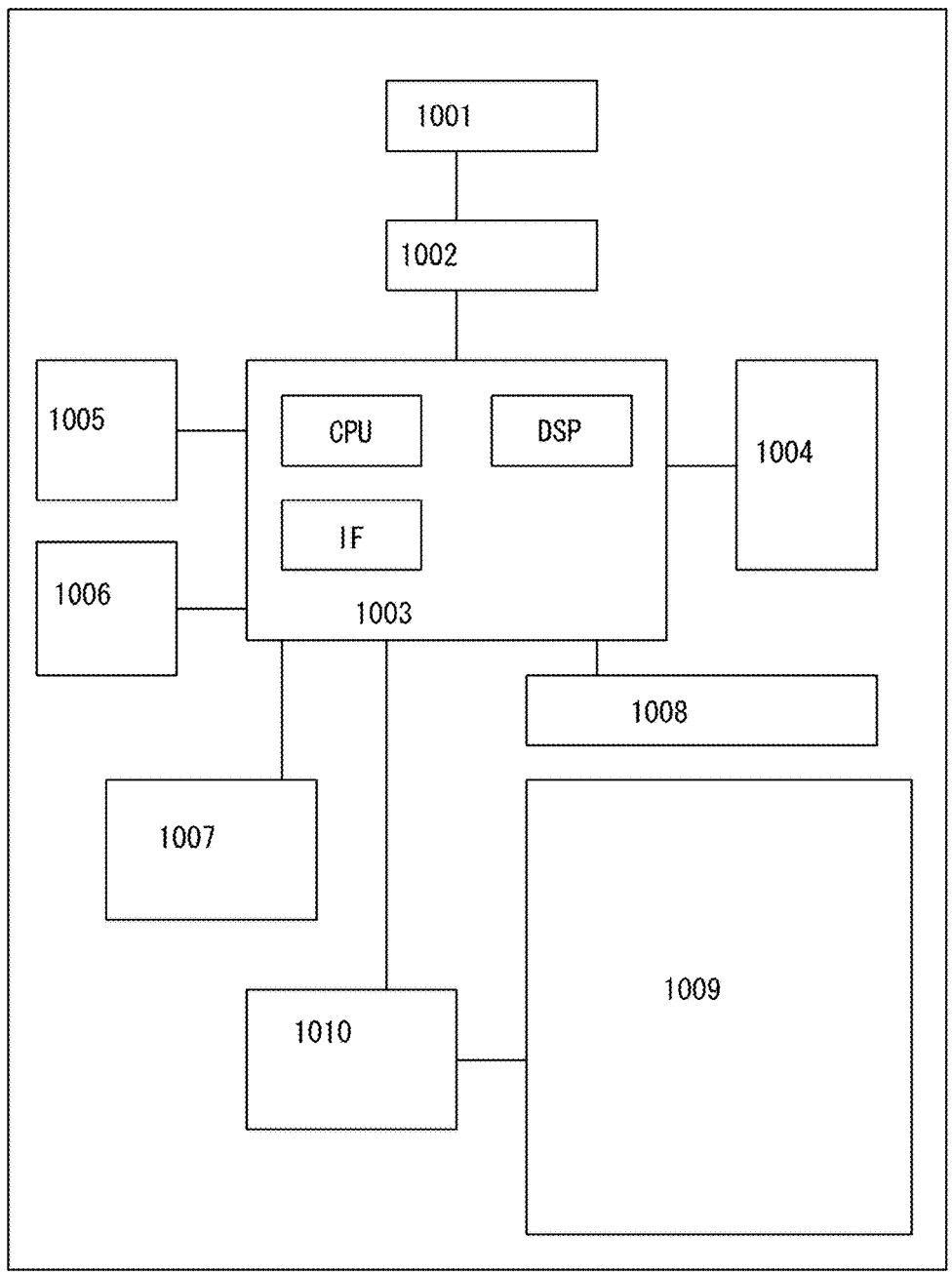
FIG. 11 is a block diagram illustrating one embodiment of a semiconductor device.
Figure 12A:
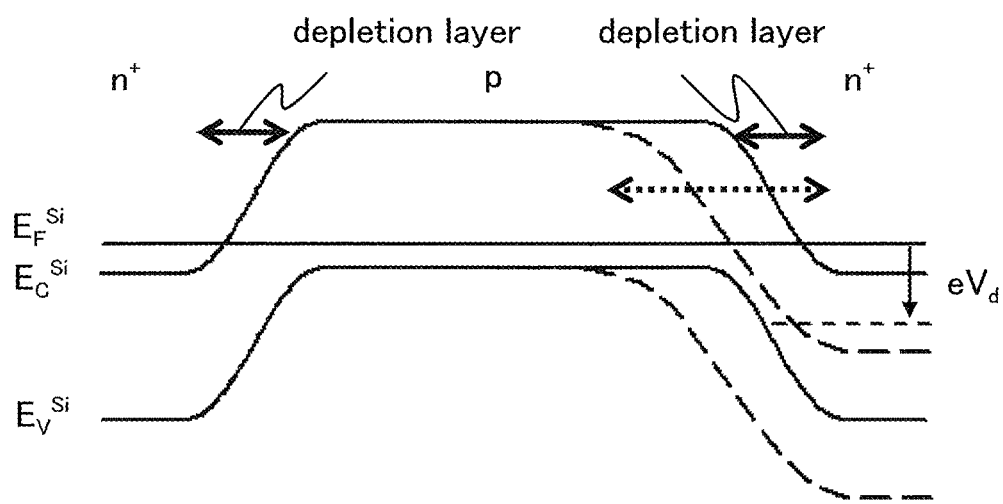
FIGS. 12A and 12B are schematic views each illustrating a band structure of a Si-FET.
Figure 12B:
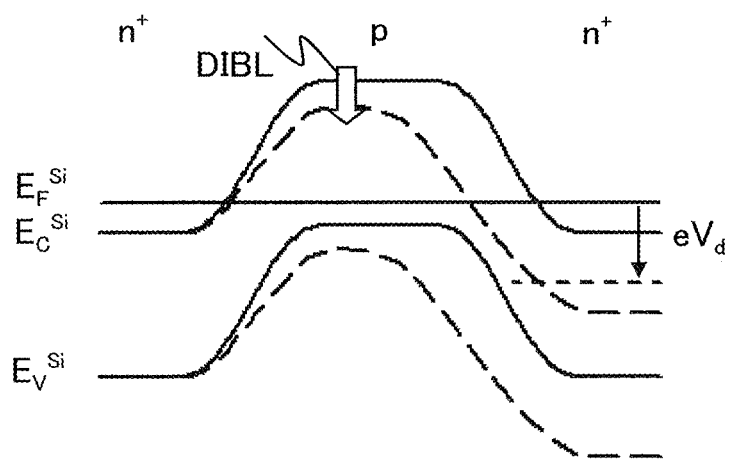
Figure 13:
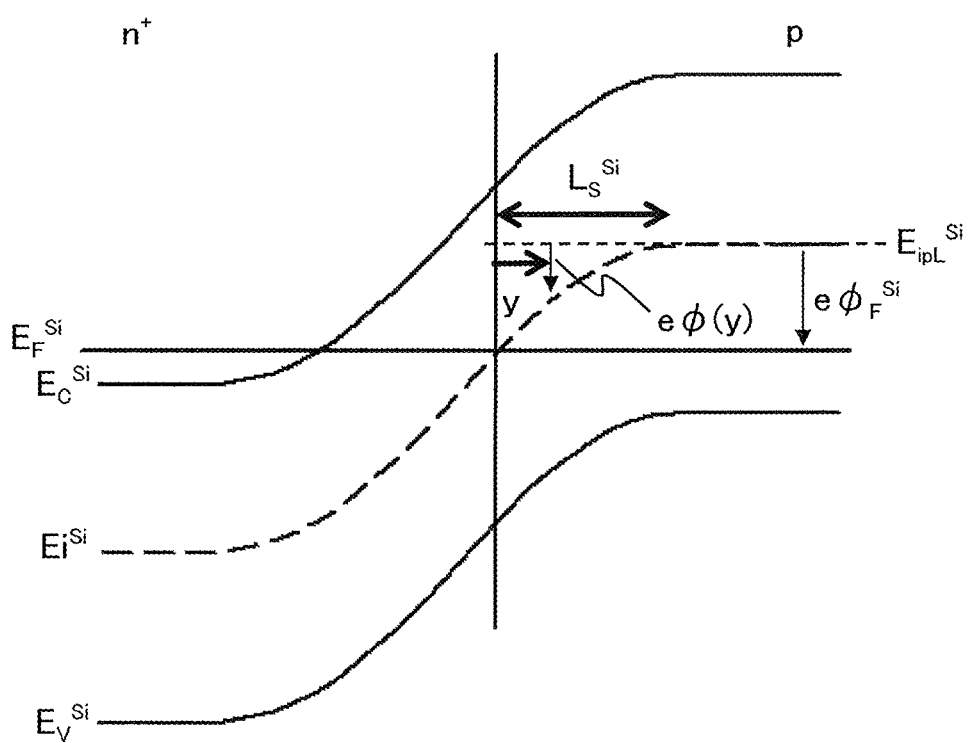
FIG. 13 is a schematic view illustrating a band structure of a Si-FET.
Figure 14:
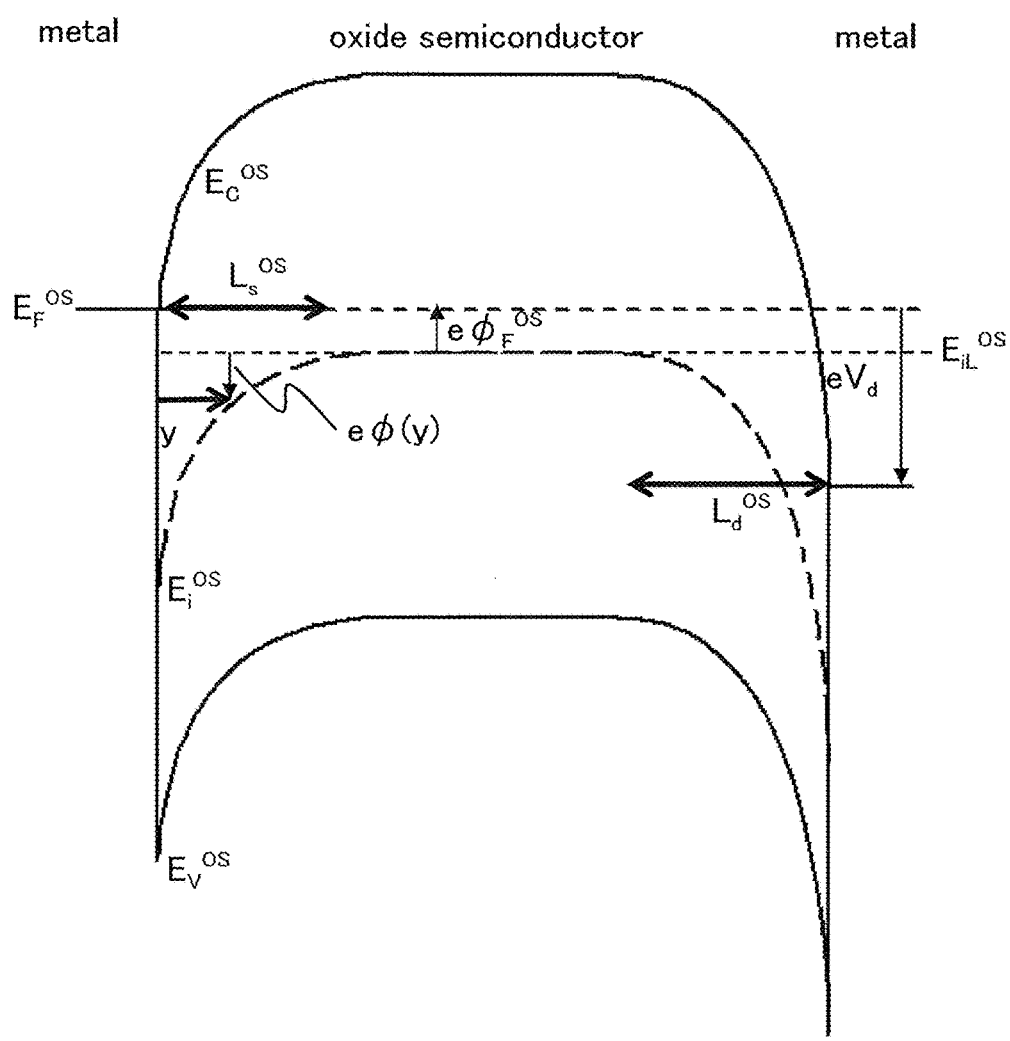
FIG. 14 is a schematic view illustrating a band structure of an OS-FET.

Next, FIG. 11 is a block diagram of an e-book reader. FIG. 11 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 11. The memory circuit 1007 has a function of temporarily holding the contents of a book. For example, users use a highlight function in some cases. When users read an e-book reader, they sometimes want to mark a specified place. This marking refers to a highlight function, and users can make difference from other places by, for example, changing the color of a letter displayed, underlining a word, making a letter bold, or changing the font type of a letter. That is, there is a function of storing and holding information of a place specified by users. In order to save the information for a long time, the information may be copied into the flash memory 1004. Even in such a case, by employing the semiconductor device described in any of the above embodiments, writing and reading of data can be performed at high speed, data can be held for a long time, and power consumption can be sufficiently reduced.

As described above, the semiconductor device in any of the above embodiments is mounted on each of the portable devices described in this embodiment. Therefore, a portable device in which writing and reading of data are performed at high speed, data is held for a long time, and power consumption is sufficiently reduced, can be obtained.

The structures, methods, and the like described in this embodiment can be combined as appropriate with any of the structures, methods, and the like described in the other embodiments.

Example 1

In this example, a transistor was manufactured, and a cross section of the transistor was observed and electric characteristics thereof were measured. Description is made with reference to FIG. 15 and FIG. 16.

As the transistor, an example transistor having a structure similar to the structure of the transistor described in Embodiment 1 was manufactured. A method for manufacturing the example transistor is described below.

As an insulating film 11, a silicon oxide film with a thickness of 1000 nm was deposited over silicon substrate on which plasma treatment with argon (flow rate of Ar: 50 sccm, pressure: 0.6 Pa, power: 200 W, for three minutes) had been performed by a sputtering method (deposition conditions: an oxygen atmosphere (oxygen=50 sccm), a pressure of 0.4 Pa, a power (power output) of 1.5 kW, a distance between the silicon substrate and the target of 60 mm, and a substrate temperature of 100° C.).

Next, polishing treatment (polishing pressure: 0.001 MPa, rotation number in polishing (table/spindle): 60 rpm/56 rpm) was performed on a surface of the insulating film 11 by a chemical mechanical polishing (CMP) method so that the average surface roughness ($R_a$) of the insulating film 11 was 0.15 nm.

An IGZO film with a thickness of 10 nm was formed over the insulating film 11 as an oxide semiconductor film, by a sputtering method with the use of an oxide target having a composition of In:Ga:Zn=3:1:2 [atomic ratio]. Deposition conditions were as follows: an atmosphere of argon and oxygen (argon:oxygen=30 sccm:15 sccm), a pressure of 0.4 Pa, a power of 0.5 kW, and a substrate temperature of 200° C.

Oxygen ions were implanted to the IGZO film by an ion implantation method. Note that the conditions of the oxygen ion implantation were as follows: an acceleration voltage of 5 kV and a dosage of $2.5 \times 10^{15}$ ions/cm$^2$.

The oxide semiconductor film was etched by a dry etching method (etching conditions: an etching gas of BCl$_3$:Cl$_2$=60 sccm:20 sccm, an ICP power of 450 W, a bias power of 100 W, and a pressure of 1.9 Pa) to form an island-shaped oxide semiconductor film 12.

Next, a 20-nm-thick silicon oxynitride film was formed as a gate insulating film 13 by a CVD method.

A stack of a tantalum nitride film with a thickness of 30 nm (deposition conditions: an atmosphere of argon and nitrogen (argon: nitrogen=50 sccm:10 sccm), a pressure of 0.6 Pa, and a power of 1 kW) and a tungsten film with a thickness of 70 nm (deposition conditions: an argon atmosphere (argon=100 sccm), a pressure of 2.0 Pa, and a power of 4 kW) was deposited over the gate insulating film by a sputtering method.

A resist mask was formed over the tantalum nitride film and the tungsten film by a photolithography process. After the formation of the resist mask by light exposure, a slimming process was performed on the resist mask so that the length of the resist mask in the channel length direction was reduced to 70 nm.

The tantalum nitride film and the tungsten film were etched by dry etching methods (first etching conditions: an etching gas of CF$_4$:Cl$_2$:O$_2$=55 sccm:45 sccm:55 sccm, an ICP power of 3 kW, a bias power of 110 W, and a pressure of 0.67 Pa; and second etching conditions: an etching gas of Cl$_2$=100 sccm, a power of 2 kW, a bias power of 50 W, and a pressure of 0.67 Pa), so that an island-shaped conductive layer was formed. Then, side surfaces of the conductive layer were etched, thereby forming a gate electrode layer 14 with a length of the channel length direction of 58 nm.

Next, a silicon oxynitride film was formed over the gate electrode layer 14 as an insulating film by a CVD method, and the silicon oxynitride film was etched by a dry etching method to form an insulating layer which covers a side surface of the gate electrode layer 14.

A 30-nm-thick tungsten film was formed over the oxide semiconductor film 12, the gate insulating film 13, the gate electrode layer 14, and the sidewall insulating layer by a sputtering method (deposition conditions: an atmosphere of argon (argon=80 sccm), a pressure of 0.8 Pa, a power of 1 kW, and a substrate temperature of 230° C.).

Next, the tungsten film was etched by a dry etching method (etching conditions: an etching gas (CF$_4$:Cl$_2$:O$_2$=55 sccm:45 sccm:55 sccm), a power of 3 kW, a bias power of 110 W, and a pressure of 0.67 Pa), so that an island-shaped tungsten film was formed.

Next, as an insulating film, a 70-nm-thick aluminum oxide film was formed over the oxide semiconductor film 12, the gate insulating film 13, the gate electrode layer 14, the sidewall insulating layers, and the tungsten film by a sputtering method (deposition conditions: an atmosphere of argon and oxygen (argon:oxygen=25 sccm:25 sccm), a pressure of 0.4 Pa, a power of 2.5 kW, a distance between the silicon substrate and the target of 60 mm, and a substrate temperature of 250° C.).

Furthermore, a 460-nm-thick silicon oxynitride film was formed over the aluminum oxide film by a CVD method (deposition conditions: SiH$_4$:N$_2$O=27 sccm:1000 sccm, a pressure of 133.3 Pa, an RF power of 60 W, a power supply frequency of 13.56 MHz, a distance between the silicon substrate and the target of 20 mm, and a substrate temperature of 325° C.).

Next, the silicon oxynitride film, the aluminum oxide film, and the tungsten film were subjected to polishing treatment by a chemical mechanical polishing method (polishing conditions: a hard polyurethane-based polishing cloth, alkaline silica-based slurry, a slurry temperature of room temperature, a polishing (load) pressure of 0.08 MPa, and a rotation number in polishing (table/spindle) of 51 rpm/50 rpm), so that the silicon oxynitride film, the aluminum oxide film, and the tungsten film over the gate electrode layer 14 were removed.

The tungsten film was separated by the polishing treatment to form a source electrode layer and a drain electrode layer.

A 400-nm-thick silicon oxynitride film was formed over the gate electrode layer 14, the source electrode layer, and the drain electrode layer as an interlayer insulating film by a CVD method. After the formation of the interlayer insulating film, heat treatment was performed under an oxygen atmosphere at 400° C. for one hour.

Openings reaching the source electrode layer and the drain electrode layer were formed.

A 300-nm-thick tungsten film was formed in the openings by a sputtering method, and the tungsten film was etched to form wiring layers.

A 1.5-µm-thick polyimide film was formed over the wiring layers, and heat treatment was performed in the atmosphere at 300° C. for one hour.

Through the above process, the example transistor was manufactured.

Figure 15:
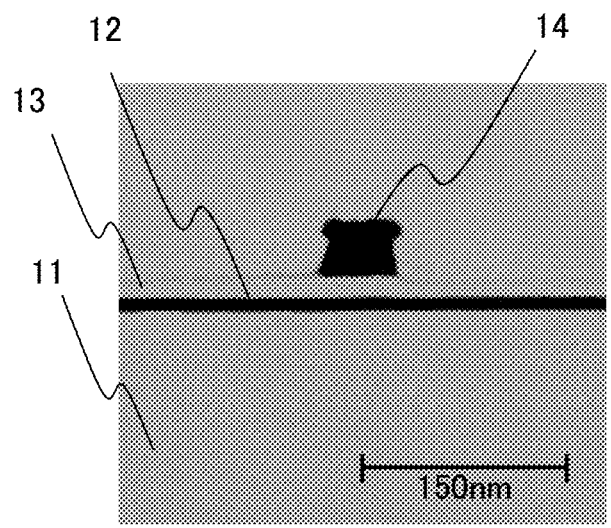
FIG. 15 is a cross-sectional STEM image of an example transistor.

A cross section in the channel length direction of the example transistor was cut, and a cross section of the example transistor was observed using a scanning transmission electron microscopy (STEM). In this example, as the STEM, an Ultra-thin Film Evaluation System HD-2300 manufactured by Hitachi High-Technologies Corporation was used. FIG. 15 shows a cross-sectional STEM image of the example transistor. FIG. 15 shows a cross-sectional STEM image of the example transistor in the channel length direction, and the insulating film 11, the oxide semiconductor film 12, the gate insulating film 13, and the gate electrode layer 14 can be observed.

The electric characteristics of the example transistor were evaluated.

Figure 16:
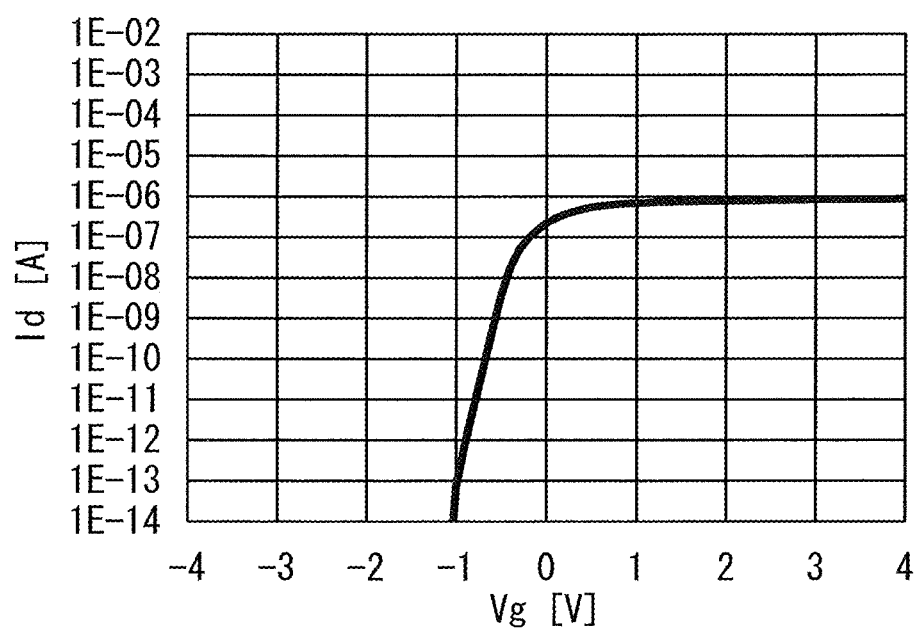
FIG. 16 is a graph showing electric characteristics of the example transistor.

FIG. 16 shows gate voltage (Vg)-drain current (Id) characteristics of the example transistor at the time when the drain voltage (Vd) is 1 V. Note that FIG. 16 shows the electric characteristics of the example transistor in the case where the channel length (L) is 58 nm and the measurement range of the gate voltage is from −4 V to 4 V.

As shown in FIG. 16, the example transistor exhibited the electric characteristics as a switching element.

Accordingly, it was confirmed that the transistor of this example exhibits sufficient electric characteristics as a switching element even when the transistor has a minute structure the channel length of which is 58 nm.

This application is based on Japanese Patent Application serial no. 2012-008375 filed with Japan Patent Office on Jan. 18, 2012 and Japanese Patent Application serial no. 2012-009727 filed with Japan Patent Office on Jan. 20, 2012, the entire contents of which are hereby incorporated by reference.

What is claimed is:

1. A semiconductor device comprising:
an oxide semiconductor film comprising a channel formation region of a transistor;
a gate insulating film over the oxide semiconductor film;
a gate electrode over the gate insulating film;
an interlayer insulating film over the gate electrode;
a source electrode electrically connected to the oxide semiconductor film through a first opening in the interlayer insulating film; and
a drain electrode electrically connected to the oxide semiconductor film through a second opening in the interlayer insulating film,
wherein, in a cross section in a channel width direction of the transistor, the gate electrode continuously covers a first side surface, a top surface, and a second side surface of the oxide semiconductor film, and
wherein a thickness of the oxide semiconductor film is twice or more a length of the oxide semiconductor film in the channel width direction.

2. The semiconductor device according to claim 1, wherein the source electrode and the drain electrode are on and in contact with the interlayer insulating film.

3. The semiconductor device according to claim 1, wherein the oxide semiconductor film has a stacked-layer structure.

4. The semiconductor device according to claim 1, further comprising an aluminum oxide film between the gate electrode and the interlayer insulating film,
wherein the aluminum oxide film continuously covers the first side surface, the top surface, and the second side surface of the oxide semiconductor film with the gate electrode therebetween.

5. The semiconductor device according to claim 1,
wherein the oxide semiconductor film comprises indium, gallium, and zinc, and
wherein an indium content in the oxide semiconductor film is higher than a gallium content in the oxide semiconductor film.

6. A semiconductor device comprising:
an oxide semiconductor film comprising a first region, a second region, and a channel formation region of a transistor between the first region and the second region;
a gate insulating film over the oxide semiconductor film;
a gate electrode over the gate insulating film;
an interlayer insulating film over the gate electrode;
a source electrode electrically connected to the first region through a first opening in the interlayer insulating film; and
a drain electrode electrically connected to the second region through a second opening in the interlayer insulating film,
wherein, in a cross section in a channel width direction of the transistor, the gate electrode continuously covers a first side surface, a top surface, and a second side surface of the oxide semiconductor film, and
wherein a thickness of the oxide semiconductor film is twice or more a length of the oxide semiconductor film in the channel width direction.

7. The semiconductor device according to claim 6, wherein a resistivity of the first region and a resistivity of the second region are each greater than or equal to $1.9 \times 10^{-5}$ Ω·m and less than or equal to $4.8 \times 10^{-3}$ Ω·m.

8. The semiconductor device according to claim 6, wherein the source electrode and the drain electrode are on and in contact with the interlayer insulating film.

9. The semiconductor device according to claim 6, wherein the oxide semiconductor film has a stacked-layer structure.

10. The semiconductor device according to claim 6, further comprising an aluminum oxide film between the gate electrode and the interlayer insulating film,
wherein the aluminum oxide film continuously covers the first side surface, the top surface, and the second side surface of the oxide semiconductor film with the gate electrode therebetween.

11. The semiconductor device according to claim 6,
wherein the oxide semiconductor film comprises indium, gallium, and zinc, and
wherein an indium content in the oxide semiconductor film is higher than a gallium content in the oxide semiconductor film.

12. A semiconductor device comprising:
an oxide semiconductor film comprising a channel formation region of a transistor;
a gate insulating film over the oxide semiconductor film;
a gate electrode over the gate insulating film;
an interlayer insulating film over the gate electrode;
a source electrode electrically connected to the oxide semiconductor film through a first opening in the interlayer insulating film; and
a drain electrode electrically connected to the oxide semiconductor film through a second opening in the interlayer insulating film,
wherein, in a cross section in a channel width direction of the transistor, the gate electrode continuously covers a first side surface, a top surface, and a second side surface of the oxide semiconductor film,
wherein a thickness of the oxide semiconductor film is twice or more a length of the oxide semiconductor film in the channel width direction,
wherein a channel length of the transistor is greater than or equal to 5 nm and less than 60 nm, and
wherein an equivalent oxide thickness which is obtained by converting into a thickness of silicon oxide containing nitrogen of the gate insulating film is greater than or equal to 5 nm and less than or equal to 50 nm.

13. The semiconductor device according to claim 12, wherein the source electrode and the drain electrode are on and in contact with the interlayer insulating film.

14. The semiconductor device according to claim 12, wherein the oxide semiconductor film has a stacked-layer structure.

15. The semiconductor device according to claim 12, further comprising an aluminum oxide film between the gate electrode and the interlayer insulating film, wherein the aluminum oxide film continuously covers the first side surface, the top surface, and the second side surface of the oxide semiconductor film with the gate electrode therebetween.

16. The semiconductor device according to claim 12, wherein the oxide semiconductor film comprises indium, gallium, and zinc, and wherein an indium content in the oxide semiconductor film is higher than a gallium content in the oxide semiconductor film.

* * * * *